(12) United States Patent
Pershing et al.

(10) Patent No.: US 10,663,294 B2
(45) Date of Patent: May 26, 2020

(54) SYSTEMS AND METHODS FOR ESTIMATION OF BUILDING WALL AREA AND PRODUCING A WALL ESTIMATION REPORT

(71) Applicant: Eagle View Technologies, Inc., Redmond, WA (US)

(72) Inventors: Chris Pershing, Redmond, WA (US); Michael Rydell, Issaquah, WA (US); Jianguo Jiang, Sammamish, WA (US); Arlen Pringle, Seattle, WA (US)

(73) Assignee: Eagle View Technologies, Inc., Bellevue, WA (US)

( * ) Notice: Subject to any disclaimer, the term of this patent is extended or adjusted under 35 U.S.C. 154(b) by 452 days.

(21) Appl. No.: 13/844,684

(22) Filed: Mar. 15, 2013

(65) Prior Publication Data

US 2013/0226515 A1  Aug. 29, 2013

Related U.S. Application Data

(63) Continuation-in-part of application No. 13/757,694, filed on Feb. 1, 2013, now Pat. No. 9,599,466, and a
(Continued)

(51) Int. Cl.
*G06F 17/00* (2019.01)
*G01B 21/28* (2006.01)
(Continued)

(52) U.S. Cl.
CPC ............ *G01B 21/28* (2013.01); *G06F 17/00* (2013.01); *G06F 17/5004* (2013.01); *G06Q 50/08* (2013.01); *G06Q 50/16* (2013.01)

(58) Field of Classification Search
None
See application file for complete search history.

(56) References Cited

U.S. PATENT DOCUMENTS 2,791,151 A   5/1957  Pennington
3,617,016 A   11/1971 Bolsey
(Continued)

FOREIGN PATENT DOCUMENTS

AU   2008230031 B8   11/2009
CA      2191954 A1   12/1995
(Continued)

OTHER PUBLICATIONS

US 8,315,941 B2, 11/2012, Halper et al. (withdrawn)
(Continued)

*Primary Examiner* — Iman K Kholdebarin
(74) *Attorney, Agent, or Firm* — Dunlap Codding, P.C.

(57) ABSTRACT

A wall area estimation system generates an estimated wall area measurement report of a building. Included in the wall area measurement estimate report are multiple line drawings of a building having a roof. Two of the multiple line drawings are perspective views from an angle of view above the building. A first of the perspective views is substantially centered on a first substantially vertical exterior corner of the house that is approximately opposite of a second substantially vertical exterior corner of the house on which a second of the perspective views is substantially centered. The first and second of the perspective views include a line drawing of the roof that is transparent or translucent to show interior surfaces of the walls of the building in the first and second of the perspective views. The walls of the interior surfaces shown are shaded darker than the walls of the exterior.

22 Claims, 52 Drawing Sheets
(44 of 52 Drawing Sheet(s) Filed in Color)

Related U.S. Application Data continuation-in-part of application No. 13/757,712, filed on Feb. 1, 2013, now Pat. No. 8,774,525, and a continuation-in-part of application No. PCT/US2013/023503, filed on Jan. 28, 2013, and a continuation-in-part of application No. PCT/US2013/023502, filed on Jan. 28, 2013, and a continuation-in-part of application No. 13/385,606, filed on Feb. 3, 2012, now Pat. No. 9,933,257, and a continuation-in-part of application No. 13/385,607, filed on Feb. 3, 2012.

(51) Int. Cl.
*G06Q 50/16* (2012.01)
*G06Q 50/08* (2012.01)
*G06F 17/50* (2006.01)

(56) References Cited

U.S. PATENT DOCUMENTS

| | | |
|---|---|---|
| 4,096,670 A | 6/1978 | Fuller |
| 4,344,142 A | 8/1982 | Diehr, II et al. |
| 5,247,356 A | 9/1993 | Ciampa |
| 5,379,105 A | 1/1995 | Iki et al. |
| 5,596,494 A | 1/1997 | Kuo |
| 5,633,946 A | 5/1997 | Lachinski et al. |
| 5,633,995 A | 5/1997 | McClain |
| 5,983,010 A | 11/1999 | Murdock et al. |
| 6,323,885 B1 | 11/2001 | Wiese |
| 6,333,749 B1 | 12/2001 | Reinhardt et al. |
| 6,385,541 B1 | 5/2002 | Blumberg et al. |
| 6,396,491 B2 | 5/2002 | Watanabe et al. |
| 6,446,053 B1 | 9/2002 | Elliott |
| 6,496,184 B1 | 12/2002 | Freeman et al. |
| 6,636,803 B1 | 10/2003 | Hartz, Jr. et al. |
| 6,836,270 B2 | 12/2004 | Du |
| 6,980,690 B1 | 12/2005 | Taylor et al. |
| 7,003,400 B2 | 2/2006 | Bryant |
| 7,006,977 B1 | 2/2006 | Attra et al. |
| 7,133,551 B2 | 11/2006 | Chen et al. |
| 7,233,691 B2 | 6/2007 | Setterholm |
| 7,305,983 B1 | 12/2007 | Meder et al. |
| 7,324,666 B2 | 1/2008 | Zoken et al. |
| 7,327,880 B2 | 2/2008 | Tek |
| 7,333,963 B2 | 2/2008 | Widrow et al. |
| 7,343,268 B2 | 3/2008 | Kishikawa |
| 7,353,144 B1 * | 4/2008 | Rinks ............ G06F 17/5004 703/1 |
| 7,373,303 B2 | 5/2008 | Moore et al. |
| 7,421,125 B1 | 9/2008 | Rees |
| 7,424,133 B2 | 9/2008 | Schultz et al. |
| 7,460,214 B2 | 12/2008 | Schiavi |
| 7,487,114 B2 | 2/2009 | Florance et al. |
| 7,500,391 B2 | 3/2009 | Woro |
| 7,509,241 B2 | 3/2009 | Guo et al. |
| 7,515,153 B2 | 4/2009 | Jin et al. |
| 7,519,206 B2 | 4/2009 | Mulet-Parada et al. |
| 7,570,785 B2 | 8/2009 | Breed |
| 7,583,275 B2 | 9/2009 | Neumann et al. |
| 7,629,985 B2 | 12/2009 | McArdle et al. |
| 7,639,842 B2 | 12/2009 | Kelle et al. |
| 7,664,690 B2 | 2/2010 | Dirnberger |
| 7,728,833 B2 | 6/2010 | Verma et al. |
| 7,752,018 B2 | 7/2010 | Rahmes et al. |
| 7,787,659 B2 | 8/2010 | Schultz et al. |
| 7,844,499 B2 | 11/2010 | Yahiro et al. |
| 7,869,944 B2 | 1/2011 | Deaton et al. |
| 7,873,238 B2 | 1/2011 | Schultz et al. |
| 7,991,226 B2 | 8/2011 | Schultz et al. |
| 7,995,799 B2 | 8/2011 | Schultz et al. |
| 7,995,862 B2 | 8/2011 | Tao et al. |
| 8,027,850 B1 | 9/2011 | Pietrzak |
| 8,051,089 B2 | 11/2011 | Gargi et al. |
| 8,068,643 B2 | 11/2011 | Schultz et al. |
| 8,078,436 B2 | 12/2011 | Pershing et al. |
| 8,081,798 B2 | 12/2011 | Paglieroni et al. |
| 8,081,841 B2 | 12/2011 | Schultz et al. |
| 8,131,514 B2 | 3/2012 | Royan et al. |
| 8,145,578 B2 | 3/2012 | Pershing et al. |
| 8,170,840 B2 | 5/2012 | Pershing |
| 8,204,341 B2 | 6/2012 | Schultz et al. |
| 8,209,152 B2 | 6/2012 | Pershing |
| 8,229,769 B1 | 7/2012 | Hopkins, III |
| 8,233,666 B2 | 7/2012 | Schultz et al. |
| 8,346,578 B1 | 1/2013 | Hopkins, III et al. |
| 8,352,332 B2 | 1/2013 | Pesicek |
| 8,385,672 B2 | 2/2013 | Giuffrida et al. |
| 8,386,378 B2 | 2/2013 | Halper et al. |
| 8,401,222 B2 | 3/2013 | Thornberry et al. |
| 8,417,061 B2 | 4/2013 | Kennedy et al. |
| 8,526,733 B2 | 9/2013 | Tilton |
| 8,538,918 B1 | 9/2013 | Pearcy et al. |
| 8,774,525 B2 * | 7/2014 | Pershing ............ G06Q 10/06 382/199 |
| 2002/0101594 A1 | 8/2002 | Slatter |
| 2002/0143669 A1 | 10/2002 | Scheer |
| 2002/0154174 A1 | 10/2002 | Redlich et al. |
| 2003/0028393 A1 | 2/2003 | Coulston et al. |
| 2003/0103651 A1 | 6/2003 | Novak |
| 2003/0147553 A1 | 8/2003 | Chen et al. |
| 2003/0171957 A1 | 9/2003 | Watrous |
| 2003/0233310 A1 | 12/2003 | Stavrovski |
| 2005/0267657 A1 | 12/2005 | Devdhar |
| 2005/0288959 A1 | 12/2005 | Eraker et al. |
| 2006/0137736 A1 | 6/2006 | Nishitani et al. |
| 2006/0169775 A1 | 8/2006 | Gray et al. |
| 2006/0200311 A1 | 9/2006 | Arutunian et al. |
| 2006/0232605 A1 | 10/2006 | Imamura |
| 2006/0262112 A1 | 11/2006 | Shimada |
| 2006/0265287 A1 | 11/2006 | Kubo |
| 2007/0179757 A1 | 8/2007 | Simpson |
| 2008/0089610 A1 | 4/2008 | Tao et al. |
| 2008/0162380 A1 | 7/2008 | Suga et al. |
| 2008/0204570 A1 | 8/2008 | Schultz et al. |
| 2008/0208637 A1 | 8/2008 | McKay et al. |
| 2008/0221843 A1 | 9/2008 | Shenkar et al. |
| 2008/0231700 A1 | 9/2008 | Schultz et al. |
| 2008/0262789 A1 | 10/2008 | Pershing et al. |
| 2009/0067725 A1 | 3/2009 | Sasakawa et al. |
| 2009/0085915 A1 | 4/2009 | Kelley et al. |
| 2009/0141020 A1 | 6/2009 | Freund et al. |
| 2009/0160856 A1 | 6/2009 | Hoguet |
| 2009/0265193 A1 | 10/2009 | Collins et al. |
| 2009/0304227 A1 * | 12/2009 | Kennedy ............ G06K 9/0063 382/100 |
| 2010/0034483 A1 | 2/2010 | Giuffrida et al. |
| 2010/0070309 A1 | 3/2010 | Deede et al. |
| 2010/0179787 A2 | 7/2010 | Pershing et al. |
| 2010/0241406 A1 | 9/2010 | Rahmes et al. |
| 2011/0086201 A1 | 4/2011 | Shiao et al. |
| 2011/0096083 A1 | 4/2011 | Schultz |
| 2011/0187713 A1 | 8/2011 | Pershing et al. |
| 2011/0205245 A1 | 8/2011 | Kennedy et al. |
| 2011/0216962 A1 | 9/2011 | Kim et al. |
| 2011/0288816 A1 | 11/2011 | Thierman |
| 2012/0007982 A1 | 1/2012 | Giuffrida et al. |
| 2012/0035887 A1 | 2/2012 | Augenbraun et al. |
| 2012/0066187 A1 | 3/2012 | Pearcy et al. |
| 2012/0170797 A1 | 7/2012 | Pershing et al. |
| 2012/0191424 A1 | 7/2012 | Pershing et al. |
| 2012/0209782 A1 | 8/2012 | Pershing et al. |
| 2012/0223965 A1 | 9/2012 | Pershing |
| 2012/0224770 A1 | 9/2012 | Strassenburg-Kleciak |
| 2013/0202157 A1 | 8/2013 | Pershing |
| 2013/0204575 A1 | 8/2013 | Pershing |
| 2013/0211790 A1 | 8/2013 | Loveland et al. |
| 2013/0216089 A1 | 8/2013 | Chen et al. |
| 2013/0226515 A1 * | 8/2013 | Pershing ............ G06Q 50/16 702/156 |
| 2013/0262029 A1 | 10/2013 | Pershing |

(56) References Cited

U.S. PATENT DOCUMENTS

| | | | |
|---|---|---|---|
| 2013/0346020 A1* | 12/2013 | Pershing | G06Q 10/06 |
| | | | 702/156 |
| 2014/0046627 A1* | 2/2014 | Pershing | G01B 21/28 |
| | | | 702/156 |
| 2014/0279593 A1 | 9/2014 | Pershing | |

FOREIGN PATENT DOCUMENTS

| | | |
|---|---|---|
| CN | 102194120 A | 9/2011 |
| DE | 198 57 667 A1 | 8/2000 |
| EP | 1 010 966 B1 | 10/2002 |
| EP | 1 619 610 A1 | 1/2006 |
| EP | 2 251 833 A2 | 11/2010 |
| WO | 00/29806 A2 | 5/2000 |
| WO | 2005/124276 A2 | 12/2005 |
| WO | 2006/040775 A2 | 4/2006 |
| WO | 2006/090132 A2 | 8/2006 |
| WO | 2011/094760 A2 | 8/2011 |

OTHER PUBLICATIONS

Video uploaded by NoviDesign, titled in view of Drawing 3D roofs with autocad architecture with a publication date of Dec. 14, 2010 "https://www.youtube.com/watch?v=0huJUPfK4w0".*
Video uploaded by Brolafountain dated Jan. 17, 2011, (http://www.screenr.com/OkN.*
Pershing et al., "Aerial Roof Estimation System and Method," Amendment for U.S. Appl. No. 13/371,271, filed Mar. 11, 2013, 31 pages.
Pershing, "Systems and Methods for Estimation of Building Floor Area," Notice of Allowance for U.S. Appl. No. 13/757,712, dated Dec. 26, 2013, 18 pages.
Pershing, "Systems and Methods for Estimation of Building Wall Area," Office Action for U.S. Appl. No. 13/757,694, dated Jan. 15, 2014, 34 pages.
Autodesk, Inc., "AutoCAD 2011: User's Guide," Feb. 2010, retrieved from http://docs.autodesk.com/ACD/2011/ENU/pdfs/acad_aug.pdf, on Dec. 15, 2014, 2280 pages.
Australian Examination Report, dated Dec. 18, 2014, for corresponding Australian Patent Application No. 2013205518, 8 pages.
John Doe Roofing, "Premium Roof and Walls Report," Oct. 8, 2012, Eagle View Technologies, Inc., Report 1234567, retrieved from http://web.archive.org/web/20121116170417/http://www.eagleview.com/portals/0/portalcontent/SR-2400%20Prem&Wall.pdf, on Dec. 15, 2014, 18 pages.
Lam et al., "Task 2.2 12—CMU Report 02: Identification and Analysis of Interoperability Gaps between Nbims/Open Standards and Building Performance Simulation Tools," Feb. 2012, Carnegie Mellon University, Greater Philadelphia Innovation Cluster for Energy-Efficient Buildings, retrieved from http://www.andrew.cmu.edu/user/okaraguz/TechnicalWritingSamples/Interoperability_Identification.pdf, on Dec. 15, 2014, 25 pages.
Dorninger et al., "A Comprehensive Automated 3D Approach for Building Extraction, Reconstruction, and Regularization from Airbourne Laser Scanning Point Clouds," *Sensors* 8:7323-7343, 2008.
Forlani et al., "Building Reconstruction and Visualization from LIDAR data," The International Archive of the Photogrammetry, *Remote Sensing and Spatial Information Sciences* XXXIV:151-156, Part 5/W12, 2003.
International Search Report and Written Opinion of the International Searching Authority, dated Jul. 8, 2014, for International Application No. PCT/US14/25030, 11 pages.
Pershing et al., "Systems and Methods for Estimation of Building Wall Area," Office Action, dated May 20, 2014, for U.S. Appl. No. 13/385,606, 47 pages.
Brolafountaine, "Generating exterior walls from roofs in Sketch (Part 1)—Xactimate 27," Screen Shots of Potential Points of Interest, Jan. 17, 2011, retrieved from http://web.archive.org/web/20110117024814/http://screenr.com/oKn, on Apr. 29, 2015, 6 pages.

Hatter, "How do I figure Square Footage for Painting the Outside of a House?" Dec. 2, 2010, retrieved from http://web.archive.org/web/20101202033520/http://homeguides.sfgate.com/figure-square-footage-painting-outside-house-8721.html, on Apr. 30, 2015, 2 pages.
Pershing, "Systems and Methods for Estimation of Building Wall Area," Office Action, dated May 6, 2015, for U.S. Appl. No. 13/385,606, 20 pages.
Wikihow, "How to Calculate Amount of Paint to Paint a Room," Jul. 11, 2011, retrieved from http://web.archive.org/web/201107110709/http://www.wikihow.com/Calculate-Amount-of-paint-to-paint-a-room, on Apr. 9, 2015, 2 pages.
Brolafountaine, Generating exterior walls from roofs in Sketch (Part 1)—Xactimate 27—sent May 6, 2015, Video.
"3D Reconstruction," retrieved Oct. 25, 2013, from http://www8cs.umu.se/kurser/TDBD19/V705/reconstruct-4.pdf, 5 pages.
"8. Epipolar Geometry and the Fundamental Matrix," retrieved Oct. 25, 2013, from http://www.robtos.ox.ac.uk/~vgg/hzbook/hzbook1/HZepipolar.pdf, 25 pages.
"AeroDach® Online Roof Evaluation Standard Delivery Format and 3D Data File," Document Version 01.00.2002 with alleged publication in 2002, 21 pages.
"AeroDach® Online Dachauswertung: Standardlieferformat und 3D-Datensatz," AEROWEST GMBH,Version 01.00.2002, 6 pages.
"AERODACH® Online Roof Analysis: Standard Delivery Format and 3D Dataset," AEROWESTGmbH, Version as of 00-01-2002, 6 pages.
"AppliCad Software and EagleView® Technologies Partner for Metal Roofing Contractors," EagleView Technologies and AppliCad Software, retrieved from blog.eagleview.com/?=614 on Feb. 1, 2012, 2 pages.
"Definitions of Surveying and Associated Terms," American Congress on Surveying and Mapping, reprinted 1989, p. 3, 2 pages.
"Glossary of the Mapping Sciences," American Society of Civil Engineering, ASCE Publications, 1994, pp. 9-10, 3 pages.
"Microsoft's MSN Virtual Earth: The Map is the Search Platform," Directions Magazine URL=http://www.directionsmag.com/article.php?article_id=873&trv=1, retrieved Feb. 6, 2009, 10 pages.
"Photo Tours Google," Web Search, retrieved Oct. 25, 2013, from http://www.google.com/search?q=photo+tours=google, 2 pages.
"Pictometry=In the News," URL=http://204.8.121.114/pressrelease%20archived/pressrelease_aec.asp, retrieved Feb. 6, 2009, 3 pages.
"Software; New Products," LexisNexis Roofing Contractor article 23(2):121(2), Jan. 3, 2006, 1 page.
"Sorcerer: Nobody builds roofs like this builds roofs," retrieved from URL=http://web.archive.org/web/2006021409237/http://www.applicad.com.au/product-features . . . on Mar. 29, 2012, 2 pages.
Aerodach, "Protokoll zur Dachauswertung," Oct. 19, 2010, 12 pages.
Aerowest GMBH, "AeroDach—das patentierte Dachaufmass," Jan. 1, 2006, retrieved from URL=http://web.archive.org/web/20060101021543/http://www.aerowest.de/aerodach.html on Mar. 25, 2012, 2 pages.
AEROWEST GMBH, "Aerowest Pricelist of Geodata," Oct. 21, 2005, 2 pages.
AEROWEST GMBH, "Geodata Service; AeroDach—Patented Roof Dimensions," Jan. 1, 2006, retrieved from URL=http://web.archive.org/web/20060101021543/http://www.aerowest.de/aerodach.html, on Mar. 25, 2012, 2 pages.
AEROWEST GMBH. "Preisliste Geodaten Aerowest," Oct. 21, 2005, 1 page.
Agarwal et al., "Reconstructing Rome," *IEEE Computer* 43(6): 40-47, Jun. 2010.
Agarwal et al., "Building Rome in a Day," *Communications of the ACM* 54(10): 105-112, Oct. 2011.
Agarwala et al., "Interactive Digital Photomontage," ACM SIGGRAPH 2004, Los Angeles, CA, Aug. 2004, 9 pages.
Agarwala et al., "Panoramic Video Textures," SIGGRAPH 2005, Los Angeles, CA, Aug. 2005, 8 pages.
Appli-cad Australia, "Linear Nesting Reports," AppliCad Sample Reports, Jul. 18, 2000, 9 pages.
Appli-cad Australia, "Roof Magician: Especially suited to single, shake and tile roofing," Sample Reports, Jun. 24, 2004, 13 pages.

(56) References Cited

OTHER PUBLICATIONS

Appli-cad Australia, "Roof Wizard: Advanced Software for Roof Modeling and Estimating," Document Issue 1.0.0, Sep. 25, 2004, 10 pages.
Appli-cad Australia, "Roof Wizard: Especially suited to metal roofing," Generate Offcuts Reports, Mar. 9, 2005, 7 pages.
Appli-cad Australia, "Roof Wizard: Especially suited to metal roofing," Generate Offcuts Reports, Sep. 14, 2006, 7 pages.
Appli-cad Australia, "Roof Wizard: Especially suited to metal roofing," Sample Reports, Jul. 13, 2004, 24 pages.
Appli-cad Australia, "Roof Wizard: Especially suited to metal roofing," Sample Reports, Sep. 17, 2002, 12 pages.
Appli-cad Australia, "Sorcerer: Advanced Software for Roof Modeling and Estimating," Reference Guide Version 3, Sep. 8, 1999, 142 pages.
Appli-cad Australia, "Sorcerer: The complete solution for professional roof estimating," Demonstration Kit, Mar. 9, 2005, 15 pages.
AppliCad Roofing, sample report dated Jul. 30, 2007, 1 page.
Applicad Roofing, sample report dated Mar. 2, 2005, 28 pages.
AppliCad USA, "Linear Nesting Reports," AppliCad Sample Reports, Nov. 25, 1999, 9 pages.
Applicad webpage 2005 snip different color lines, 1 page.
AppliCad, "Example Output and Brochures," retrieved from URL= http://www.applicad.com/au/product-reports.html on Apr. 16, 2012, 2 pages.
AppliCad, "Product Overview—Sorcerer: Advanced Software for Roofing Modeling, Estimating, Presentation and Installation," Issue 5, Mar. 2, 2001, 15 pages.
AppliCad, "Roofing Software: Product Bulletin Section 1—Modeling the Roof," Dec. 20, 2005, retrieved from URL=htpp://web.archive.org/web/20021122204408/http://www.applicad.com.au/ on Apr. 16, 2012, 3 pages.
AppliCad, "Roofing Software: Product Bulletin Section 1—Modeling the Roof," Jan. 7, 2002, retrieved from URL=htpp://web.archive.org/web/20021122204408/http://www.applicad.com.au/ on Apr. 16, 2012, 3 pages.
AppliCad, "Roofing Software: Product Bulletin Section 2—Modifying the Model," Dec. 20, 2005, retrieved from URL=http://web.archive.org/web/20051210130430/http://www.applicad.com.au/ on Apr. 16, 2012, 2 pages.
AppliCad, "RoofScape: Advanced Software for Roof Modeling and Estimating," Learning Guide (English Units), Revision 1.1, Aug. 2007, 48 pages.
Atkinson, "Therory of Close Range Photogrammetry," Chapter 2, Section 1, Coordinate Transformations, retrieved Oct. 21, 2013, from http://www.lems.brown.edu/vision/people/leymarie/Refs/Photogrammetry/Atkinson90/C . . . , 5 pages.
Australian Office Action for Australian Application No. 2010201839, dated Apr. 14, 2011, 2 pages.
Australian Office Action, dated Oct. 1, 2013, for Australian Application No. 2010219392, 4 pages.
Autodesk, "Autodesk ImageModeler—Features," retrieved on Sep. 30, 2008, from http:///usa.autodesk.com/adsk/servlet/index?siteID=123112&id=115639 . . . , 1 page.
Automatic House Reconstruction, retrieved on Sep. 29, 2008, from http://www.vision.ee.ethz.ch/projects/Amobe_I/recons.html, 7 pages.
Azuma et al., "View-dependent refinement of multiresolution meshes with subdivision connectivity," *Proceedings of the Second International Conference on Computer Graphics, Virtual Reality, Visualization, and Interaction (Afigraph 2003)*, Capetown, South Africa, Feb. 2003, pp. 69-78.
Gaillard et al., :Automatic reconstruction of piecewise planar models from multiple views, CVPR99, vol. 2, 1999, pp. 559-565, 7 pages.
Bazaraa et al., *Nonlinear Programming Theory and Algorithms*, Second Edition, John Wiley & Sons, Inc., New York, 1993, 330 pages.

Bhat et al., "A Perceptually-Motivated Optimization-Framework for Image and Video Processing," Computer Science & Engineering Technical Report, UW-CSE-08-06-02, University of Washington, Seattle, WA, Jun. 2008, 10 pages.
Bhat et al, "Fourier Analysis of the 2D Screened Poisson Equation for Gradient Domain Problems," ECCV 2008, 14 pages.
Bhat et al., "GradientShop: A Gradient-Domain Optimization Framework for Image and Video Filtering," ACM TOG 29(2), Mar. 2010, 14 pages.
Bhat et al., "Piecewise Image Registration in the Presence of Large Motions," CVPR 2006, New York, NY, Jun. 2006, 7 pages.
Bhat et al., "Using Photographs to Enhance Videos of a Static Scene," Eurographics Symposium on Rendering 2007, 12 pages.
Bignone et al., "Automatic Extraction of Generic House Roofs from High Resolution Aerial Imagery," *Proc. ECCV*, 1996, 12 pages.
Canadian Office Action, for Canadian Application No. 2,641,373, dated Jan. 9, 2012, 4 pages.
Canadian Office Action, dated Sep. 24, 2013, for Canadian Application No. 2,641,373, 4 pages.
Capell et al., "A Multiresolution Framework for Dynamic Deformations," Computer Science & Engineering Technical Report, UW-CSE-02-04-02, University of Washington, Seattle, WA, Apr. 2002, 8 pages.
Chevrier et al., "Interactive 3D reconstruction for urban areas—An image based tool," *CAAD Futures*, 2001, 13 pages.
Chuang et al., "A Bayesian Approach to Digital Matting," IEEE Computer Vision and Pattern Recognition 2001, Kauai, Hawaii, Dec. 2001, 8 pages.
Chuang et al., "Animating Pictures with Stochastic Motion Textures," SIGGRAPH 2005, Los Angeles, CA, Aug. 2005, 8 pages.
Chuang et al., "Animating Pictures with Stochastic Motion Textures," Technical Report UW-CSE-CA-04-04-02, SIGGRAPH 2005, Los Angeles, CA, Aug. 2005, 7 pages.
Chuang et al., "Environment Matting Extensions: Towards Higher Accuracy and Real-Time Capture," SIGGRAPH 2000, New Orleans, LA, Jul. 24-28, 2000, 11 pages.
Chuang et al., "Environment Matting Extensions: Towards Higher Accuracy and Real-Time Capture," Tech Report, SIGGRAPH 2000, New Orleans, LA, Jul. 24-28, 2000, 10 pages.
Chuang et al., "Shadow Matting and Compositing," SIGGRAPH 2003, San Diego, CA, Jul. 2003, 7 pages.
Ciarcia et al., "Automated Roof Identification Systems and Methods," U.S. Appl. No. 12/590,131, filed Nov. 2, 2009, 74 pages.
Ciarcia et al., "Automated Roof Identification Systems and Methods," U.S. Appl. No. 12/590,131, Notice of Allowance, dated Aug. 26, 2013, 9 pages.
Ciarcia et al., "Automated Roof Identification Systems and Methods," Office Action dated Jan. 9, 2013, for U.S. Appl. No. 12/590,131, 14 pages.
Ciarcia, "Systems and Methods for Point-to-Point Registration Using Perspective Imagery From Independent Sources Without Image Acquisition Metadata," U.S. Appl. No. 13/646,466, filed Oct. 5, 2012, 41 pages.
Colburn et al., "Image-Based Remodeling," IEEE Transactions on Visualization and Computer Graphics, vol. 19, No. 1, Jan. 2013, 11 pages.
Curless et al., "Better Optical Triangulation Through Spacetime Analysis," Computer Systems Laboratory Technical Report CSL-TR-95-667, Stanford University, Stanford, CA, Apr. 1995, 12 pages.
Curless et al., "Computer model and 3D fax of Happy Buddha," retrieved Oct. 25, 2013, from http://www-graphics.stanford.edu/projects/faxing/happy/, 4 pages.
Curless et al., "A Volumetric Method for Building Complex Models from Range Images," SIGGRAPH '96, New Orleans, LA, Aug. 4-9, 1996, 10 pages.
Curless et al., "Better Optical Triangulation through Spacetime Analysis," 1995 5$^{th}$ International Conference on Computer Vision, Boston, MA, Jun. 20-23, 1995, 8 pages.
Curless, "New Methods for Surface Reconstruction from Range Images," Dissertation, Submitted to the Department of Electrical Engineering and the Committee of Graduate Studies of Stanford University, Jun. 1997, 209 pages.

(56) References Cited

OTHER PUBLICATIONS

Curless, "From Range Scans to 3D Models," *ACM SIGGRAPH Computer Graphics* 33(4): 38-41, 1999.
Debevec et al., "Modeling and Rendering Architecture from Photographs: A hybrid geometry- and image-based approach," *SIGGRAPH conference proceedings,* retrieved from www.cs.berkeley.edu/~malik/papers/debevecTM96.pdf., 1996, 10 pages.
Delaney, "Searching for Clients From Above—More Small Businesspeople Use Aerial Mapping Services to Scout Potential Customers," *The Wall Street Journal,* Jul. 31, 2007, retrieved on Feb. 25, 2010, from http://online.wsj.com/public/article/SB118584306224482891.html?mod=yahoo_free, 3 pages.
Drawing received Jan. 31, 2012.
*Eagle View Tech.* v. *Aerialogics LLC,* Case No. 2:12-cv-00618-RAJ, Prior Art Presentation, Aug. 17, 2012, 61 pages.
ECE 390, Introduction to Optimization, Spring 2004, Introductory Course, retrieved Oct. 25, 2013, from http://liberzon.csl.illinois.edu/04ECE390.html, 1 page.
Ekman, "Price Estimation Tool," Office Action for U.S. Appl. No. 13/843,437, dated Aug. 14, 2013, 9 pages.
Falkner et al., *Aerial Mapping 2nd Edition,* Lewis Publishers (CRC Press LLC), 2002, "Chapter 11—Aerotriangulation," 23 pages.
Faugeras et al., "3-D reconstruction of Urban Scenes from Sequences of Images," Institut National De Recherche En Informatique Et En Automatique, No. 2572, Jun. 1995, 27 pages.
Faugeras, "What can be seen in three dimensions with an uncalibrated stereo rig?," *Computer Vision—ECCV '92:* 563-578, 1992. (18 pages).
Fisher et al., *Dictionary of Computer Vision and Image Processing,* John Wiley & Sons, Ltd., West Sussex, England, 2005, 182 pages.
Fritsch, "Introduction into Digital Aerotriangulation," Photogrammetric Week '95, Wichman Verlag, Heidelberg, 1995, pp. 165-171, 7 pages.
Furukawa et al., "Manhattan-world Stereo," CVPR 2009, Miami, Florida, Jun. 2009, 8 pages.
Furukawa et al., "Reconstructing Building Interiors from Images," ICCV 2009, Kyoto, Japan, Sep. 2009, 8 pages.
Furukawa et al, "Towards Internet-scale Multi-view Stereo," CVPR 2010, Jun. 2010, 8 pages.
Georgeiv et al., "Spatio-Angular Resolution Tradeoff in Integral Photography," Proceedings of Eurographics Symposium on Rendering, 2006, 10 pages.
GEOSPAN Corporation, "Digital Geo-Referenced Oblique Aerial Imagery Solution EPP-REP No. 8444 5/13," GEO-NY0000868, 2007, 28 pages.
Goesele et al., "Multi-View Stereo for Community Photo Collections," Proceedings of ICCV 2007, Rio de J aneiro, Brazil, Oct. 2007, 8 pages.
Goesele et al., "Multi-View Stereo Revisited," CVPR 2006, New York, NY, Jun. 2006, 8 pages.
Goldman et al., "Interactive Video Object Annotation," Computer Science & Engineering Technical Report, UW-CSE-07-04-01, University of Washington, Seattle, WA, Apr. 2007, 7 pages.
Goldman et al., "Schematic Storyboarding for Video Editing and Visualization." SIGGRAPH 2006, Boston, MA, Aug. 2006, 10 pages.
Goldman et al., "Shape and Spatially-Varying BRDFs From Photometric Stereo," IEEE Transactions on Pattern Analysis and Machine Intelligence, vol. 32, No. 6, Jun. 2010, 12 pages.
Goldman et al., "Shape and Spatially-Varying BRDFs From Photometric Stereo," ICCV 2005, Beijing, China, Oct. 2005, 8 pages.
Goldman et al., "Video Object Annotation, Navigation, and Composition," UIST 2008, 10 pages.
Gonzalez et al., *Digital Image Processing,* Addison-Wesley Publishing Company, Inc., Reading, Massachusetts, 1993, 372 pages.
Gülch et al., "On the Performance of Semi-Automatic Building Extraction," In the International Archives of Photogrammetry and Remote Sensing, vol. 23, 8 pages, 1998.
Gupta et al., "Enhancing and Experiencing Spacetime Resolution with Videos and Stills," Computer Science & Engineering Technical Report, UW-CSE-04-08-01, University of Washington, Seattle, WA, Apr. 2008, 6 pages.
Gupta et al., "DuploTrack: A Real-time System for Authoring and Guiding Duplo Block Assembly," UIST 2012, Boston, MA, Oct. 2012, 13 pages.
Gupta et al., "Enhancing and Experiencing Spacetime Resolution with Video and Stills," ICCP 2009, San Francisco, CA, Apr. 2009, 9 pages.
Gupta et al., "Single Image Deblurring Using Motion Density Functions," ECCV 2010, Crete, Greece, Sep. 2010, 14 pages.
Hartley et al., "2.4 A Hierarchy of Transformations", Multiple View Geometry in Computer Vision, Cambridge University Press, Second Edition, 2003, 9 pages.
Hartley et al., "Appendix 6: Iterative Estimation Methods," Multiple View Geometry in Computer Vision, Cambridge University Press, Second Edition, 2003, 34 pages.
Hartley et al., "Invariant and Calibration-Free Methods in Scene Reconstruction and Object Recognition," Final Technical Report, Feb. 28, 1997, 266 pages.
Hartley et al., *Multiple View Geometry in Computer Vision,* Second Edition, Cambridge University Press, Cambridge, England, 2003, 672 pages.
Held et al., "3D Puppetry: A Kinect-based Interface for 3D Animation," UIST 2012, Boston, MA, Oct. 2012, 11 pages.
Henricsson et al., "3-D Building Reconstruction with ARUBA: A Qualitative and Quantitative Evaluation," Institute of Geodesy and Photogrammerty, Swiss Federal Institute of Technology, 2001, 13 pages.
Hudson, "Merging VRML Models: Extending the Use of Photomodeller," Thesis, in TCC 402, Presented to the Faculty of the School of Engineering and Applied Science, University of Virginia, Mar. 23, 1998, 23 pages.
International Preliminary Report on Patentability for International Application No. PCT/US2011/023408, dated Aug. 16, 2012, 7 pages.
International Search Report and Written Opinion for International Application No. PCT/US2013/023502, dated Apr. 30, 2013, 8 pages.
International Search Report for International Application No. PCT/US11/23408, dated Aug. 11, 2011, 2 pages.
International Search Report for International Application No. PCT/US2013/023503, dated Apr. 30, 2013, 5 pages.
International Search Report and Written Opinion for International Application No. PCT/US2013/024523, dated Nov. 13, 2013, 15 pages.
Kolman, "Chapter 4, Linear Transformations and Matrices, 4.1: Definition and Examples," Elementary Linear Algebra, Second Edition, Macmillan Publishing Co,. Inc., 1997, 12 pages.
KP Building Products, "Vinyl Siding Estimating and Installation Guide," 2007, 32 pages.
Krainin et al., "Autonomous Generation of Complete 3D Object Models Using Next Best View Manipulation Planning," ICRA 2011, Shanghai, China, May 2011, 7 pages.
Kushal et al., "Photo Tours," 3DimPVT, Oct. 2012, 8 pages.
Levoy et al., "The Digital Michelangelo Project: 3D Scanning of Large Statues," SIGGRAPH 2000, New Orleans, LA, Jul. 24-28, 2000, 14 pages.
Levoy, "The Digital Michelangelo Project," retrieved Oct. 25, 2013, from http://www-graphics.stanford.edu/projects/mich/, 10 pages.
Li et al., "Automated Generation of Interactive 3D Exploded View Diagrams," ACM Transactions on Graphics 27(3), SIGGRAPH 2007, Aug. 2007, 7 pages.
Li et al., "Interactive Cutaway Illustration of Complex 3D Models," ACM Transactions on Graphics 26(3), SIGGRAPH 2007, Aug. 2007, 11 pages.
Lueders, "Infringement Allegations by EagleView Technologies," Feb. 10, 2009, 3 pages.
Mahajan et al., "A Theory of Frequency Domain Invariants: Spherical Harmonic Identities for BRDF / Lighting Transfer and Image Consistency," IEEE Pattern Analysis and Machine Intelligence, 30(2), Feb. 2008, 14 pages.

(56) References Cited

OTHER PUBLICATIONS

Mahajan et al., "A Theory of Spherical Harmonic Identities for BRDF/Lighting Transfer and Image Consistency," ECCV 2006, Graz, Austria, May 2006, 14 pages.
Mann, "Roof with a view," *Contract Journal* 431(6552):29, Nov. 23, 2005, 2 pages.
Mikhail et al., *Introduction to Modern Photogrammetry*, John Wiley & Sons, Inc., New York, 2001, 247 pages.
Miller et al., "Miller's Guide to Framing and Roofing," McGraw Hill, New York, pp. 131-136 and 162-163, 2005, 9 pages.
Minialoff, "Introduction to Computer Aided Design," Apr. 2000, 4 pages.
Noronha et al., "Detection and Modeling of Buildings from Multiple Aerial Images," Institute for Robotics and Intelligent Systems, University of Southern California, Nov. 27, 2001, 32 pages.
Noronha et al., "Detection and Modeling of Buildings from Multiple Aerial Images," *IEEE Transactions on Pattern Analysis and Machine Intelligence* 23(5):501-518, 2001, 32 pages.
Office Action received in Reexamination of U.S. Pat. No. 8,078,436 B2, Supplemental Reexamination Patent, dated Jul. 25, 2013, 72 pages.
Office Action received in Reexamination of U.S. Pat. No. 8,145,578 B2, Supplemental Reexamination Patent, dated Jul. 25, 2013, 24 pages.
Pershing et al., "Aerial Roof Estimation System and Method," Amendment in Response to Office Action received in Reexamination of U.S. Pat. No. 8,145,578 B2, Control No. 96/000,005, filed Oct. 25, 2013, 318 pages.
Pershing et al., "Aerial Roof Estimation System and Method," Amendment in Response to Office Action received in Reexamination of U.S. Pat. No. 8,078,436 B2, Control No. 96/000,004, filed Oct. 25, 2013, 229 pages.
Pershing et al., "Aerial Roof Estimation System and Method," Notice of Allowance dated Feb. 3, 2012, for U.S. Appl. No. 12/148,439, 35 pages.
Pershing et al., "Aerial Roof Estimation System and Method," Office Action dated Apr. 25, 2011, for U.S. Appl. No. 12/148,439, 52 pages.
Pershing et al., "Aerial Roof Estimation System and Method," Office Action dated Aug. 16, 2010, for U.S. Appl. No. 12/148,439, 47 pages.
Pershing et al., "Aerial Roof Estimation System and Method," Office Action dated Aug. 25, 2011, for U.S. Appl. No. 12/148,439, 77 pages.
Pershing et al., "Aerial Roof Estimation System and Method," Office Action dated Oct. 10, 2012, for U.S. Appl. No. 13/371,271, 7 pages.
Pershing et al., "Aerial Roof Estimation System and Method," Notice of Allowance dated Jul. 29, 2013, for U.S. Appl. No. 13/371,271, 15 pages.
Pershing et al., "Aerial Roof Estimation System and Method," U.S. Appl. No. 60/925,072, filed Apr. 17, 2007, 16 pages.
Pershing et al., "Aerial Roof Estimation System and Methods," Office Action dated Aug. 28, 2012, for U.S. Appl. No. 13/287,954, 12 pages.
Pershing et al., "Aerial Roof Estimation System and Methods," Office Action dated May 22, 2013, for U.S. Appl. No. 13/287,954, 25 pages.
Pershing et al., "Aerial Roof Estimation Systems and Methods," Notice of Allowance dated Oct. 14, 2011, for U.S. Appl. No. 12/253,092, 30 pages.
Pershing et al., "Aerial Roof Estimation Systems and Methods," Office Action dated May 10, 2011, for U.S. Appl. No. 12/253,092, 26 pages.
Pershing et al., "Automated Techniques for Roof Estimation," U.S. Appl. No. 61/197,072, filed Oct. 31, 2008, 32 pages.
Pershing et al., "Geometric Correction of Rough Wireframe Models Derived From Photographs," U.S. Appl. No. 61/300,414, filed Feb. 1, 2010, 22 pages.
Pershing, "Concurrent Display Systems anf Methods for Aerial Roof Estimation," Notice of Allowance dated Feb. 16, 2012, for U.S. Appl. No. 12/467,250, 19 pages.
Pershing, "Concurrent Display Systems anf Methods for Aerial Roof Estimation," Office Action dated Sep. 7, 2011, for U.S. Appl. No. 12/467,250, 14 pages.
Pershing, "Concurrent Display Systems and Methods for Aerial Roof Estimation," Office Action dated Aug. 28, 2012, for U.S. Appl. No. 13/474,504, 8 pages.
Pershing, "Concurrent Display Systems and Methods for Aerial Roof Estimation," Office Action dated Jun. 19, 2013, for U.S. Appl. No. 13/474,504, 14 pages.
Pershing, "Pitch Determination Systems and Methods for Aerial Roof Estimation," Notice of Allowance dated Feb. 16, 2012, for U.S. Appl. No. 12/467,244, 20 pages.
Pershing, "Pitch Determination Systems and Methods for Aerial Roof Estimation," Office Action for U.S. Appl. No. 13/438,288, dated Aug. 24, 2012, 8 pages.
Pershing, "Pitch Determination Systems and Methods for Aerial Roof Estimation," Office Action dated May 21, 2013, for U.S. Appl. No. 13/438,288, 11 pages.
Pershing, "Pitch Determination Systems and Methods for Aerial Roof Estimation," Office Action dated Aug. 26, 2011, for U.S. Appl. No. 12/467,244, 17 pages.
Pershing, "Systems and Methods for Estimation of Building Floor Area," U.S. Appl. No. 13/385,607, filed Feb. 3, 2012, 41 pages.
Pershing, "Systems and Methods for Estimation of Building Floor Area," U.S. Appl. No. 13/757,712, filed Feb. 1, 2013, 95 pages.
Pershing, "Systems and Methods for Estimation of Building Wall Area," U.S. Appl. No. 13/757,694, filed Feb. 1, 2013, 96 pages.
Pershing, "User Interface Techniques for Roof Estimation," U.S. Appl. No. 61/197,904, filed Oct. 31, 2008, 62 pages.
Pershing et al., Aerial Roof Estimation System and Method, Notice of Allowance, for U.S. Appl. No. 13/371,271, dated Jul. 29, 2013, 15 pages.
Pershing et al., "Automated Roof Identification Systems and Methods," Notice of Allowance for U.S. Appl. No. 12/590,131, dated Aug. 26, 2013, 9 pages.
Pershing, "Systems and Methods for Estimation of Building Floor Area," Office Action for U.S. Appl. No. 13/757,712, dated Jul. 18, 2013, 18 pages.
Pershing, "Systems and Methods for Estimation of Building Wall Area," Office Action for U.S. Appl. No. 13/757,694, dated Oct. 8, 2013, 15 pages.
Pershing, "Systems and Methods for Estimation of Building Floor Area," Notice of Allowance for U.S. Appl. No. 13/757,712, dated Nov. 25, 2013, 15 pages.
PhotoModeler, "Measuring & Modeling the Real World," retrieved Sep. 30, 2008, from http://www.photomodeler.com/products/photomodeler.htm, 2 pages.
Pictometry Online, "Government" Oct. 7, 2008, retrieved Aug. 10, 2011, from http://web.archive.org/web/20081007111115/http:/www.pictometry.com/government/prod . . . , 3 pages.
Pictometry, "Electronics Field Study™ Getting Started Guide," Version 2.7, Jul. 2007, 15 pages.
Pictometry, "FAQs," Sep. 22, 2008, retrieved on Aug. 10, 2011, from http ://www.web.archive.org/web/20080922013233/http://www.pictometry.com/about_us/faqs.sht . . . , 3 pages.
Pictometry.com, "Frequently Asked Questions," May 24, 2005, retrieved Mar. 28, 2012, from URL=http://web.archive.org/web/20050524205653/http://pictometry.com/faq.asp, 9 pages.
Pictometry.com, "Frequently Asked Questions," retrieved on Apr. 9, 2011, from http://replay.waybackmachine.org/20050801231818/http:///www.pictometry.com/faq.asp, 10 pages.
Pictometry.com, "Frequently Asked Questions," retrieved on Aug. 1, 2005, from http://replay.waybackmachine.org/20050801231818/http:///www.pictometry.com/faq.asp, 10 pages.
Pictometry.com, "Frequently Asked Questions," retrieved on Feb. 10, 2012, from http://replay.waybackmachine.org/20050801231818/http:///www.pictometry.com/faq.asp, 6 pages.
Pictometry, "Frequently Asked Questions," Dec. 2006, retrieved Apr. 9, 2011, from http://replay.waybackmachine.org/20050801231818/http://www.pictometry.com/faq.asp, 10 pages.

(56) References Cited

OTHER PUBLICATIONS

Pictometry.com, "Pictometry Announces Software and Web-based Solution for Engineers, Architects, and Planners," Press Release, Jan. 22, 2004, 3 pages.
Poullis et al., "Photogrammetric Modeling and Image-Based Rendering for Rapid Virtual Environment Creation," http://handle.dtic.mil/100.2/ADA433420, 1998, 7 pages.
Precigeo.com, "Welcome to precigeoRoof," URL=http://web.archive.org/web/20070106063144/roof.precigeo.com, retrieved Apr. 30, 2009, 1 page.
Precigeo.com, "Welcome to precigeo™," "Welcome to precigeoRoof," "Why precigeoRoof," "How precigeoRoof Works," "How precigeoRoof Can Help Me," all retrieved on Feb. 26, 2010, from http://web.archive.org/, pp. 1-5; "Why precigeoRisk Works" and :Welcome to precigeoRisk, retrieved on Aug. 14, 2010, from http://web.archive.org, pp. 6-11, 11 pages total.
Precigeo.com, "Welcome to precigeo™," URL=http://web.archive.org/20080110074814/http://www.precigeo.com, retrieved Feb. 17, 2009, 1 page.
Precigo.com, "How precigeoRoof Works," URL=http://web.archive.org/web/20070107012311/roofprecigeo.com/how-precigeo-roof-works.htm, retrieved Apr. 30, 2009, 2 pages.
Reddy et al., "Frequency-Space Decomposition and Acquisition of Light Transport under Spatially Varying Illumination," ECCV 2012, Florence, Italy, Oct. 2012, 15 pages.
RoofCAD, "Satellite Takeoff Tutorial-Pitched Roof," received Jan. 31, 2012, 25 pages.
Scholze et al., "A Probabilistic Approach to building Roof Reconstruction Using Semantic Labeling," *Pattern Recognition 2449/2002*, Springer Berlin/Heidelberg, 2002, 8 pages.
Schutzberg et al., "Microsoft's MSN Virtual Earth: The Map is the Search Platform," *Directions Magazine*, retrieved Feb. 6, 2009, from http://www.directionsmag.com/article.php?article_id=873&try=1, 10 pages.
Seitz et al., "A Comparison and Evaluation of Multi-view Stereo Reconstruction Algorithms," CVPR 2006, New York, NY, Jun. 2006, 8 pages.
Sengül, "Extracting Semantic Building Models From Aerial Stereo Images and Convesion to Citygml," Thesis, Istanbul Technical University Institute of Science and Technology, May 2010, 138 pages.
Shan et al., "Refractive Height Fields from Single and Multiple Images," CVPR 2012, Providence, RI, Jun. 2012, 8 pages.
Shan et al., "Refractive Height Fields from Single and Multiple Images," CVPR 2012, Providence, RI, Jun. 2012, poster, 1 page.
Sorcerer software screenshot, modified on Sep. 6, 2012, 1 page.
Steuer, "Heigh Snakes: 3D Building Reconstruction from Aerial Image and Laser Scanner Data," Joint Urban Remote Sensing Event (JURSE 2011), Munich, Germany, Apr. 11-13, 2011, pp. 113-116.
University of Washington, College of Arts & Sciences, Mathematics, Course Offerings, Autumn Quarter 2013 and Winter Quarter 2014, retrieved Oct. 25, 2013, from http://www.washington.edu/students/crscat/math.html, 16 pages.
U.S. Appl. No. 60/425,275, filed Nov. 8, 2002, 32 pages.
Wattenberg et al., "Area, Volume, and Torque in Three Dimensions," retrieved on Sep. 24, 2013, from http://www.math.montana.edu/frankw/ccp/multiworld/twothree/atv/learn.htm, 14 pages.
Weeks et al., "A Real-Time, Multichannel System with Parallel Digital Signal Processors," *Proceedings of IEEE International Conference on Acoustics, Speech and Signal Processing (ICASSP 1990)* 3: 1787-1790, Apr. 1990.
Wolf, *Elements of Photogrammetry*, McGraw-Hill Kogakusha, 1974, "Chapter Fourteen: Aerotriangulation; 41-1 Introduction," pp. 351-352, 3 pages.
Wood et al., "Surface Light Fields for 3D Photography," SIGGRAPH 2000, New Orleans, LA, Jul. 24-28, 2000, 10 pages.
Written Opinion for International Application No. PCT/US11/23408, dated Aug. 11, 2011, 5 pages.
Written Opinion for International Application No. PCT/US2013/023503, dated Apr. 30, 2013, 4 pages.
Written Opinion for International Application No. PCT/US2013/023502, dated Apr. 30, 2013, 3 pages.
Wu et al., "Multicore Bundle Adjustment," CVPR 2011, Colorado Springs, CO, Jun. 2011, 8 pages.
Wu et al., "Schematic Surface Reconstruction," CVPR 2012, Providence, RI, Jun. 2012, 1 page.
www.archive.org Web site showing alleged archive of PhotoModeler Web Site http://www.photomodeler.com/pmpro08.html from Feb. 9, 2006 (retrieved Oct. 21, 2013), 4 pages.
www.archive.org Web site showing alleged archive of German Aerowest Web Site http://aerowest.de/ from Feb. 6, 2006 (retrieved Sep. 20, 2012) and translated to English, 61 pages.
www.archive.org Web site showing alleged archive of German AeroDach Web Site http://www.areodach.de from Jun. 13, 2004 (retrieved Sep. 20, 2012) and translations to English, 21 pages.
YouTube, "Pictometry Online Demo," retrieved on Feb. 6, 2006, from http://www.youtube.com/watch?v=jURSKo0OD0, 1 page.
YouTube, "Pictometry Online Webinar for MAIA Members," uploaded Apr. 8, 2011, retrieved from http://www.youtube.com/watch?v=RzAXK2avqQQ, 2 pages.
Zhang et al., "Rapid Shape Acquisition Using Color Structured Light and Multi-Pass Dynamic Programming," International Symposium on 3D Data Processing Visualization and Transmission, Padova, Italy, June 2002, 13 pages.
Zhang et al., "Shape and Motion Under Varying Illumination: Unifying Structure from Motion, Photometric Stereo, and Multi-view Stereo," ICCV 2003, Nice, France, Oct. 2003, 8 pages.
Zhang et al., "Spacetime Stereo: Shape Recovery for Dynamic Scenes," CVPR 2003, Madison, Wisconsin, Jun. 2003, 8 pages.
Zheng et al., "A Consistent Segmentation Approach to Image-based Rendering," Technical Report CSE-09-03-02, 2002, 8 pages.
Zheng et al., "Parallax Photography: Creating 3D Cinematic Effects form Stills," Proceedings of Graphics Interface 2009, Kelowna, BC, CA, May 2009, 8 pages.
Ziegler et al., "3D Reconstruction Using Labeled Image Regions," Mitsubishi Research Laboratories, http://www.merl.com, Jun. 2003, 14 pages.
Zongker et al., "Environment Matting and Compositing," SIGGRAPH '99, Los Angeles, CA, Aug. 9-13, 1999, 10 pages.
Transcription of points of potential interest in the attached YouTube video titled: "Pictometry Online Demo," retrieved on Feb. 10, 2010, 1 page.
YouTube, "Pictometry Online Demo," DVD, Feb. 25, 2010.
Pershing, "Systems and Methods for Estimation of Building Floor Area," U.S. Appl. No. 13/385,607, Final Rejection dated Nov. 17, 2015, 17 pages.
Pershing, "Systems and Methods for Estimation of Building Wall Area," U.S. Appl. No. 13/757,694, Final Rejection dated Nov. 9, 2015, 14 pages.
Pershing, "Systems and Methods for Estimation of Building Wall Area," U.S. Appl. No. 13/385,606, Final Rejection dated Nov. 3, 2015, 33 pages.
Investopedia.com, "Floor Area Ratio—FAR," Mar. 28, 2010, 2 pages.
Patent Examination Report No. 3, dated Sep. 13, 2016, for Australian Application No. 2013205518, 3 pages.
"Systems and Methods for Performing a Risk Management Assessment of a Property," Office Action, dated Sep. 16, 2016, for Pershing, U.S. Appl. No. 13/844,467, 44 pages.
"Systems and Methods for Estimation of Building Wall Area," Notice of Allowance, dated Oct. 13, 2016, for Pershing, U.S. Appl. No. 13/757,694, 12 pages.
USPTO Decision on Appeal regarding U.S. Appl. No. 13/385,606 dated Jun. 19, 2017.
USPTO, Office Action regarding U.S. Appl. No. 14/204,142, dated Dec. 20, 2016, 77 pages.
USPTO, Office Action regarding U.S. Appl. No. 13/844,467, dated Apr. 3, 2017, 25 pages.
Australian Government IP Australia, Examination Report No. 1 regarding Australian Patent Application No. 2016228305, dated Feb. 15, 2017, 3 pages.
USPTO, Office Action regarding U.S. Appl. No. 13/385,607, dated May 5, 2017, 22 pages.

(56) References Cited

OTHER PUBLICATIONS

Olsen et al., What We Know about Demand Surge: Brief Summary, May 2011, Natural Hazards Review, vol. 12, 63-69 (Year: 2011).
USPTO, Office Action regarding U.S. Appl. No. 13/844,467 dated Apr. 5, 2018.
Australian Patent Office, Examination Report regarding Australian Application No. AU 2017232194, dated Oct. 17, 2018.
Canadian Patent Office, Office Action regarding Canadian Application No. CA 2,862,868, dated Oct. 18, 2018.
Eagleview Technologies, Inc., response to Apr. 5, 2018 Office Action regarding U.S. Appl. No. 13/844,467, filed Oct. 5, 2018.
Doringer et al., "A Comprehensive Automated 3D Approach for Building Extraction, Reconstruction, and Regularization from Airborne Laser Scanning Point Clouds," Sensors 2008, 8, pp. 7323-7343, DOI: 10.3990/s8117323, 2008.
United States Patent Office, Office Action regarding U.S. Appl. No. 13/844,467 dated Dec. 21, 2018.
United States Patent Office, Office Action regarding U.S. Appl. No. 13/385,607 dated Oct. 4, 2018.
Australian Patent Office, Examination Report regarding Australian Application No. AU 2014235296, dated Jan. 30, 2019.
United States Patent Office, Final Office Action regarding U.S. Appl. No. 13/385,607, dated Apr. 25, 2019.
Eagle View Technologies, Inc., Response to Dec. 21, 2018 Office Action regarding U.S. Appl. No. 13/844,467, dated Jun. 21, 2019.
Canadian Patent Office, Office Action regarding Canadian Application No. CA 2,862,870, dated Jul. 12, 2019.
Eagle View Technologies, Inc., Response to Apr. 25, 2019 Office Action regarding U.S. Appl. No. 13/385,607, dated Oct. 25, 2019.
United States Patent Office, Office Action regarding U.S. Appl. No. 13/385,607, dated Nov. 21, 2019.
United States Patent Office, Office Action regarding U.S. Appl. No. 29/640,968, dated Dec. 2, 2019.
United States Patent Office, Office Action regarding U.S. Appl. No. 29/640,976, dated Dec. 2, 2019.
Automotive Illustrations Tutorials Isometric Drawing Tutorial, posted on Aug. 19, 2011, KHI, Inc. [online], [site visited Nov. 21, 2019]. Available from Internet, <URL: http://www.automotiveillustrations.com/tutorials/drawing-3-point-perspective.html/> [as cited by USPTO Office Action regarding U.S. Appl. No. 29/640,968, dated Dec. 2, 2019; and as cited by USPTO Office Action regarding U.S. Appl. No. 29/640,976, dated Dec. 2, 2019].
Drawing for All Drawing Tutorials How to Draw an Open Box, posted by Stepan Ayvazyan on Jan. 13, 2018, Drawingforall.net [online], [site visited Nov. 21, 2019]. Available from Internet, <URL: https://www.drawingforall.net/how-to-draw-an-open-box/> [as cited by USPTO Office Action regarding U.S. Appl. No. 29/640,968, dated Dec. 2, 2019; and as cited by USPTO Office Action regarding U.S. Appl. No. 29/640,976, dated Dec. 2, 2019].
Stack Exchange Isometric Paper and drawing on It, posted on May 14, 2013, Stack Exchange Inc. [online], [site visited Nov. 21, 2019]. Available from Internet, <URL: https://tex.stackexchange.com/questions/114278/isometric-paper-and-drawing-on-it-with-pstricks/>[as cited by USPTO Office Action regarding U.S. Appl. No. 29/640,968, dated Dec. 2, 2019; and as cited by USPTO Office Action regarding U.S. Appl. No. 29/640,976, dated Dec. 2, 2019].

* cited by examiner

EagleView Technologies

Roof and Wall Report
January 4, 2012

1234 Main Street, Anytown, USA

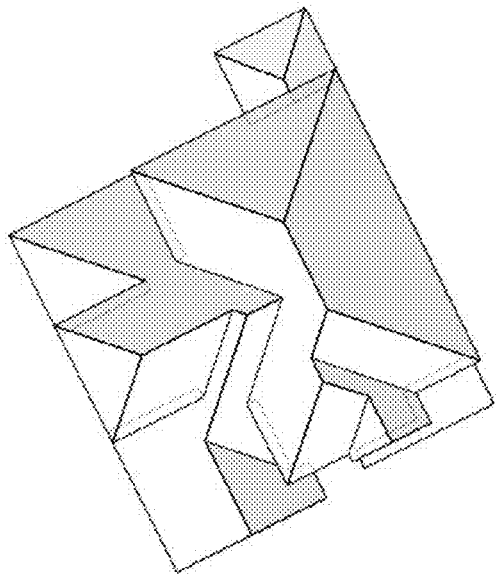

In this 3D model, facets appear as semi-transparent to reveal overhangs.

| Report Details | Property Details | Report Contents |
|---|---|---|
| Report: 2285590 | Total Roof Area = 3,403 sq ft | Images ............................................. 1 |
| | Total Roof Facets = 18 | Length Diagram ............................... 4 |
| | Predominant Pitch = 8/12 | Pitch Diagram .................................. 5 |
| | Total Ridges/Hips = 262 ft | Roof Area Diagram .......................... 6 |
| | Total Valleys = 89 ft | Notes Diagram ................................. 7 |
| | Total Rakes = 53 ft | 3D Wall Area Diagram ..................... 8 |
| | Total Eaves = 293 ft | Alternate 3D Wall View .................... 9 |
| | Total Wall Area = 2,549 sq ft | Missing Wall Diagram ..................... 10 |
| | Total Wall Facets = 17 | Elevation Diagrams ......................... 11 |
| | | Report Summary .............................. 15 |

Company: EagleView Technologies

Measurements provided by www.eagleview.com

Certified Accurate
www.eagleview.com/Guarantee.aspx

Copyright © 2008-2012 EagleView Technologies, Inc. — All Rights Reserved — Patents Pending

*Fig. 10A*

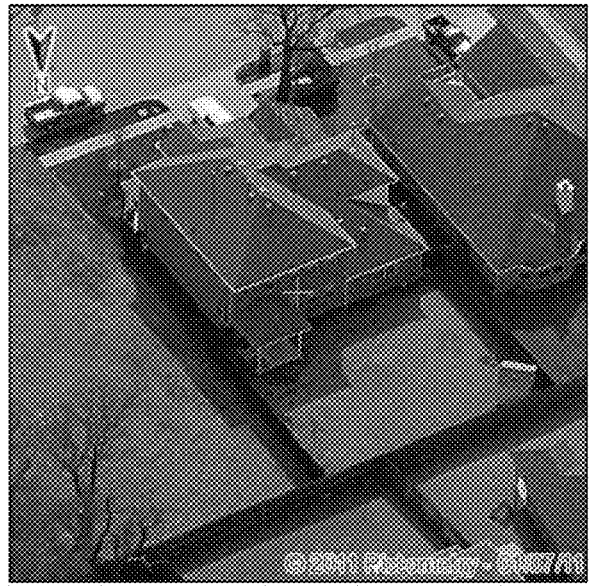
*Fig. 10C*

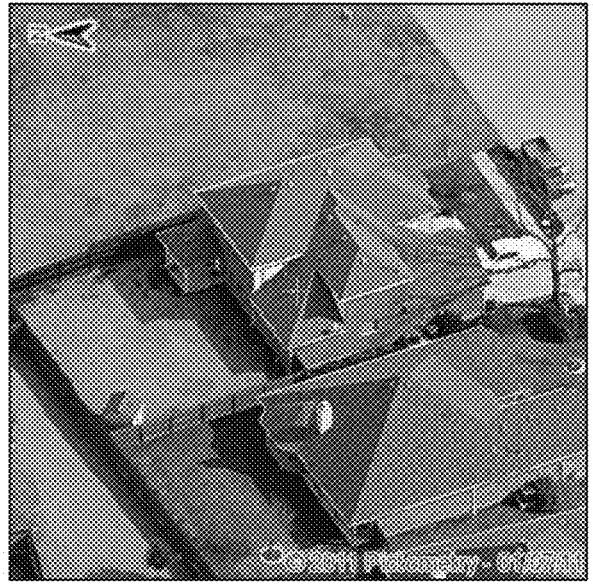
Fig. 10D

1234 Main Street, Anytown, USA  January 4, 2012

Wall Area Diagram
Total Wall Area = 2,549 sq ft with 17 facets

Wall Area By Direction

| North | East | South | West |
|---|---|---|---|
| O – 500 sq ft | E – 28 sq ft | B – 52 sq ft | A – 540 sq ft |
| Q – 52 sq ft | J – 32 sq ft | C – 122 sq ft | D – 37 sq ft |
|  | K – 34 sq ft | F – 138 sq ft | G – 7 sq ft |
|  | M – 15 sq ft | H – 78 sq ft | P – 52 sq ft |
|  | N – 692 sq ft | I – 132 sq ft |  |
|  |  | L – 38 sq ft |  |
| 552 sq ft | 801 sq ft | 560 sq ft | 636 sq ft |

Report: 2285590

1234 Main Street, Anytown, USA  January 4, 2012
East Elevation Diagram
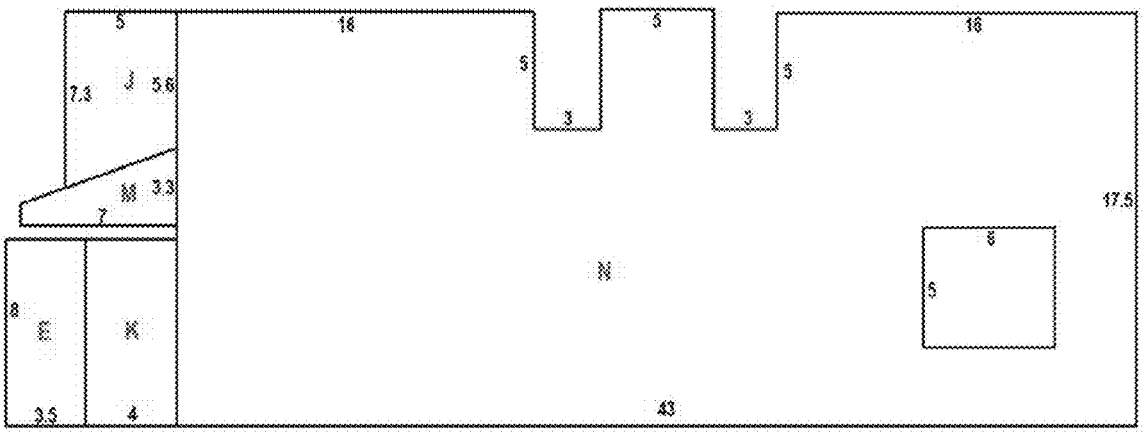
East Elevation Details
| Wall | Missing Wall Count | Missing Wall Area | Wall Area |
|---|---|---|---|
| E | 0 | 0 sq ft | 28 sq ft |
| J | 0 | 0 sq ft | 32 sq ft |
| K | 0 | 0 sq ft | 34 sq ft |
| M | 0 | 0 sq ft | 15 sq ft |
| N | 3 | 60 sq ft | 692 sq ft |
| Total | 3 | 60 sq ft | 801 sq ft |
Report: 2285590
EagleView Technologies  Copyright © 2008-2012 EagleView Technologies, Inc. – All Rights Reserved – Patents Pending
*Fig. 10M*

1234 Main Street, Anytown, USA                                                              January 4, 2012

Report Summary
Below is a measurement summary using the values presented in this report.

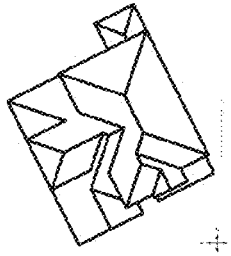

Total Roof Facets = 18

Lengths, Areas and Pitches
Ridges = 62 ft (7 Ridges)
Hips = 200 ft (13 Hips)
Valleys = 89 ft (6 Valleys)
Rakes* = 53 ft (6 Rakes)
Eaves/Starter** = 293 ft (19 Eaves)
Drip Edge (Eaves + Rakes) = 346 ft (25 Lengths)
There are no parapet walls labeled.
Flashing = 26 ft (6 Lengths)
Step flashing = 87 ft (10 Lengths)
Total Roof Area = 3,403 sq ft
Predominant Pitch = 8/12
Total Wall Area = 2,549 sq ft
Total Wall Facets = 17

Property Location
Longitude = -97.0823600
Latitude = 32.5969300

Notes
This was ordered as a residential property. It was reported to be a single structure. And, there were no changes to the structure in the past four years.

* Rakes are defined as roof edges that are sloped (not level).
** Eaves are defined as roof edges that are not sloped and level.

 Report: 2285590

EagleView Technologies       Copyright © 2008-2012 EagleView Technologies, Inc. – All Rights Reserved – Patents Pending       Page 15

*Fig. 10P*

EagleLuke Technologies

Walls Only Report
Date

1234 Main Street, Anytown, USA

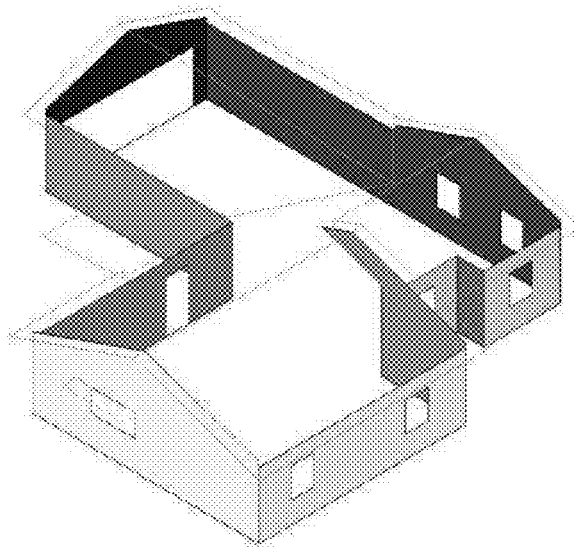

In this 3D model, facets appear as semi-transparent to reveal overhangs.

| Report Details | Wall Details | Report Contents |
|---|---|---|
| Report:5573105 | Total Wall Area = 1,960 sq ft<br>Total Wall Facets = 10<br>Total Window & Door Area = 246 sq ft<br>Total Windows & Doors = 9 | Images..........................................1<br>3D Wall Area Diagram ...............4<br>Alternate 3D Wall View .............5<br>Window and Door Diagram ........6<br>Elevation Diagrams....................7<br>Report Summary .......................11<br>Additional Property Information..12 |

Contact: Luke Loeffler
Company: EagleLuke Technologies
Address: 2525 220th St SESuite 203
Bothell WA 98021
Phone: (425) 443-4416

This document is provided under License by EagleView Technologies to the requestor for their Internal Use Only subject to the terms and conditions previously agreed to by the requestor when they registered for use of EagleView Technologies Services.

It remains the property of EagleView Technologies and may be reproduced and distributed only within the requestor's company. Any reproduction or distribution to anyone outside of the requestor's company without EagleView's prior written permission is strictly prohibited. All aspects and handling of the report are subject to the Terms and Conditions previously agreed to by the requestor.

Copyright © 2008-2013 EagleView Technologies, Inc. – All Rights Reserved – Covered by U.S. Patent Nos. 8,078,436; 8,145,578; 8,170,840 and 8,209,152. Other Patents Pending.

*Fig. 11A*

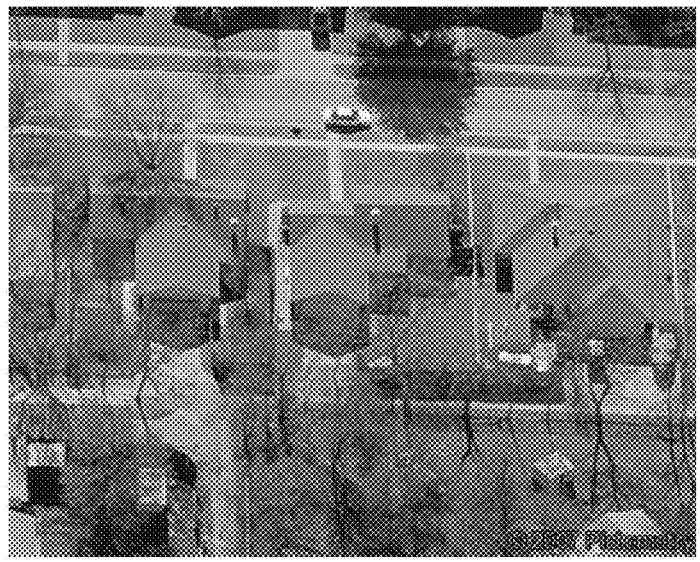
*Fig. 11C*

1234 Main Street, Anytown, USA                                      Date
East Side
West Side
 Report: 5573105
*Fig. 11D*

1234 Main Street, Anytown, USA       Date
Wall Area Diagram
Total Wall Area = 1,960 sq ft, with 10 facets.     Total Wall Area with Windows and Doors = 2,206 sq ft
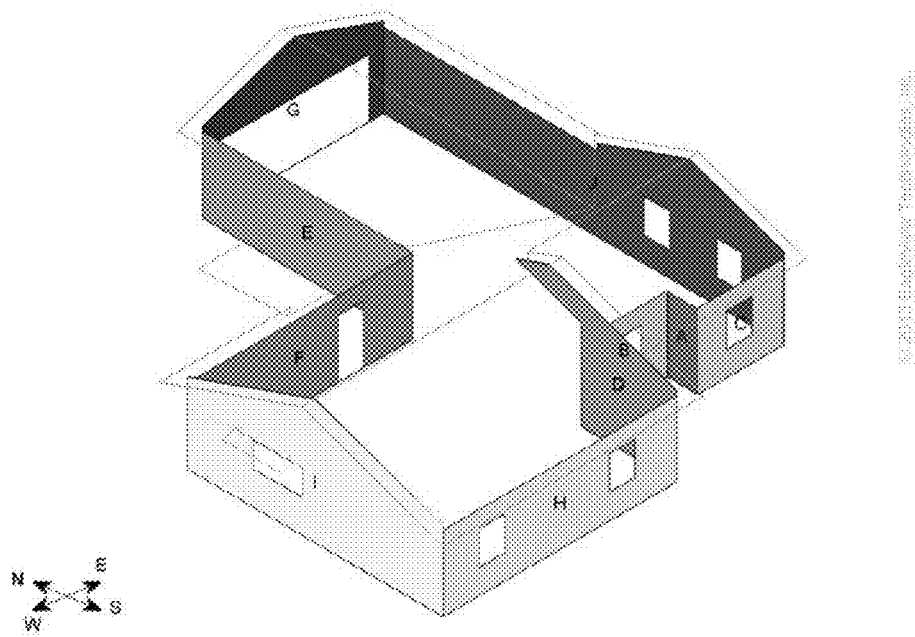
Wall Area by Direction
| North | East | South | West |
|---|---|---|---|
| F - 222.1 sq ft | D - 149.4 sq ft | B - 71.8 sq ft | A - 32.1 sq ft |
| G - 122.9 sq ft | J - 466.6 sq ft | C - 81.5 sq ft | E - 226.9 sq ft |
| | | H - 227.9 sq ft | I - 358.2 sq ft |
| 345 sq ft | 616 sq ft | 381.2 sq ft | 617.2 sq ft |
 Report: 5573105
EagleLuke Technologies
*Fig. 11E*

1234 Main Street, Anytown, USA — Date

North Elevation Diagram

Top of Walls = 50 ft     Bottom of Walls = 49 ft

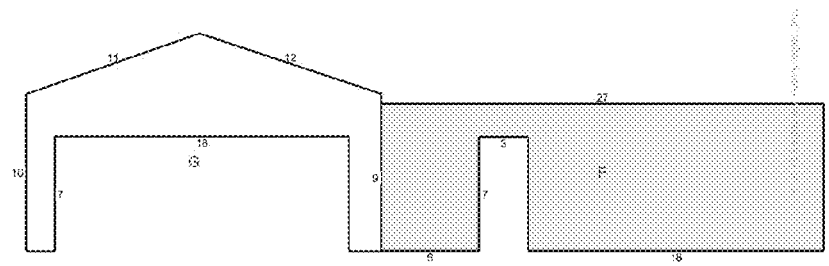

North Elevation Details

| Wall | Wall Area | Window & Door Area | Window & Door Perimeter | Window & Door Count |
|---|---|---|---|---|
| F | 222.1 | 20.9 | 20.0 | 1 |
| G | 122.9 | 126.0 | 50.0 | 1 |
| Total | 345 sq ft | 146.9 sq ft | 70 ft | 2 |

Note: On-site verification of yellow shaded areas is needed. Details are on the Wall Report Summary Page. This diagram shows segment lengths rounded to the nearest whole number. The window & door and wall area in square feet (rounded to the nearest tenth) is based on the actual (non-rounded) value of each segment length.

 Report: 5573105

EagleLuke Technologies    Copyright © 2008-2013 EagleView Technologies, Inc. – All Rights Reserved – Covered by U.S. Patent Nos. 8,078,436; 9,145,578; 8,170,840 and 8,209,152. Other Patents Pending.    Page 7

*Fig. 11H*

1234 Main Street, Anytown, USA — Date

East Elevation Diagram
Top of Walls = 70 ft          Bottom of Walls = 68 ft

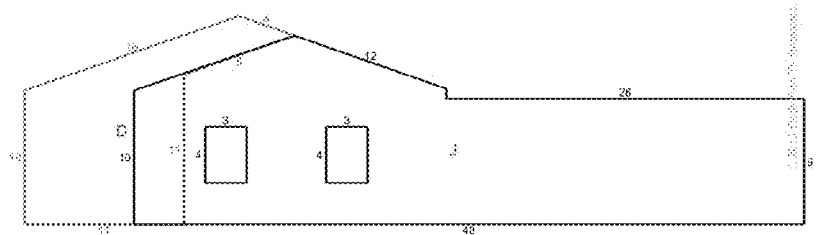

East Elevation Details

| Wall | Wall Area | Window & Door Area | Window & Door Perimeter | Window & Door Count |
|---|---|---|---|---|
| D | 149.4 | 0.0 | 0.0 | 0 |
| J | 466.6 | 24.0 | 28.0 | 2 |
| Total | 616 sq ft | 24 sq ft | 28 ft | 2 |

Note: On-site verification of yellow shaded areas is needed. Details are on the Wall Report Summary Page. This diagram shows segment lengths rounded to the nearest whole number. The window & door and wall area in square feet (rounded to the nearest tenth) is based on the actual (non-rounded) value of each segment length.

Report: 5573105

*Fig. 11I*

1234 Main Street, Anytown, USA                               Date

South Elevation Diagram
Top of Walls = 49 ft                           Bottom of Walls = 49 ft

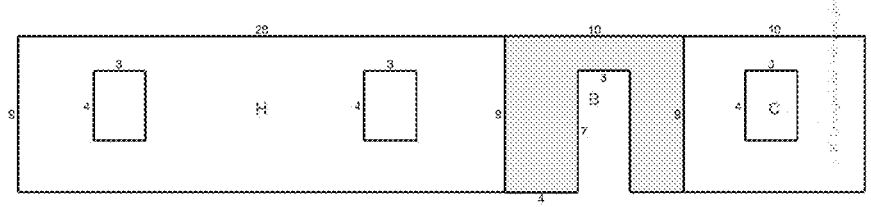

South Elevation Details

| Wall | Wall Area | Window & Door Area | Window & Door Perimeter | Window & Door Count |
|---|---|---|---|---|
| B | 71.8 | 21.0 | 20.0 | 1 |
| C | 81.5 | 12.0 | 14.0 | 1 |
| H | 227.9 | 24.0 | 28.0 | 2 |
| Total | 381.2 sq ft | 57 sq ft | 62 ft | 4 |

Note: On-site verification of yellow shaded areas is needed. Details are on the Wall Report Summary Page. This diagram shows segment lengths rounded to the nearest whole number. The window & door and wall area in square feet (rounded to the nearest tenth) is based on the actual (non-rounded) value of each segment length.

Report: 5573105

EagleLuke Technologies          Copyright © 2008-2013 EagleView Technologies, Inc. -- All Rights Reserved -- Covered by U.S. Patent Nos.   Page 9
                                8,078,436; 8,145,578; 8,170,840 and 8,300,152. Other Patents Pending.

*Fig. 11J*

1234 Main Street, Anytown, USA — Date

West Elevation Diagram
Top of Walls = 62 ft    Bottom of Walls = 60 ft

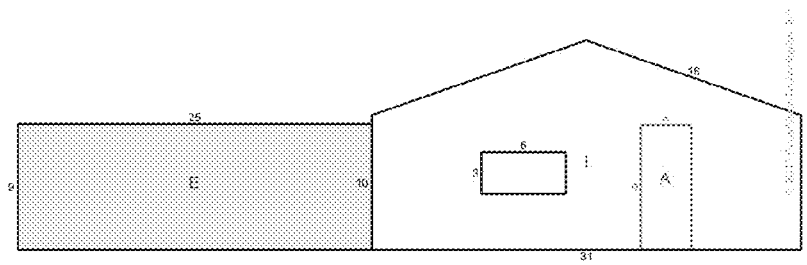

West Elevation Details

| Wall | Wall Area | Window & Door Area | Window & Door Perimeter | Window & Door Count |
|---|---|---|---|---|
| A | 32.1 | 0.0 | 0.0 | 0 |
| E | 226.9 | 0.0 | 0.0 | 0 |
| I | 358.2 | 18.0 | 18.0 | 1 |
| Total | 617.2 sq ft | 18 sq ft | 18 ft | 1 |

Note: On-site verification of yellow shaded areas is needed. Details are on the Wall Report Summary Page. This diagram shows segment lengths rounded to the nearest whole number. The window & door and wall area in square feet (rounded to the nearest tenth) is based on the actual (non-rounded) value of each segment length.

 Report: 5573105

EagleLuke Technologies    Copyright © 2008-2013 EagleView Technologies, Inc. — All Rights Reserved — Covered by U.S. Patent Nos. 8,078,436; 8,145,578; 8,170,840 and 8,209,152. Other Patents Pending.

*Fig. 11K*

| 1234 Main Street, Anytown, USA | | | | | | | | Date |

Wall Report Summary
Below is a measurement summary using the values presented in this report.

Wall Area Waste Calculation Table (excluding windows and doors)

| Waste % | 0% | 10% | 11% | 12% | 13% | 14% | 15% | 20% |
|---|---|---|---|---|---|---|---|---|
| Area (sq ft) | 1,960 | 2,156 | 2,176 | 2,195 | 2,215 | 2,235 | 2,254 | 2,352 |
| Squares | 19.6 | 21.6 | 21.8 | 22.0 | 22.1 | 22.3 | 22.5 | 23.5 |

This table shows the total wall area excluding windows and doors, based upon different waste percentages. The waste factor is subject to the complexity of the structure, image quality, siding techniques and your experience. Please consider this when calculating appropriate waste percentages. Note that only the wall area is included in these waste calculations. Accessories may require additional material.

Report Comments
Due to obstructions in available images of this property, please verify measurements on portion of structure highlighted in yellow.

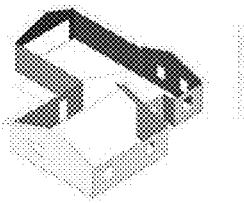

Total Wall Facets = 10
Total Windows and Doors = 9

Total Lengths & Areas

Wall Area = 1,960 sq ft
Wall Area with Windows and Doors = 2,206 sq ft
Top of Walls = 230 ft
Bottom of Walls = 225 ft
Inside Corners = 10 ft
Outside Corners = 68 ft
Inside Corners > 90° = 0 ft
Outside Corners > 90° = 0 ft
Window and Door Area = 246 sq ft
Window and Door Perimeter = 178 ft
Fascia (Eaves + Rake) = 256 ft

Property Location
Longitude = -96.9036860
Latitude = 32.6357570

Notes
This was ordered as a residential property. There were no changes to the structure in the past four years.

Wall measurements should be field verified to confirm accuracy. Wall areas assume that flat soffits exist at the eaves. If sloped soffits are present, wall height and wall area measurements will likely be off.

 Report: 5573105

*Fig. 11L*

| 1234 Main Street, Anytown, USA | Date |

Additional Property Information

Property Details
| | |
|---|---|
| Year Built/Effective Year Built: | N/A N/A |
| Last Known Roof Permit: | N/A |

*Effective Year Built is when the property's major components were revised to meet that year's code.*

Weather Data
| | |
|---|---|
| Last Hail Event: | 7/15/2012 |
| Hail Count: | 21 |

*Last hail event is the date of the last recorded hail event (greater than or equal to 3/4") within a one-mile radius.*
*Hail count is the number of recorded hail events (greater than or equal to 3/4") within a one-mile radius in the past three years.*

*Data such as weather and property information has been included to enhance your EagleView experience. The data is provided through strategic partners and is not verified by EagleView for accuracy, completeness or reliability.*

Report: 5573105

EagleLuke Technologies    Copyright © 2008-2013 EagleView Technologies, Inc. – All Rights Reserved – Covered by U.S.    Page 12
Patent Nos. 8,078,436; 8,145,578; 8,170,840 and 8,209,152. Other Patents Pending.

1302 — Include in the wall area measurement estimate report, multiple line drawings of a building having a roof, each of the multiple line drawings from a different corresponding angle of view of the building, wherein at least four of the multiple line drawings are elevation views of different sides of the building from a corresponding first, second, third and fourth angle of view of the building, respectively, and wherein the first and third angles of view are of exterior walls of the building facing substantially opposite of each other and wherein the second and fourth angles of view are of exterior walls of the building facing substantially opposite of each other 1304 — Include in one or more of the elevation views of the building, a shading of an edge of a wall to designate the edge of the wall is behind another wall in a corresponding view of the one or more of the elevation views of the building

*Fig. 13*

331 Charlotte St, Duncanville, TX 75137                                              January 10, 2013

West Elevation Diagram
Top of Walls = 62 ft                                         Bottom of Walls = 60 ft

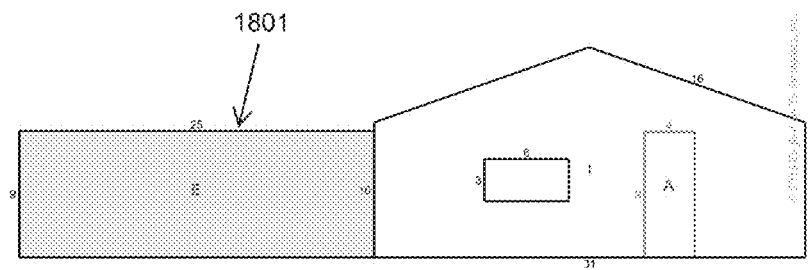

West Elevation Details

| Wall | Wall Area | Window & Door Area | Window & Door Perimeter | Window & Door Count |
|---|---|---|---|---|
| A | 32.1 | 0.0 | 0.0 | 0 |
| E | 226.9 | 0.0 | 0.0 | 0 |
| I | 358.2 | 18.0 | 18.0 | 1 |
| Total | 617.2 sq ft | 18 sq ft | 18 ft | 1 |

Note: On-site verification of yellow shaded areas is needed. Details are on the Wall Report Summary Page. This diagram shows segment lengths rounded to the nearest whole number. The window & door and wall area in square feet (rounded to the nearest tenth) is based on the actual (non-rounded) value of each segment length.

*Fig. 18*

SYSTEMS AND METHODS FOR ESTIMATION OF BUILDING WALL AREA AND PRODUCING A WALL ESTIMATION REPORT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Technical Field

This invention is in the field of building size estimation, and in particular, building wall area estimation.

Description of the Related Art

The square footage measurements of a building walls are used as a main factor in quickly estimating costs of materials and labor to repair or replace walls of the building and make other improvements or modifications to the entire building (e.g., to estimate the cost of siding materials to re-side a house). Thus, accurate wall area measurements are instrumental in these calculations. Current methods of measuring wall area often involve a person having to visit the building and manually measure particular dimensions of the building, or by referring to original plans or blueprints of the building. Manually measuring the dimensions for calculation of building wall area is costly and/original plans for the building may be unavailable or out of date. Therefore, accurate methods for estimating and verifying wall area that avoid these drawbacks are desirable.

SUMMARY OF THE INVENTION

In one embodiment, a wall area estimation system generates an estimated wall area measurement report of a building. Included in the wall area measurement estimate report are multiple line drawings of a building having the roof. Two of the multiple line drawings are each perspective views from an angle of view above the building. As used herein a "perspective view" means any view that is an axonometric view, an isometric view or a perspective view. A first of the perspective views being substantially centered on a first substantially vertical exterior corner of the house that is approximately opposite of a second substantially vertical exterior corner of the house on which a second of the perspective views is substantially centered.

The first and second of the perspective views include a line drawing of the roof that is transparent or translucent to show interior surfaces of the walls of the building in the first and second of the perspective views. The walls of the interior surfaces shown are shaded darker than the walls of the exterior.

The wall area report generation system determines angles of substantially all vertical walls of the building relative to a reference vertical plane. The system groups angles of substantially all vertical walls of the building into corresponding groups of walls which have similar angles within a defined threshold difference in angle. Then the system selects a corresponding group of walls resulting from the grouping that has the most walls having similar angles within a defined threshold difference in angle and determines the first angle of view based on the selected corresponding group of walls such that the angle of view is substantially facing the corresponding group of walls.

In some embodiments, all or any combination of the user interface features, graphical images and/or renderings of the building, building roof, building walls, building model and/or line drawings shown in the user interfaces in FIGS. 2A through 8 and in the accompanying description of the system for estimating wall area may also be included in the wall estimation report described herein.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

FIG. 10A is a first page of a non-limiting example of a wall estimate report, according to one non-limiting illustrated embodiment.

FIG. 10C is a third page of a non-limiting example of a wall estimate report, according to one non-limiting illustrated embodiment.

FIG. 10D is a fourth page of a non-limiting example of a wall estimate report, according to one non-limiting illustrated embodiment.

FIG. 10M is a thirteenth page of a non-limiting example of a wall estimate report, according to one non-limiting illustrated embodiment.

FIG. 10P is a sixteenth page of a non-limiting example of a wall estimate report, according to one non-limiting illustrated embodiment.

FIG. 11A is a first page of second non-limiting example of a wall estimate report, according to one non-limiting illustrated embodiment.

FIG. 11C is a third page of a second non-limiting example of a wall estimate report, according to one non-limiting illustrated embodiment.

FIG. 11D is a fourth page of a second non-limiting example of a wall estimate report, according to one non-limiting illustrated embodiment.

FIG. 11E is a fifth page of a second non-limiting example of a wall estimate report, according to one non-limiting illustrated embodiment.

FIG. 11H is an eighth page of a second non-limiting example of a wall estimate report, according to one non-limiting illustrated embodiment.

FIG. 11I is a ninth page of a second non-limiting example of a wall estimate report, according to one non-limiting illustrated embodiment.

FIG. 11J is a tenth page of a second non-limiting example of a wall estimate report, according to one non-limiting illustrated embodiment.

FIG. 11K is a eleventh page of a second non-limiting example of a wall estimate report, according to one non-limiting illustrated embodiment.

FIG. 11L is a twelfth page of a second non-limiting example of a wall estimate report, according to one non-limiting illustrated embodiment.

FIG. 11M is a thirteenth page of a second non-limiting example of a wall estimate report, according to one non-limiting illustrated embodiment.

FIG. 13 is a flow diagram showing an example method of including multiple line drawings of a building in a wall area measurement report wherein at least four of the multiple line drawings are elevation views of different sides of the building, according to one non-limiting illustrated embodiment.

FIG. 18 is a page from an example wall estimation report showing an elevation view of yet another side of the building with a line drawing of a different wall indicated as being at least partially blocked by an object in an image of the building or otherwise having an issue affecting the accuracy of the wall area estimation of the wall.

DETAILED DESCRIPTION

Figure 1A:
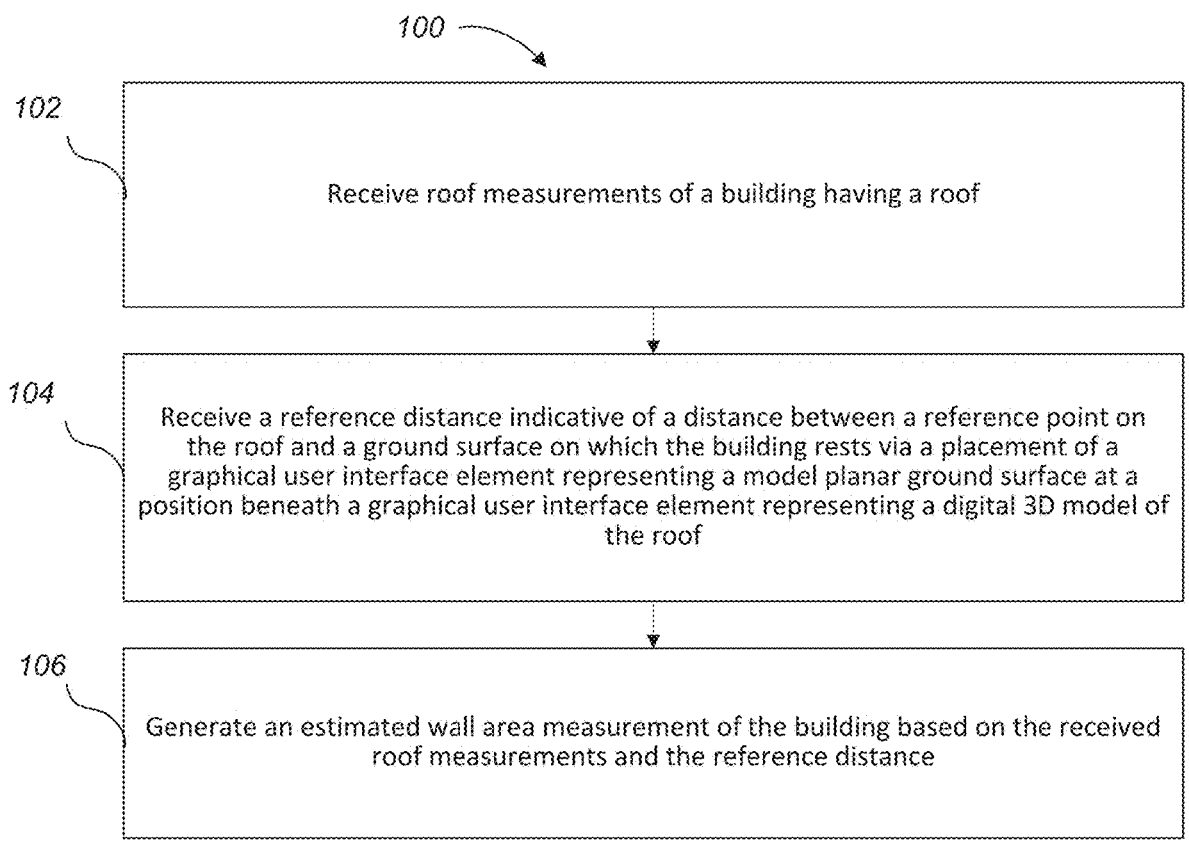
FIG. 1A is a flow diagram showing an example method of generating an estimated wall area measurement, according to one non-limiting illustrated embodiment.

FIG. 1A is a flow diagram showing an example method 100 of generating an estimated wall area measurement, according to one non-limiting illustrated embodiment.

While each of the steps shown in FIG. 1A contributes to the overall solution, each can be used independently or in various combinations to yield improvements in estimating wall area measurements as discussed below. Below is an overview of each step in the process, which will be followed by a more detailed discussion of each step.

At 102, the process receives roof measurements of a building having a roof. These measurements may be estimated or actual dimensional and/or area measurements of the roof such as one or more of: roof edge lengths, ridge lengths, gable lengths, hip lengths, valley lengths, roof section pitch, roof area measurements, planar roof section area measurements, planar roof section dimension measurements, etc. These roof measurements may be generated internally by a component of a system that estimates wall area measurements (i.e., a wall area measurement estimation system) and received from such an internal component, or may be generated and received from an external component or entity separate from the wall area measurement estimation system. In some embodiments, the external component is located remotely from the wall area measurement estimation system.

For example, in some embodiments, the wall area measurement estimation system may be a system integrated with a roof estimation system or other system that provides roof measurements. In other embodiments, the roof area measurements may be provided by an external source, system or entity, or may be input manually by an operator of the wall area measurement estimation system.

At 104, the process receives a reference distance. This reference distance is a measurement indicative of a distance between a reference point on the roof and a ground surface. In one embodiment, the reference distance is, or may initially be set at, a default value that corresponds to the height of an exterior wall of a typical single story building (namely, a default distance is used representing a distance between a point corresponding to approximately where an external wall meets the roof along or near a lower horizontal edge of a roof and a point on the ground or on a building foundation vertically beneath that point on the roof).

In one embodiment, this default value is the initial set value and as more data becomes available by actual measurements, it is changed to a new value and the calculations of wall area or done again.

In another embodiment, the reference distance is, or may initially be set at, a measurement indicative of a distance between a reference point on the roof and a surface on which the building rests, such as, the ground or a building foundation. The distance is determined via a placement of a graphical user interface element representing a model planar ground surface at a position beneath a graphical user interface element representing a digital three-dimensional model of the roof. For example, the reference distance is, or may initially be set at, a measurement indicative of a vertical distance between a reference point on the roof corresponding to where an exterior wall meets the roof and a model planar ground surface representing the ground or building foundation placed on an image of the building corresponding to where one or more of the exterior walls of the building appear to meet the ground or building foundation in the image. This reference distance may be used to determine how far down to extend the walls of the building from the roof to reach ground level when building a three-dimensional model of the building to aid in generating wall area measurements.

In particular, at 106 the process generates an estimated wall area measurement of the building based on the received roof measurements and the reference distance. The roof measurements may be generated by the roof estimation system described in one or more of: U.S. Pat. No. 8,078,436 issued Dec. 13, 2011, entitled "AERIAL ROOF ESTIMATION SYSTEMS AND METHODS" (hereinafter, referred to as the '436 patent); U.S. Pat. No. 8,209,152 filed May 15, 2009, entitled "CONCURRENT DISPLAY SYSTEMS AND METHODS FOR AERIAL ROOF ESTIMATION" (hereinafter, referred to as the '152 patent); U.S. patent application Ser. No. 13/019,228 filed Feb. 1, 2011 and entitled "GEOMETRIC CORRECTION OF ROUGH WIREFRAME MODELS DERIVED FROM PHOTOGRAPHS" (hereinafter, referred to as the '228 application); U.S. Provisional Patent Application Ser. No. 61/594,964, filed Feb. 3, 2012 and entitled "SYSTEMS AND METHODS FOR ESTIMATION OF BUILDING FLOOR AREA" (hereinafter, referred to as the '964 application); U.S. Provisional Patent Application Ser. No. 61/594,956, filed Feb. 3, 2012 and entitled "SYSTEMS AND METHODS FOR ESTIMATION OF BUILDING WALL AREA" (hereinafter, referred to as the '956 application); and U.S. patent application Ser. No. 13/757,712, filed Feb. 1, 2013 and entitled "SYSTEMS AND METHODS FOR ESTIMATION OF BUILDING FLOOR AREA" (referred to as the '712 application), which are each incorporated herein by reference in their entireties.

Additionally, it is expressly contemplated that any operable combination of one or more of any of the features or components of the estimation systems, measurement systems and/or reports described or shown in, but not limited to: the; the '436 patent; the '244 application; the '152 patent; the '228 application; the '964 application; the '956 application; and/or the '712 application; may be integrated and/or used with, or in, any operable combination of one or more of any of the features or components of the wall estimation systems and/or reports described or shown herein, and are operably included in various different embodiments.

In many such embodiments, one or more of the roof measurements are based on aerial photographs of the building via manual or automated analysis of roof features, such as by using the roof estimation system and/or other modules described in one or more of the; the '436 patent; the '244 application; the '152 patent; the '228 application; the '964 application; the '956 application; and/or the '712 application. Thus, utilizing some embodiments described herein, one may estimate wall area measurements of a building merely using one or more aerial photographs of the building, with little or no additional information initially needed.

Figure 1B:
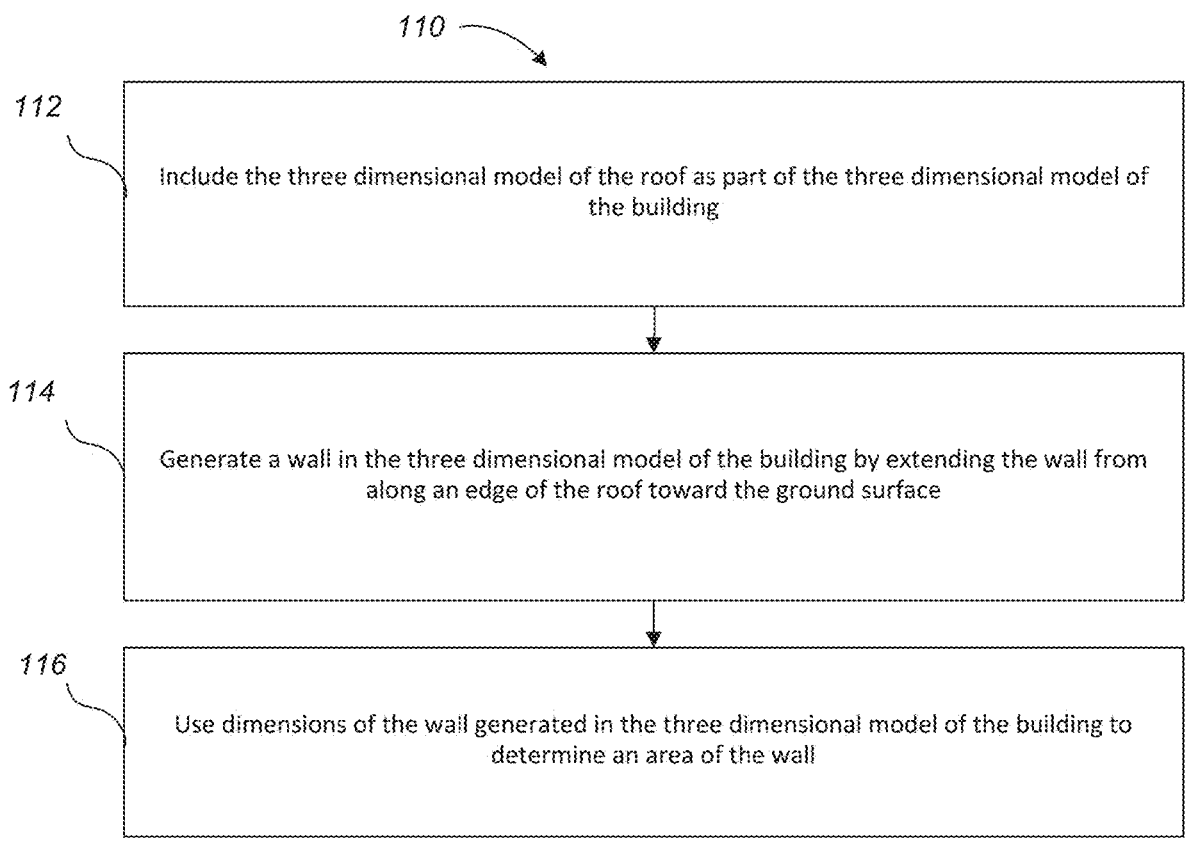
FIG. 1B is a flow diagram showing an example method that may be included as part of the step of generating the estimated wall measurement of the building in the method shown in FIG. 1A, according to one non-limiting illustrated embodiment.

FIG. 1B is a flow diagram showing an example method 110 that may be included as part of the step of generating the estimated wall measurement of the building in the method shown in FIG. 1A, according to one non-limiting illustrated embodiment.

While each of the steps shown in FIG. 1B contributes to the overall solution, each can be used independently or in various combinations to yield improvements in estimating wall area measurements as discussed below.

At 112, the process initially includes the three-dimensional model of the roof described above as part of a three-dimensional model of the building.

At 114, the process generates a wall in the three-dimensional model of the building by extending the wall from along an edge of the roof toward the ground surface. In particular, the wall area estimation system extends the wall a distance until either intersecting a level of the ground surface, according to the received measurement indicative of the distance between the reference point on the roof and the ground surface, or intersecting another surface of the roof, according to the three-dimensional model of the roof. In this manner, both the dimensions and shape of the wall may be built within the three-dimensional model of the building. For example, this may include a triangular shape of the wall underneath a roof gable, a section of the wall between two levels, planar surfaces or facets of the roof, etc. This process may be repeated for each exterior wall of the building to build a three-dimensional model of the building including, for example, a combined three-dimensional model of the roof and exterior walls of the building.

At 116, the process uses dimensions of the wall generated in the three-dimensional model of the building to determine area of the wall. This also may be repeated for each wall such that a total wall area for the entire building may be generated.

This three-dimensional model of the building may be rendered within a graphical user interface of the wall estimation system. The graphical user interface provides selectable user interface elements within the graphical user interface configured to be placed by a user or by an automated identification of image features on areas of walls of the building within the three-dimensional model. These graphical user interface elements represent areas missing from the wall such as doors or windows which are not to be included in the total wall area measurement. These graphical user interface elements may have dimensions corresponding to these areas missing from the wall and may also be adjustable by the user. The graphical user interface elements may also have initial dimensions corresponding to those of an expected window size or an expected door size (e.g., standard or typical window or door sizes). Once placed on the rendered three-dimensional model, the wall area measurements will be automatically adjusted accordingly, corresponding to the area associated with each respective element placed on three-dimensional model.

Figure 1C:
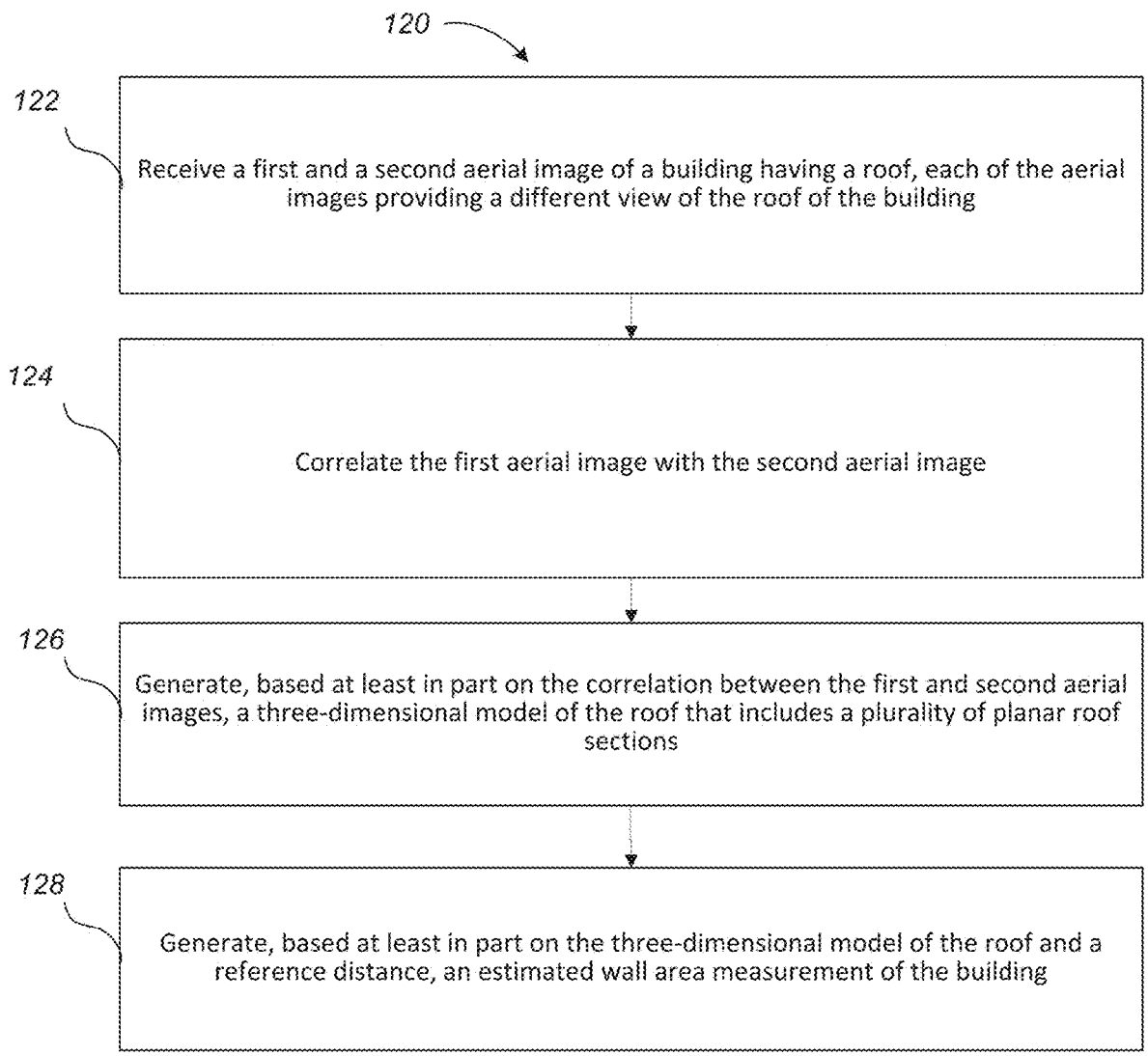
FIG. 1C is a flow diagram showing an example method of generating an estimated wall area measurement using a first and a second aerial image of the building, according to one non-limiting illustrated embodiment.

FIG. 1C is a flow diagram showing an example method 120 of generating an estimated wall area measurement using a first and a second aerial image of the building, according to one non-limiting illustrated embodiment.

At step 122 the process receives a first and a second aerial image of a building having a roof, each of the aerial images providing a different view of the roof of the building.

At 124, the process correlates the first aerial image with the second aerial image. This correlation process is described in one or more of the; the '436 patent; the '244 application; the '152 patent; the '228 application; the '964 application; the '956 application; and/or the '712 application. In some embodiments, correlating the aerial images may include registering pairs of points on the first and second aerial images, each pair of points corresponding to substantially the same point on the roof depicted in each of the images. Correlating the aerial images may be based at least in part on input received from a human operator and/or automatic image processing techniques.

For example, the process may identify a set of reference points in each of the images. The process then uses these reference points and any acceptable algorithm to co-register the images and reconstruct the three-dimensional geometry of the object (e.g., a building roof) identified by the reference points. There are a variety of photogrammetric algorithms that can be utilized to perform this reconstruction. One such algorithm which may be utilized by the process uses photographs taken from two or more view points to "triangulate" points of interest on the object in three-dimensional space. This triangulation can be visualized as a process of projecting a line originating from the location of the photograph's observation point that passes through a particular reference point in the image. The intersection of these projected lines from the set of observation points to a particular reference point identifies the location of that point in three-dimensional space. Repeating the process for all such reference points allows the software to build a three-dimensional model of the structure.

At 126 the process generates a three-dimensional model of the roof that includes a plurality of planar roof sections that each has a corresponding slope, area, and edges. This three-dimensional model of the roof is generated based at least in part on the correlation between the first and second aerial images, examples of which are also described in one or more of the; the '436 patent; the '244 application; the '152 patent; the '228 application; the '964 application; the '956 application; and/or the '712 application. For example, in some embodiments, generating the three-dimensional model may be based, at least in part, on indications of features of the roof, such as valleys, ridges, edges, planes, etc. Generating the three-dimensional model may also be based at least in part on input received from a human operator (e.g., indications of roof ridges and valleys) and/or automatic image processing techniques.

At 128 the process generates an estimated wall area measurement of the building. This estimated wall area measurement is generated based at least in part on the three-dimensional model of the roof and an assessment of the distance between a reference point on the roof and the ground surface. In some embodiments, this assessment may be unscaled (e.g., using pixel values). This assessment may be made subjectively and/or visually by the user looking at the line drawings and images presented by the system and providing corresponding input to the system, or it may be made by computationally driven algorithms of the system assessing wall-ground surface intersection. For example, this reference distance may be used by the wall area estimation system to determine how for down to extend the walls of the building (e.g., to a ground level or building foundation level) when building a three-dimensional model of the building, or alternatively, how far up to extend the walls of the building from a ground level or building foundation level to the roof model.

In some embodiments, the entire process, or nearly the entire process, of generating estimated wall areas is automated by the system automatically recognizing these particular building features and ground features in one or more images of the building through image analysis that utilizes typical characteristics of such features as viewed from the various angles of those in the one or more images.

FIGS. 2A through 8 show example screen shots of a graphical user interface of the system for generating wall area measurements at various points in the process of building the three-dimensional model of the building and generating the wall measurements (e.g., as described above with reference to FIGS. 1A-1C).

Figure 2A:
FIG. 2A is an example screenshot of a user interface of a system for generating wall area measurements showing a three-dimensional model of the roof, according to one non-limiting illustrated embodiment.

FIG. 2A is an example screenshot 200 of a user interface of a system for generating wall area measurements showing a three-dimensional model of the roof 210, according to one non-limiting illustrated embodiment.

Shown is a graphical user interface including two panels. The right panel 204 is displaying aerial image of a building showing a top oblique view 206 of the building and the left panel 202 is displaying an interactive three-dimensional model of the roof 210 of the building. Also note that the three-dimensional model of the roof 210 is overlaid on the roof of the building shown in the aerial image 206 on the right panel 204 in accordance with the particular angle of the top oblique view 206 of the building. This roof model may also be an interactive model that can be moved, rotated, adjusted or otherwise manipulated in various manners by the user via a mouse, touch screen or other input device such that it is overlaid on the roof of the building shown in the image 206 in a position and angle of view corresponding to the position and angle of view of the roof shown in the image 206. In one embodiment, the interactive three-dimensional model of the roof 210 is rendered in the position on the image 206 overlaid on the roof of the building as shown in the image 206 in response to a user selecting the "create upper" button 214 shown in the screenshot 200.

The three-dimensional model of the roof 210 shown in FIG. 2A may be used in the part of the process 100 shown in FIG. 1A which receives roof measurements of the building. For example, the roof measurements of the building referenced in process 100 may be those defined by the three-dimensional model of the roof 210. Also, the three-dimensional model of the roof 210 is an example of a three-dimensional model of a roof which may be included as part of the three-dimensional model of the building described above in process 110 of FIG. 1B.

Figure 2B:
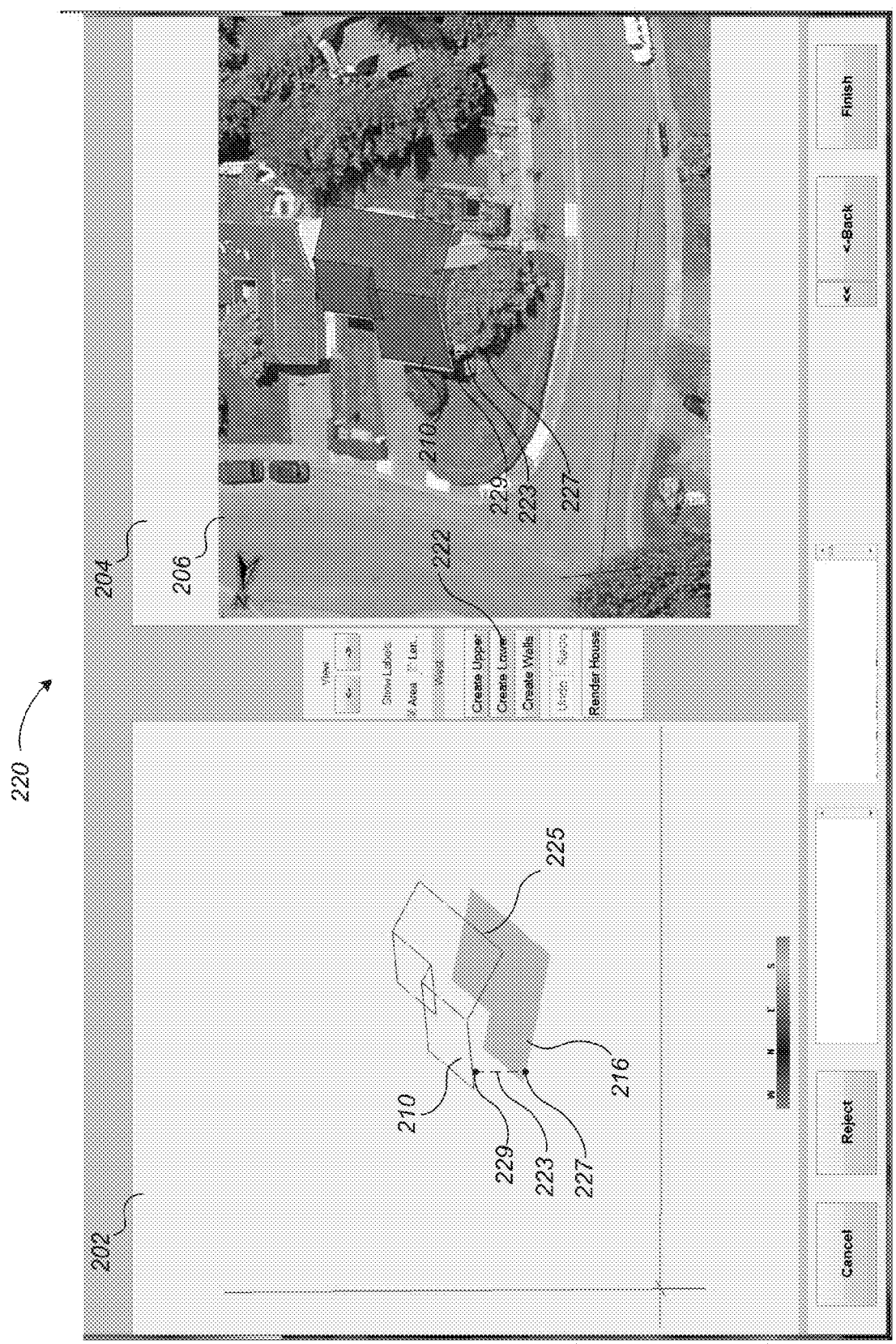
FIGS. 2B and 2C are example screenshots of the user interface of the system used in FIG. 2A for generating wall area measurements, each showing an example model planar surface of the ground or foundation, respectively, for two different example buildings.
Figure 2C:
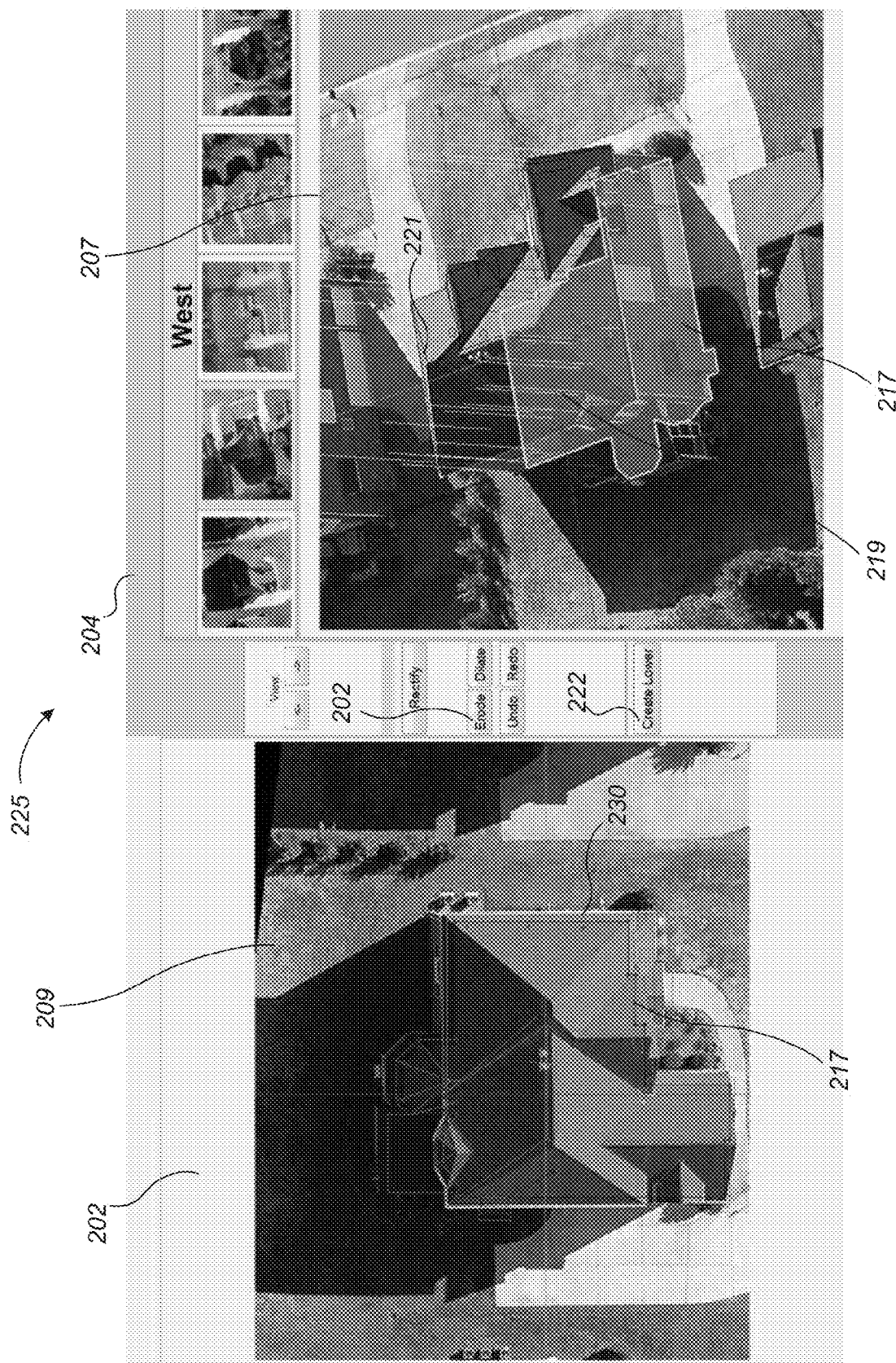

FIGS. 2B and 2C are example screenshots 220 and 225, respectively, of the user interface of the system of FIG. 2A for generating wall area measurements, each showing an example model planar surface of the ground or foundation, respectively, for two different example buildings. Shown in FIG. 2B is a model planar ground surface 216 in the shape a footprint of the building shown in image 206. In FIG. 2B, the example model planar ground surface 216 is rendered under a three-dimensional model of the roof 210 of the building shown in image 206 and, in FIG. 2C, an example model planar ground surface 217 in the shape of the footprint of a different example building is overlaid on the different example building shown in image 207.

In some embodiments, the estimation of the model planar ground surface 217 need not be planar. The ground could just as well be modeled by a more complex surface. Also, in some embodiments, computation and placement of the ground can be done in automated fashion and not done by "user placement". For example, the system described herein may determine the ground surface (not necessarily planar) and the placement of the ground relative to the roof, e.g., automatic or system-assisted determination of the eave to ground distance. This could also be done with methods for roof estimation during the registration process of registering corresponding or matching points on two different images of the roof, if ground points (as well as the roof points) participate in the registration and are then subsequently fit to a surface to estimate a surface model of the ground. These alternative methods also do not necessarily require visibility of the house-to-ground intersection. If the ground (plane or complex surface) is determined near to the house, the resulting ground surface can be extended (extrapolated or interpolated from surrounding areas determined to be ground level) by the system under the structure even if the base of the structure is covered with bushes or otherwise obscured such that it would prevent a direct visible assessment by the user.

The screenshot 220 of FIG. 2B shows a user interface that may be displayed as part of the process 100 shown in FIG. 1A. For example the process may receive a measurement indicative of a distance between a reference point on a roof represented by the three-dimensional model of the roof 210 and the ground. As used herein, "ground" generally means any surface on which a building may rest (including a building foundation, platform, other substantially horizontal and/or flat surface or structure on which the building rests, etc.). In some embodiments, the assessment indicative of a distance between a reference point on the roof and the ground may be a distance corresponding to a default value of the typical wall height of a single story building.

Also, In some embodiments, this assessment may be received initially as user input or a default value corresponding to an estimated or approximate vertical distance between a point at or near a lower horizontal edge of the roof 210 (e.g., a roof eave) and the surface on which the building rests or appears to rest (e.g., the ground or building foundation) which, in some embodiments, may approximately correspond to the typical wall height of a single story building. For example, a typical wall height of a single story building may be 8 ft. to 8.5 ft, and thus, an example of the default value of the measurement indicative of a distance between a reference point on the roof 210 and the ground will correspond to a value in this range representing the typical wall height of a single story building. However, this default value may vary in different embodiments and may also be selectable and/or configurable by the user (e.g., to be a default value corresponding to the typical height of a two story building or other value).

In some embodiments, a user may indicate a reference point on the ground in the image 206 shown in the right panel 204 (e.g., by a mouse click or other selection) to provide this assessment. For example, the reference point may be at a point on image 206 selected by the user corresponding to a location where the building wall would appear or is visually estimated to meet the ground, represented by point 227. Although the oblique angle of view of the three-dimensional model of the roof 210 shown overlaid on image 206 is different than the angle of view of the of the line drawing of the three-dimensional model of the roof 210 shown in panel 202, these views may be selected to match. In some embodiments these views may be selectively locked such that, when selected to do so, the angle of view of the of the three-dimensional model of the roof 210 shown overlaid on the image 206 is always the same as the angle of view of the of the line drawing of the three-dimensional model of the roof 210 shown in panel 202 until there is no longer a selection to do so.

Using reference point 227, the system will calculate the distance represented by dashed line 223 from the selected reference point 227 on the ground to the point 229 above the ground on the roof, on the three-dimensional model of the roof 210. This will be a point vertically above the ground within the three-dimensional reference framework of the three-dimensional model of the roof 210, according to how three-dimensional model of the roof 210 as it is overlaid on the image 206. For example, point 227 represents to the system a point where the ground meets the building wall that is potentially visible according to the angle of view of the three-dimensional model of the roof 210 as overlaid on the image 206.

According to the position and angle of view of the three-dimensional model of the roof 210 as overlaid on the image 206, the system then calculates the vertical distance 223 from point 227 to a planar surface or edge, point 229, of the three-dimensional model of the roof 210 directly above point 227 within the three-dimensional reference framework of the three-dimensional model of the roof 210. As a result of the registration process, projections of lines in the model space representing changes in height in physical units (e.g. vertical with respect to the earth) can be projected at the correct pixel length within the image. Likewise, the reverse coordinate transformation is available—pixel distances between pixels in the image can be transformed back to model space coordinates to assess height in physical units. The received assessment of distance 223 is therefore indicative of a distance between a reference point on the roof and a reference point on the ground that will be used as the starting point for the calculated distance of the wall height.

The selection of this reference point 227 on the ground may additionally or alternatively be performed by automated image analysis detecting the transition between a wall of the building and the ground in one or more perspective or oblique images of the of the building. For example, this detection of transitions between the wall of the building and the ground may be performed at locations or sections of the image vertically under a roof eave or gable potentially visible according to the position and angle of view of the three-dimensional model of the roof 210 as overlaid on the image 206 to facilitate or aid in the selection a reference point on the ground.

The determination of the wall height can be performed at any location from any side where the ground is visible in the photographic image of the roof. For example, it can be done from each of the north, south, east and west views. Since the ground might slope from one side of the home to the other side, a measurement of each side is the most accurate. Alternatively, if the one side of the house does not provide a clear view of the ground where the wall of the home meets the ground, as might be the case if a deck, trees, bushes or other obstruction is present, the software program can use the height measurement to the next adjacent wall with which it forms a corner as the height value of the wall. As a further alternative, if one wall is measured, this one measurement can be accepted as being the same for all walls unless the operator indicates that some walls are of a different height.

An approximation of the ground surface may alternatively be determined using a plurality of views whose ground features were correlated during the registration process. These ground points can be connected into a mesh or fit to a smoothed mathematical function such as a polynomial surface. With both the ground surface and the roof model expressed in model space coordinates, assessment of roof to ground distance is achieved by the respective z coordinates resulting from an intersecting of vertical line with the roof and ground surface models.

Some homes built on a slope will have a one-story front wall and a two-story back wall and the side walls will gradually increase in height from the front to the back. Of those types of homes, the front wall height is measured or estimated, the back wall height is measured or estimated, and then the height of each side wall is set to be that of the front wall at its front corner and that of the back wall at its back corner, and to increase in a linear measure between the two.

'Create lower' creates the floor or 'foundation' onto which the walls are attached. When on flat ground, this is coincident with the ground surface model. However, for buildings with walk-out there may be more than one floor plane at different elevations. The edge of some or all of each of these floor planes may coincide with where the building intersects the ground surface model. However, in the case of a partial basement, the plane of the floor model may be below the grade of ground surface model representing the terrain around the structure. In which case, there will be exterior wall area not visible from the ground whose area may not be included in the wall diagrams (similar to soffits) as it represents wall that is not covered wall covering materials.

In the present example embodiment, however, ground surface model is not used in this capacity. Rather, the elevation of the foundation is evaluated and adjusted in the user interface to become coincident with at least one wall-ground intersection within at least one image. The base of the resulting wall facets can be adjusted into a curve following the wall-ground intersection observed in the images. In that way the underground portion of the exterior In response to the user selecting the "create lower" button 222 shown on screenshot 220, the wall area estimation system will render the model planar surface of the ground 216 (e.g., as the shape of the building footprint) in the corresponding area underneath the three-dimensional model of the roof 210 in panel 202 at some distance below the three-dimensional model of the roof 210. Shown in panel 202 on the left of the user interface in screenshot 220, the planar surface of the ground 216 is automatically rendered to scale as the shape of the building footprint and is rendered such that it is shown from the same angle of view as that of the line drawing of the three-dimensional model of the roof 210 shown in the panel 202. The shape of the building footprint may be determined initially by the system as the shape of the outside perimeter of a top down view of the three-dimensional model of the roof 210, for example, the top down view of the three-dimensional model 224 in panel 202 in FIG. 6, or by existing known building measurements. The planar surface of the ground 216 having the shape of the building footprint is rendered such that the corners of the planar surface of the ground 216 forming the shape of the building footprint initially line up vertically beneath the corresponding corners of the perimeter of the three-dimensional model of the roof 210 within the three-dimensional reference framework of the three-dimensional model of the roof 210.

In the example embodiment shown in FIG. 2B, the planar surface of the ground 216 in the shape of the building footprint is rendered in the left panel 202 of the user interface in screenshot 220 at a distance under the roof 210 equal to or based on the received measurement indicative of the distance between the reference point 229 on the roof and the ground, point 227, as described above. In some embodiments, the measurement indicative of the distance between the reference point on the roof and the ground may be arbitrary default value or may be based on other characteristics of the image 206 and/or the three-dimensional model of the roof 210 overlaid on the image 206. Thus, in some embodiments, the distance below the three-dimensional model of the roof 210 at which the planar surface of the ground 216 is initially rendered may be arbitrary default value or may be based on other characteristics of the image 206 and/or the three-dimensional model of the roof 210 overlaid on the image 206.

In addition to the planar surface of the ground 216 in the shape of the building footprint being rendered in the left panel 202 of the user interface in screenshot 220, it is also overlaid at a corresponding position on the image of the building 206 such that it is shown from the same angle of view as the view of the building shown in the image 206. In FIG. 2B, the planar surface of the ground 216 is not shown overlaid on the example image 206 in FIG. 2B because it would be somewhat obscured by the example red-colored translucent three-dimensional model of the roof 210 that is also overlaid on image 206. However, FIG. 2C shows an example of a different building for which a planar surface of the ground 217 having the shape of the building footprint is overlaid on an image 207 of the building. In FIG. 2C, the planar surface of the ground 217 having the shape of the building footprint is overlaid on the image 207 of the building below a three-dimensional model of the roof 221 of that building that is also overlaid on the image 207, but which is has transparent roof sections such that the overlaid planar surface of the ground 217 having the shape of the building footprint it is not obscured by the overlaid three-dimensional model of the roof 221. In particular, the planar surface of the ground 217 in FIG. 2C, having the shape of the building footprint, is automatically overlaid on the image 207 such that it is shown from the same angle of view of the example building as shown in image 207.

The planar surface of the ground 216 is adjustable user interface control such that the user may change the location, size and/or orientation of the planar surface of the ground 216 relative to the three-dimensional model of the roof 210 to match that of the ground relative to the roof of the building in the image 206 showing an oblique view of the building. Likewise, the same adjustable user interface control functionality described above applies to the planar surface of the ground 217 shown overlaid on the image 207 of the example building of FIG. 2C with respect to the to the three-dimensional model of the roof 221 of that building overlaid on the image 207 of that building.

The user may move, manipulate, correct and/or rotate the line drawing of the three-dimensional model of the roof 210 and planar surface of the ground 216, or a portion thereof (e.g., individual line segments), shown in user interface panel 202 together or individually using a mouse, touch screen, or other input device. Similarly, the user may move, manipulate and/or rotate the line drawing of the three-dimensional model of the roof 210 overlaid on the image of the roof 206 shown in panel 204 and a planar surface of the ground 216 which may also be overlaid on image 206 or in image 207 of FIG. 2C, or a portion thereof, together or individually using a mouse, touch screen, or other input device. Accordingly, when such movement, manipulation, correction and/or rotation occurs to the three-dimensional model of the roof 210 and/or planar surface of the ground 216 shown on one user interface panel 202, an equivalent corresponding movement, manipulation, correction and/or rotation occurs to the three-dimensional model of the roof 210 and/or planar surface of the ground 216 shown in the other user interface panel 204. These equivalent corresponding movements, manipulations, corrections and/or rotations occur substantially simultaneously. However, in other embodiments, these equivalent corresponding movements, manipulations, corrections and/or rotations may occur substantially concurrently, soon after a corresponding equivalent action, or subsequent to a corresponding equivalent action.

For example, if the user moves the line drawing of the three-dimensional model of the roof 210 within the user interface panel 202, a corresponding movement to the line drawing of the three-dimensional model of the roof 210 overlaid on the image 206 will occur as carried out by the software. Likewise, if the user moves the planar surface of the ground 216 within the user interface panel 202, a corresponding movement to a planar surface of the ground 216 overlaid on the image 206 will occur, not shown in FIG. 2B, but see, e.g., the planar surface of the ground 217 overlaid on the corresponding image 207 in the example shown in FIG. 2C. Also, in some alternative embodiments, there may be an option selectable by the user to lock together the line drawing of the three-dimensional model of the roof 210 and the planar surface of the ground 216 having the shape of the building footprint underneath it, such that movement by the user of one causes the movement of the other, either within in the same panel or both panels, for example, in both user interface panels 202 and 204.

The surfaces defined by the line drawing of the three-dimensional model of the roof 210 may be transparent, as shown in panel 202, a solid color or may be a translucent color as shown on image 206 in user interface panel 204 to draw attention to the line drawing of the three-dimensional model of the roof 210 or differentiate the line drawing of the three-dimensional model of the roof 210 from other features or objects in the image 206 or other objects. Likewise, the planar surface of the ground 216, which may be overlaid on the image 206 (see, e.g., planar surface of the ground 217 overlaid on image 207 in FIG. 2C) may be transparent, a solid color or may be a translucent color as shown in user interface panel 202 (see also, e.g., planar ground surface 217 in image 207 in FIG. 2C). This coloring may be to draw attention to or differentiate the planar surface of the ground 216 from other features or objects in the image 206 or other objects. Also, the surfaces defined by line drawing of the three-dimensional model of the roof 210 and the planar surface of the ground 216 may be differently highlighted, differently colored, or otherwise differently marked with respect to each other to differentiate those objects from themselves or other objects.

As additional example, FIG. 2C, as explained above, is an example screenshot 225 of the user interface of the system of FIG. 2A for generating wall area measurements showing a planar ground surface 217 overlaid on an image 207 of an oblique view of a different example building. In the example shown in FIG. 2C, in response to the user selecting the "create lower" button 222 shown on screenshot 225, the wall area estimation system renders the planar surface of the ground 217 having the shape of and representing the footprint of the building such that the planar surface of the ground 217 is overlaid in the corresponding area vertically under the model of the roof 221 of the building on the image 207. For example, this may be according to the default value corresponding to the wall height of a typical one story house or building, which height might be 8 feet, 9 feet, 10 feet, or another value. The planar ground surface 217 overlaid on an image 207 may then be adjusted by the user by the system enabling the user to drag the planar surface of the ground 217 within the image 207 using a mouse or other input device to area on the image 207 corresponding to where the walls of the building in the image intersect the ground or building foundation shown in image 207 of the building.

Namely, as shown in FIG. 2C, a default value is assessed as a starting point for the height of the wall and, thus, used for a first rendering of the house. The created image is then overlaid on one or more photographic images to determine if it matches and adjustments made, if needed, to have the created image more accurately match the photographic image.

In one embodiment, the planar surface of the ground 217 representing the footprint of the building is visually slidable only along a vertical axis represented by parallel vertical lines 219 with respect to a three-dimensional model of the roof 221 having a corresponding angle of view to the oblique view of the building shown in the image 207. In this way, the user is able to adjust the vertical position of the planar surface of the ground 217 representing the footprint of the building under the transparent three-dimensional model of the roof 221 of the building while keeping the corners of the planar surface 217 representing the building footprint in line with the corresponding corners of the three-dimensional model of the roof 221. In some embodiments, the planar surface of the ground 217 representing the footprint of the building is selectively movable in any direction and the user may then selectively lock movement of the planar surface of the ground 217 representing the footprint of the building to restrict movement to be along a vertical axis, a perpendicular horizontal axis, or any other axis with respect to a three-dimensional model of the roof 221 overlaid on the image 207. Also, the plane 217 representing the footprint may be adjusted relative to the three-dimensional model of the roof 221 of the building without the three-dimensional model of the roof 221 of the building also actually being visually overlaid on any image of the building.

For split level homes, the planar surface of the ground 217 having the overall shape of the building footprint may be split into two or more sections at positions or lines indicated by the user which each have different vertical (i.e., elevation) positions with the three-dimensional reference framework of the three-dimensional model of the roof 221 as overlaid on image 221. These vertical positions may be defined by the user being able to move two or more sections of the planar surfaces 216 individually along vertical positions within the three-dimensional reference framework of the three-dimensional model of the roof 221, namely, along the vertical axis represented by a group of the parallel vertical lines 219). Each split section of the planar surface of the ground 217 may also be individually moved, manipulated, corrected and/or rotated within the three-dimensional reference framework defined by the position of the three-dimensional model of the roof 221 as overlaid on image 221.

As can be seen in FIG. 2B, reference point 229 on the roof is selected to be where the wall meets the roof and not at the edge of the roof. Thus, the length of the eave and the slope of the roof will not be a factor that might cause an error in the wall height measurement.

Referring again to FIG. 2C, as roofs of buildings often overhang the exterior walls of the building, such as at roof eaves, at other portions of the roof meeting building walls, etc., the location of the walls of the building may define an actual building foundation footprint having an area and shape that is smaller and/or different than that of the building footprint initially represented by the shape of the planar polygon surface whose boundary is defined the extent of the footprint of the building's roof outline as viewed from a nadir (overhead) viewpoint 217. If the overhang amount of the eaves can be easily determined (such in the case of box-like commercial building lacking eaves), or assigned a default value based on typical construction practices in the area the initial floor footprint and wall location might be based on a top plan view, without the need to visualize the offset of the foundation from the eaves. This is due to the planar surface of the ground 217 having the shape of the building footprint being initially based on the outline of the three-dimensional model of the roof 221 roof as shown from a top plan view, also shown in image 209 in FIG. 2C of the three-dimensional model of the roof 221. Thus, one embodiment "erodes" the planar surface of the foundation 217 having the shape of the building footprint by displacing line segments defining the boundary of the footprint foundation 217 away from the roof edges to account for the area under the overhanging eaves that is not part of the foundation footprint The adjusted line segments then may provide a more accurate indication of the actual position of the exterior walls of the building and the actual footprint of the building defined by the nadir (overhead) roof profile.

This reduction in the size of the plane 217 having the shape of the building footprint may be performed using automated algorithmic methods prior to the footprint 217 being rendered or otherwise overlaid on the image 207 such that the boundary of the footprint 217 having the shape of the building footprint can be more accurately assessed with the actual locations of the exterior walls of the building on the ground shown in the image 207.

For example, shown in image 209 on panel 202 is a planar surface 217 having the shape of the building footprint overlaid on the image 217 showing a top plan, namely orthogonal, view of the building. As shown on image 209, the planar surface 217 having the shape of the building footprint has been reduced. To do this, boundary of the footprint has been eroded inward to account for the sections of the roof which overhang the exterior walls. The user may adjust the length and position of line segments of the polygon bounding the footprint 217 having the shape of the building footprint using an input device (mouse, touch screen, etc.) of the system based on a best estimate or also based on an identification of where such overhangs may be viewable in images of the roof of the same building, image 209 and/or image 207. This adjustment can be seen by comparing the blue line 217 that represents the building footprint or the ground with the roof edge 230 in FIG. 2C. Additionally or alternatively, the system may perform the adjustment of the planar surface 217 having the shape of the building footprint according to a default value corresponding to typical lengths that roofs overhang exterior walls (e.g., by 1.5 feet) and the number and length of roof features identified by the computer software, and/or by the user in the three-dimensional model of the roof 221 which are known to typically overhang an exterior wall for example, along roof edge 230, edges of the roof of the building shown in image 207 and 209 identified as roof eaves, etc. Alternatively, image processing methods assessing the ground surface and any identified features indicating wall-ground intersection point may automatically erode and position the foundation footprint without further user involvement.

In many embodiments, the reduction in the size of the line segments defining the planar surface of the ground 217 having the shape of the building footprint may be additionally and/or selectively performed at any point in the process described herein before exterior walls are added in generating a three-dimensional model of the building. For example, in one embodiment, when the user clicks the "create lower" button the initial non-reduced version of foundation footprint 217 may be overlaid on corresponding areas of the building in oblique image 207 and/orthogonal image 209 as described above. If need be, the user first reduces the foundation footprint 217 by causing the system to perform adjustment based on default or values input by the user and clicking the "erode" button 203.

Additionally or alternatively, the system adjusts the foundation footprint 217 on either or both of the images 207 and 209, namely, adjusts the boundary of the footprint polygon(s) to account for the sections of the roof which overhang the exterior walls based on user input generated by the user using an input device to indicate to the system how much to reduce the line segments of the foundation footprint 217 having the shape of the building footprint. For example, this may be by the user clicking and dragging various boundary line segments or corners of foundation footprint 217 overlaid on the image 209 and/or the image 207. In many embodiments, the reduction or erosion of the shape of the building footprint may be additionally and/or selectively performed at any point in the process described herein in generating wall measurements.

Figure 2D:
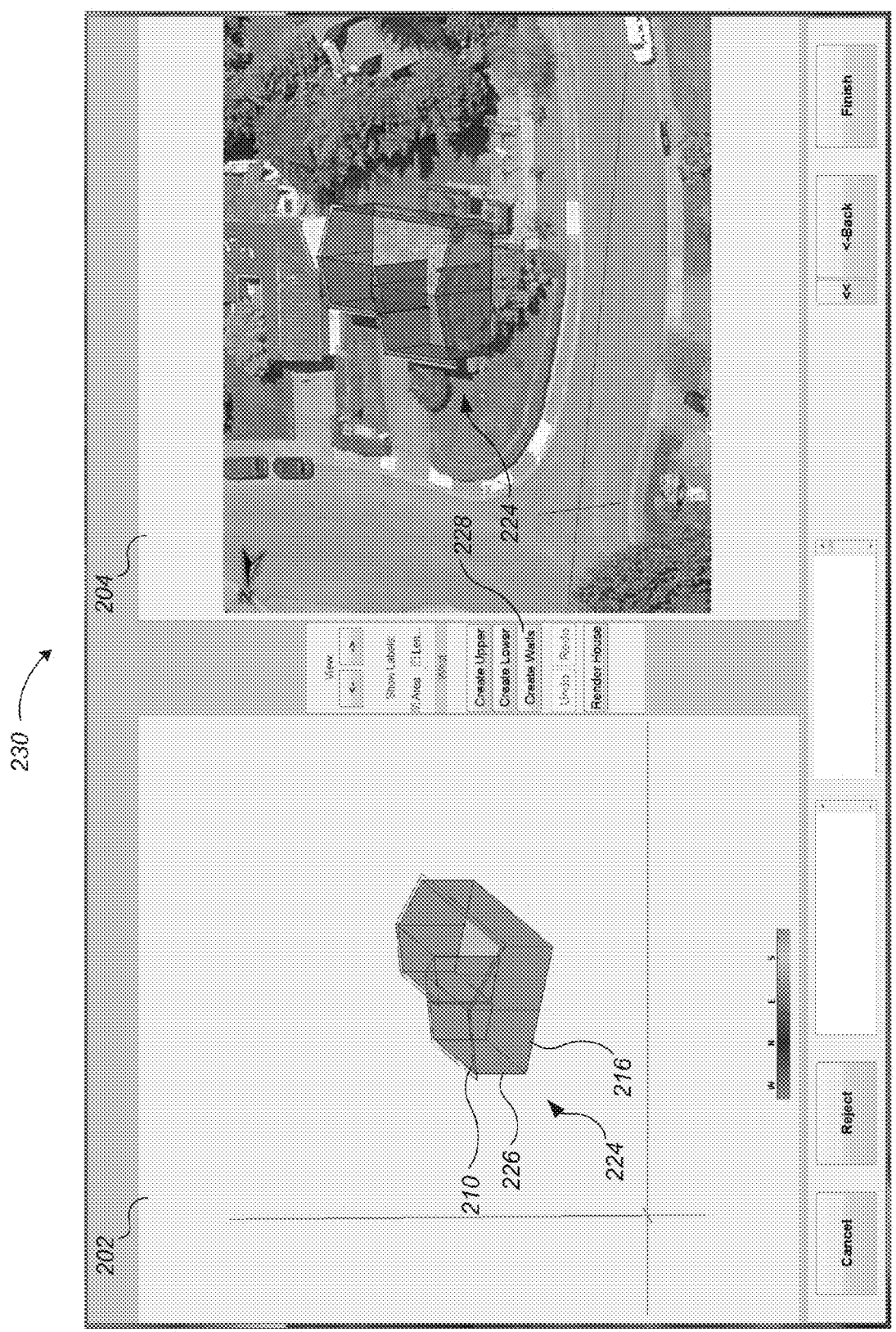
FIG. 2D is an example screenshot of the user interface of the system used in FIG. 2A for generating wall area measurements showing a three-dimensional model of the building generated using the three-dimensional model of the roof shown in FIG. 2B and a placement of the planar surface of the ground or foundation under the roof, according to one non-limiting illustrated embodiment.

FIG. 2D is an example screenshot 230 of the user interface of the system of FIG. 2A for generating wall area measurements showing a three-dimensional model of the building 224 generated using the three-dimensional model of the roof 210 and the planar surface of the ground 216 under the roof shown in FIG. 2B, according to one non-limiting illustrated embodiment.

For example, the screenshot 200 may be displayed as a first part of the process 110 shown in FIG. 1B in which the process generates a wall 226 in the three-dimensional model of the building 224 by extending the wall from along a corresponding edge of the roof 210 toward the planar surface of the ground 216 according to where the planar surface of the ground 216 is positioned by the system and/or by the user below the three-dimensional model of the roof 210 as described above.

Figure 5:
FIG. 5 is an example screenshot of the user interface of the system used in FIG. 2A for generating wall area measurements showing a west side perspective view of the three-dimensional model of the building of FIG. 2D overlaid on an image of the building on the right side and a west side elevational view on the left, according to one non-limiting illustrated embodiment.

In one embodiment screen shot 230 is created in response to a user selecting the "create walls" button 228, the wall area estimation system extends the wall 226 of the three-dimensional model of the building 224 a distance from an edge of the roof until either intersecting planar surface of the ground 216 or intersecting another surface of the roof, according to the three-dimensional model of the roof 210. Since the exact roof shape is provided as a known value at the start of the process, variations of the intersection of the upper boundary of the wall a with sloped roof contours will be taken into account when the model of the wall is created for multi-level structures, the upper and lower boundaries of portions of walls may defined by the intersection of roof sections that are layered in elevation. Likewise, if a complex ground surface model is provided as a known at the start of the process, variations along the intersection of the wall model with the ground surface model will be taken into account to delineate the above-ground portions of a wall from below grade portions of the wall. In this manner, both the dimensions and shape of the wall may be built within the three-dimensional model of the building 224. These may include, for example, a triangular shape of the wall 226 underneath a roof gable as shown in the three-dimensional model of the roof 210, or (as shown in FIG. 5) a section of a wall 502 between an upper planar section 506 of the roof and a different lower planar section 504 of the roof.

This process may be repeated for each exterior wall of the building by repeating the process for each edge of the roof based on that each edge of the roof potentially rests on top of or overhangs at least a portion of an exterior wall at locations on the roof directly above the line segments of the planar surface of the ground 216 having the shape of the building footprint to generate the three-dimensional model of the building 224. Additionally or alternatively, since each line segment of the planar surface of the ground 216 having the shape of the building footprint corresponds to a potential location of at least one exterior wall, the system may generate the walls in the three-dimensional model of the building based on inserting vertical planar surfaces, representing the exterior walls, filling in spaces between the line segments of the planar surface of the ground 216 having the shape of the building footprint and the three-dimensional model of the roof 210.

Once the three-dimensional model of the building 224 is generated, wall area calculations are performed by the system based on the size and shape of the walls of the building in the model 224. These wall area measurements may be displayed on the graphical user interface, such as on corresponding areas of the walls in three-dimensional model of the building 224, or anywhere else within the user interface. Also, the three-dimensional model of the building 224 may be rotated and viewed from any angle. For example, this angle may correspond to the angle of view in the aerial image displayed on the right panel 204 of the graphical user interface, such as shown in FIG. 3.

Figure 3:
FIG. 3 is an example screenshot of the user interface of the system used in FIG. 2A for generating wall area measurements showing a north side perspective view of the three-dimensional model of the building of FIG. 2D overlaid on an image of the building, according to one non-limiting illustrated embodiment.

In particular, FIG. 3 is an example screenshot 300 of the user interface of the system of FIG. 2A for generating wall area measurements showing a north side perspective view of the three-dimensional model of the building 224 on panel 204 and, optionally, panel 202, according to one non-limiting illustrated embodiment. Note, however, the compass indicator 303 on panel 202 indicates the direction the viewer is facing according to the angle of view of the three-dimensional model of the building 224 shown in panel 202, whereas the building face indicator 305, indicates generally the direction the face of the building largely shown in the image in panel 204 is facing. The building face indicator 305, indicates generally the direction the face of the building largely shown in the image in panel 204 is facing according to the angle of view of the building shown in shown in panel 204 and/or the angle of view of the three-dimensional model of the building 224 as overlaid on the building in the image shown in panel 204. Various other views from different angles and sides (e.g., south, east and west views; plan, elevation and side views, etc.) may also be rendered and displayed in the left panel 202 and the corresponding right panel 204 which may or may not include the corresponding image of the building.

Figure 4:
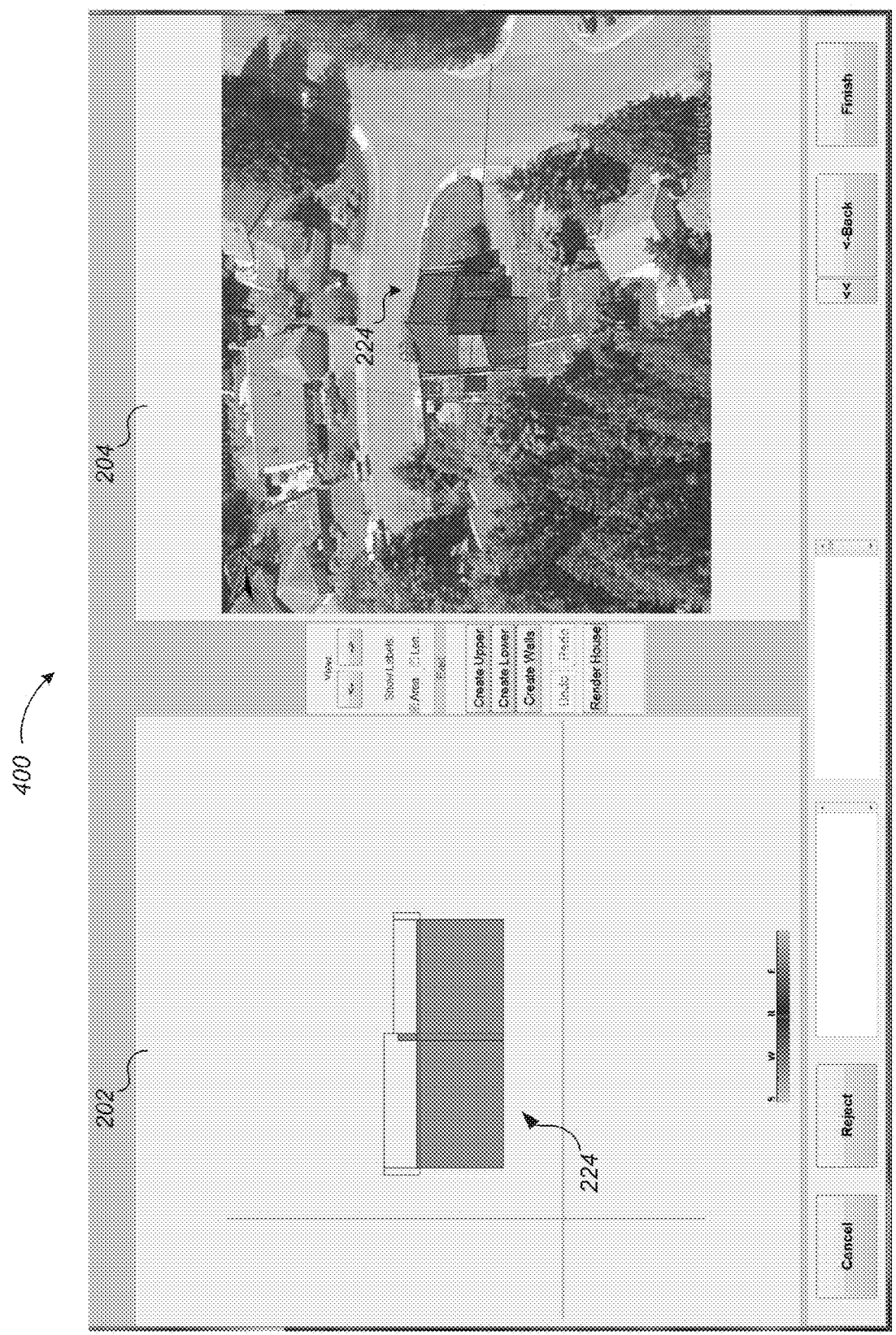
FIG. 4 is an example screenshot of the user interface of the system used in FIG. 2A for generating wall area measurements showing an east side perspective view of the three-dimensional model of the building of FIG. 2D overlaid on an image of the building on the right side of the image and a north side elevational view on the left side, according to one non-limiting illustrated embodiment.
Figure 6:
FIG. 6 is an example screenshot of the user interface of the system used in FIG. 2A for generating wall area measurements showing a top plan view of the three-dimensional model of the building of FIG. 2D on the left and an east side perspective view on the right, according to one non-limiting illustrated embodiment.

As shown in FIG. 4 though FIG. 6, the view of the three-dimensional model of the building 224 may, optionally, be different in panel 202 and panel 204 and selectable by the user by rotating the respective three-dimensional model of the building 224 in the respective panel 202 or panel 204. For example, FIG. 4 is an example screenshot 400 of the user interface of the system of FIG. 2A showing an east side perspective view of the three-dimensional model of the building 224 in the image on panel 204 and a south side elevation view of the three-dimensional model of the building 224 on panel 202. FIG. 5 is an example screenshot 500 of the user interface of the system of FIG. 2A showing a west side perspective view of the three-dimensional model of the building 224 in the image on panel 204 and a west side elevation view of the three-dimensional model of the building 224 on panel 202. Note the lower section of the roof 504 and wall section 502 between the lower section of the roof 504 and the upper section of the roof 506 on the west facing side of the building are visible because, in the example embodiment shown, the building walls of the three-dimensional model of the building 224 on panel 202 are transparent or translucent.

FIG. 6 is an example screenshot 600 of the user interface of the system of FIG. 2A showing a top plan view of the three-dimensional model of the building 224 on panel 202 and an east side perspective view of the three-dimensional model of the building 224 in the image on panel 204. The three-dimensional model of the building 224 shown in FIG. 2D though FIG. 7 can be manipulated by the user or automatically by the system in various manners to effect changes to the model, which result in automatic corresponding changes to the wall area measurements based on the walls of the generated building model 224.

Figure 7:
FIG. 7 is an example screenshot of the user interface of the system used in FIG. 2A for generating wall area measurements showing selection of a building wall of the three-dimensional model of the building of FIG. 2D, according to one non-limiting illustrated embodiment.

For example, FIG. 7 is a screenshot 700 of the user interface of the system of FIG. 2A for generating wall area measurements showing selection of a building wall 226 of the three-dimensional model of the building 224, according to one non-limiting illustrated embodiment. As shown in FIG. 7, the user has moved the cross hair cursor 203 to select the wall 226 of the three-dimensional model of the building 224. Note the selected wall is highlighted in panel 202 as shown in FIG. 7.

Figure 8A:
FIG. 8A is an example screenshot of the user interface of the system used in FIG. 2A for generating wall area measurements showing removal of the selected building wall of the three-dimensional model of the building of FIG. 7, according to one non-limiting illustrated embodiment.

FIG. 8A is an example screenshot 800 of the user interface of the system of FIG. 2A for generating wall area measurements showing removal of the selected building wall 226 of the three-dimensional model of the building 224 of FIG. 7, according to one non-limiting illustrated embodiment. Once the wall is removed, it is also removed from the three-dimensional model of the building 224 overlaid on the image of the building in the right panel 204, causing the tree 802 previously blocked by the wall 226 to be revealed in the image. As a result, the total area of all the walls of the house as measured by the computer system may be reduced by the area of the wall 226 that was removed from the building model 224. The user may also select and remove sections of the wall where windows, doors or other openings exist by selecting the area, for example, using the cursor 203 or placing a graphical user interface element representing the shape of such a feature on a wall of the building model 224.*
In some embodiments, as shown above, multiple panels of the user interface may each show a different view of the three-dimensional model of the building 224. When the user changes the model using the graphical user interface in any one panel, the corresponding change will appear in the other panels showing the change as seen from the different corresponding view of each respective panel. For example, if the user places a graphical user interface element representing a window on one of the walls of the three-dimensional model of the building 224, then that window will be visible from the different corresponding view of each respective panel. In this manner, the correct placement of the object or change to the three-dimensional model of the building 224 may be visually verified with the image of the building according to the angle of the building in the image.

Figure 8B:
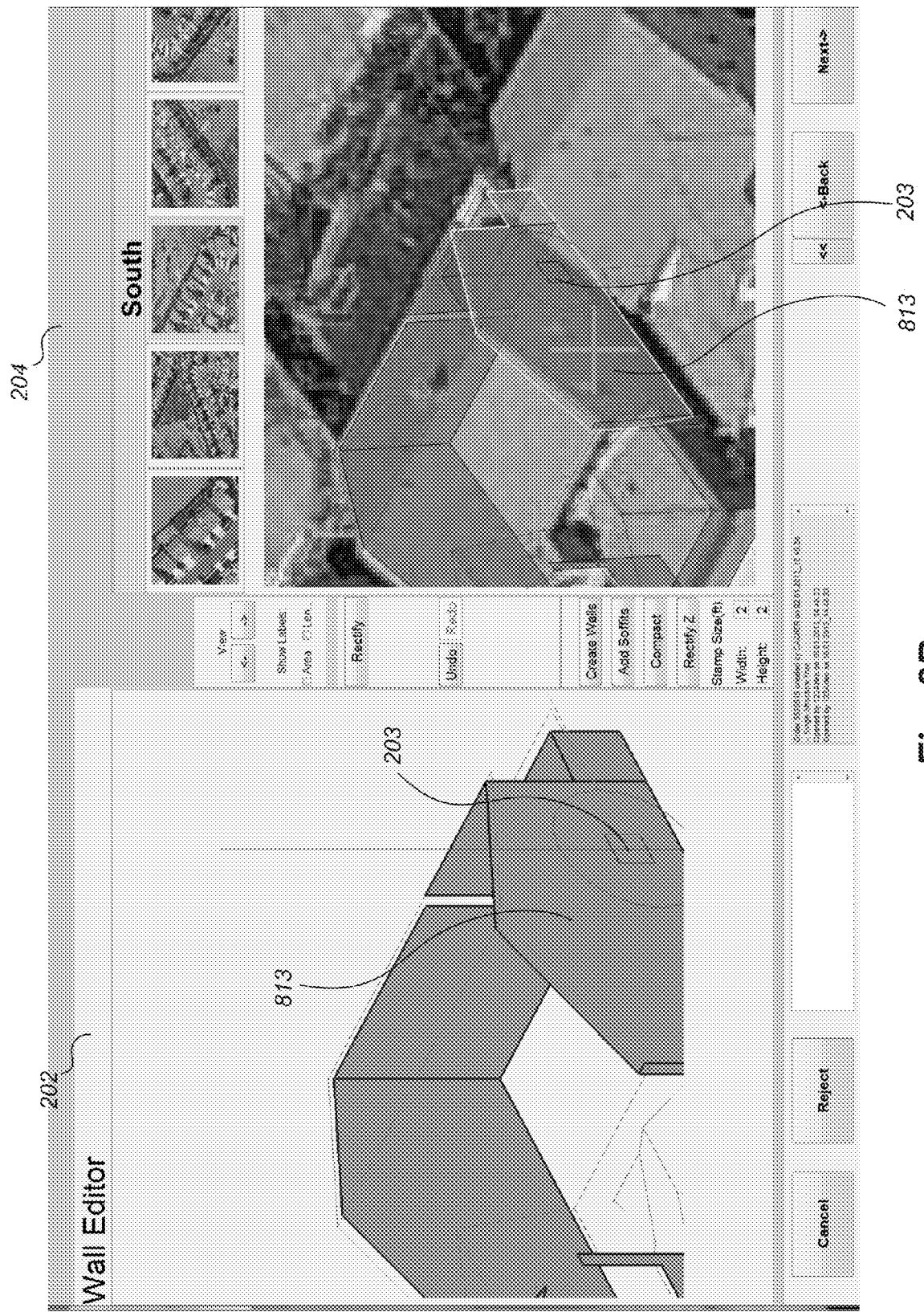
FIGS. 8B and 8C are example screenshots of the user interface of the system of FIG. 2A for generating wall area measurements, showing a cursor used to mark areas for removal (i.e., "cut-outs") from, and for the placement of graphical objects representing wall-penetrating items (e.g., windows and doors) onto, the selected building wall 226 of the three-dimensional model of the building 224 of FIG. 7, according to one non-limiting illustrated embodiment.
Figure 8C:
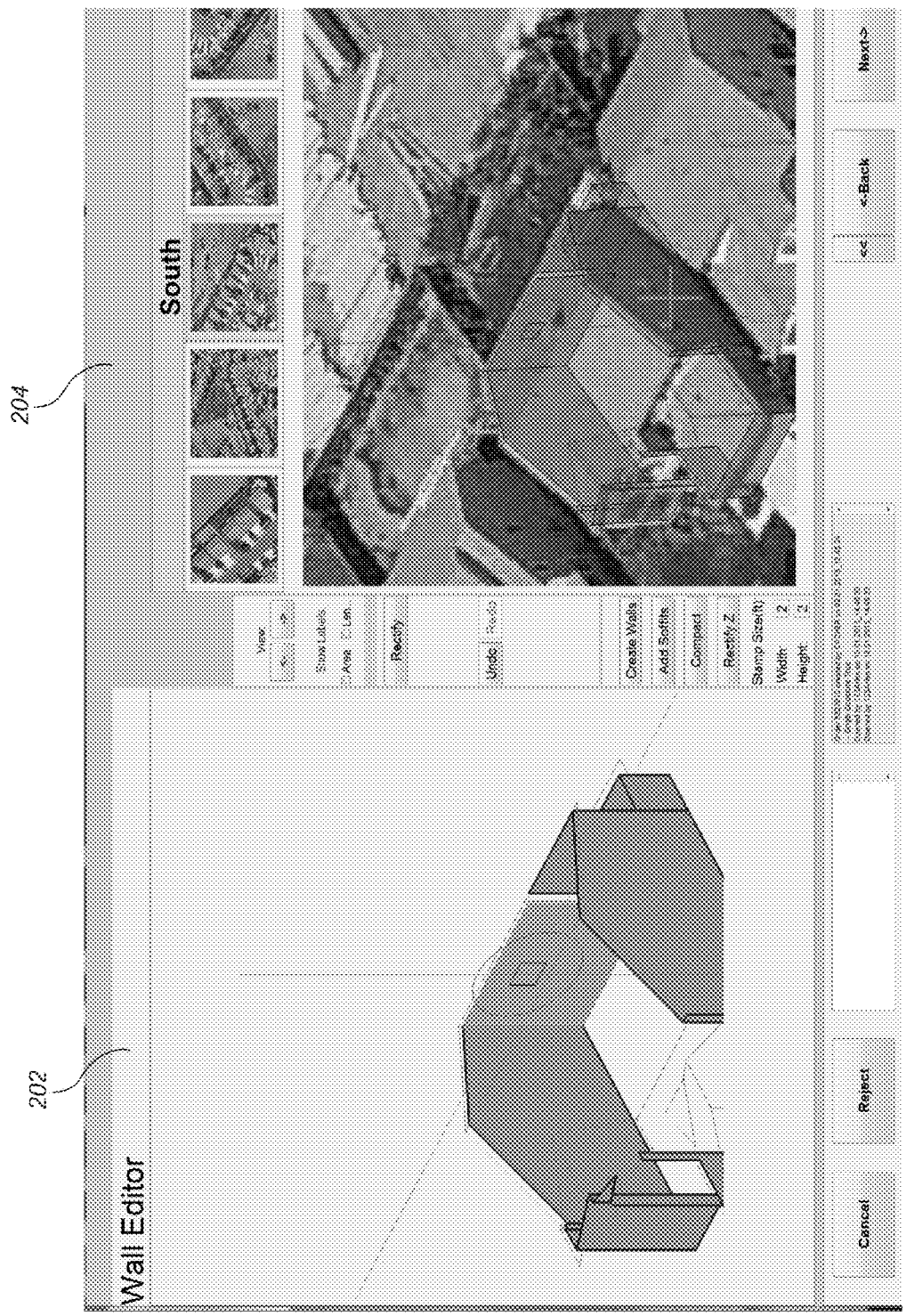

FIGS. 8B and 8C are example screenshots of the user interface of the system of FIG. 2A for generating wall area measurements showing a cursor used to mark areas for removal (i.e., "cut-outs") from, and for the placement of graphical objects representing wall-penetrating items (e.g., windows and doors) onto, the selected building wall 226 of the three-dimensional model of the building 224 of FIG. 7, according to one non-limiting illustrated embodiment. For example, in some embodiments, the cursor 203 itself is a line drawing of a planar surface in the shape of a graphical user interface element representing an object such as a square, circle, selected item, or selected building feature of a preset or selectable size, for example, the cursor 203 can be the size of a window, door, front door, back door, garage door, sliding glass door, soffit, etc., such that when the cursor is placed on a planar surface that represents a wall of the three-dimensional model of the building 224, the angle of view of the line drawing of the selected object that is acting as the cursor 203 matches that of the planar surface of the three-dimensional model of the building 225 on which it is currently placed. In effect, the object acting as the cursor, in the shape of a window, door, etc., looks how it would if it were placed on the wall that the cursor is currently on according to the current angle of view of the wall. This is shown in FIG. 8B, where the cursor 203 in the present example, selected to be in the shape of a window, is displayed by the system as how the window would appear on a first wall 813 of the building from the angle of view of the building shown in FIG. 8B. The "stamp" surrounding the cursor 203 defining the window in the present example is represented as a (physically scaled) shape moving with the cursor 203, in this case, is the black square surrounding the crosshair of the cursor 203. For example, in FIG. 8B, shown is an example where the user has moved the cursor 203 from wall 813 to a second wall 815, which is positioned at a different angle than wall 813. The cursor 203 and the black square surrounding the crosshair of the cursor 203 shown in FIG. 8C is now displayed by the system as the window would appear on the second wall 815 of the building from the angle of view of the building shown in FIG. 8C. Corresponding views of the cursor are shown in both panels 202 and 204.

The user may then click a mouse button or otherwise indicate using an input device that the object that is acting as the cursor 203 is to be placed on and become part of the three-dimensional model of the building 224 at or near the current location of the cursor 203. The user may then resize the object that is representing a square, circle, window, door, front door, back door, garage door, sliding glass door, soffit, etc., placed on the three-dimensional model of the building 224 using the cursor 203. This area can then be subtracted from the wall area measurement if such a subtraction is appropriate for a particular application consuming reported wall area values.

The use of cursor 203 is a quick and convenient way to subtract the area of a feature from the wall. For example, the cursor 203 can be placed in the shape of a window or door and then the operator can place this window or door on each wall at the true door location as shown in the images. By clicking the cursor 203, the area of the door will be automatically subtracted from the wall area. The same can be done for round windows, diamond windows, or other similar geometric shapes. This is described further with respect to FIGS. 8B and 8C and the accompanying description above.

Often, the siding or other material placed on exterior walls of a building often does not extend up to the point where the exterior wall actually meets the roof. For example, a soffit is a horizontal underside of a roof overhang, namely, the overhang of roof eaves described above, and includes a horizontal piece of material extending between the outside of the exterior wall and the edge of the roof that overhangs the exterior wall. Often, the siding or other material placed on such an exterior wall is not installed on the area of the exterior wall that extends above this horizontal soffit piece of material since that area is hidden by the horizontal piece of material and the portion of the roof overhanging the exterior wall. Thus, to exclude the area of the exterior walls of the three-dimensional model of the building 224 on which siding is not typically installed, one embodiment the system will subtract from the wall areas calculations used for wall siding material estimation purposes, etc., the section of the wall(s) above the soffit.

In some embodiments, the section of a wall above a soffit is indicated on the rendered three-dimensional model of the building 224 such that the user can adjust the location and/or size of these areas. The system may, for example, initially assume a soffit exists where a horizontal edge of the roof overhangs the walls, the distance of the roof eaves, in the generated three-dimensional model of the building 224. Alternatively, the distance of the roof overhang may be set by the user and/or based on a typical roof overhang distance. In some embodiments, the user may indicate the sections of one or more walls above a soffit on the three-dimensional model of the building 224 or otherwise input to the system data regarding locations of sections of one or more walls above a soffit.

The resulting wall measurements, roof measurements, measurements of areas missing from the wall, etc., generated by the wall estimation system may be used to generate a wall estimate report, or a combined roof and wall estimate report and/or a combined wall, floor and/or roof estimate report, etc. The estimate report may include various different identifiers indicating different features and measurements displayed on images and/or line drawings of the building and/or in different areas of the report based on the generated three-dimensional model of the building 224.

Non-limiting examples of such reports are provided in FIGS. 10A-10P, FIGS. 11A-11P and FIGS. 16-18 attached hereto. In some embodiments, all or any combination of the user interface features, graphical images and/or renderings of the building, building roof, building walls, building model and/or line drawings shown in the user interfaces in FIGS. 2A through 8 and in the accompanying description of the system for estimating wall area may also be included in the wall estimation report described herein. For example, the three-dimensional model of the building 224 described herein, or some version thereof, may also be provided in the report. In one embodiment, the three-dimensional model of the building 224 may be overlaid on an image of the building in the report.

Also, these reports may include, but are not limited to including: identification of total lengths and areas of all the walls or individual walls; perspective and elevation views of only the walls or the walls together with a transparent line drawings of the roof; the entire three-dimensional model of the building or sections thereof; shading of the walls to differentiate the walls from each other; lighter or darker shading of different walls in perspective views of the different walls depending on how close to the viewer the walls appear to be in the view; perspective and elevation views of images of the building; perspective and elevation views of images of the building with line drawings of the walls overlaid of the images; labeling on the perspective and elevation views of the walls based on the angle of view shown in the line drawing and/or labeling of the walls based on which walls are best visible in the angle of view shown in the line drawing; wall area of only the labeled walls that are best visible and/or based on percentage of visibility of non-transparent walls as shown in the line drawing; lengths of line segments defining the walls; perimeter measurements of walls, window, door building features on the wall or selected labeled walls; identification and total and/or individual vertical lengths of inside corners of intersecting exterior walls (e.g., corners on the outside of the building of angles less that 180 degrees); identification and total and/or individual vertical lengths of outside corners of the exterior intersecting walls (e.g., corners on the outside of the building having angles more than 180 degrees). The report, diagrams, or electronic representations of the content sufficient to regenerate them may be communicated or provided electronically by the wall estimation system or other $3^{rd}$ party system in various configurations and formats required by the insurance, real estate and construction industries, and/or printed and mailed.

Figure 9:
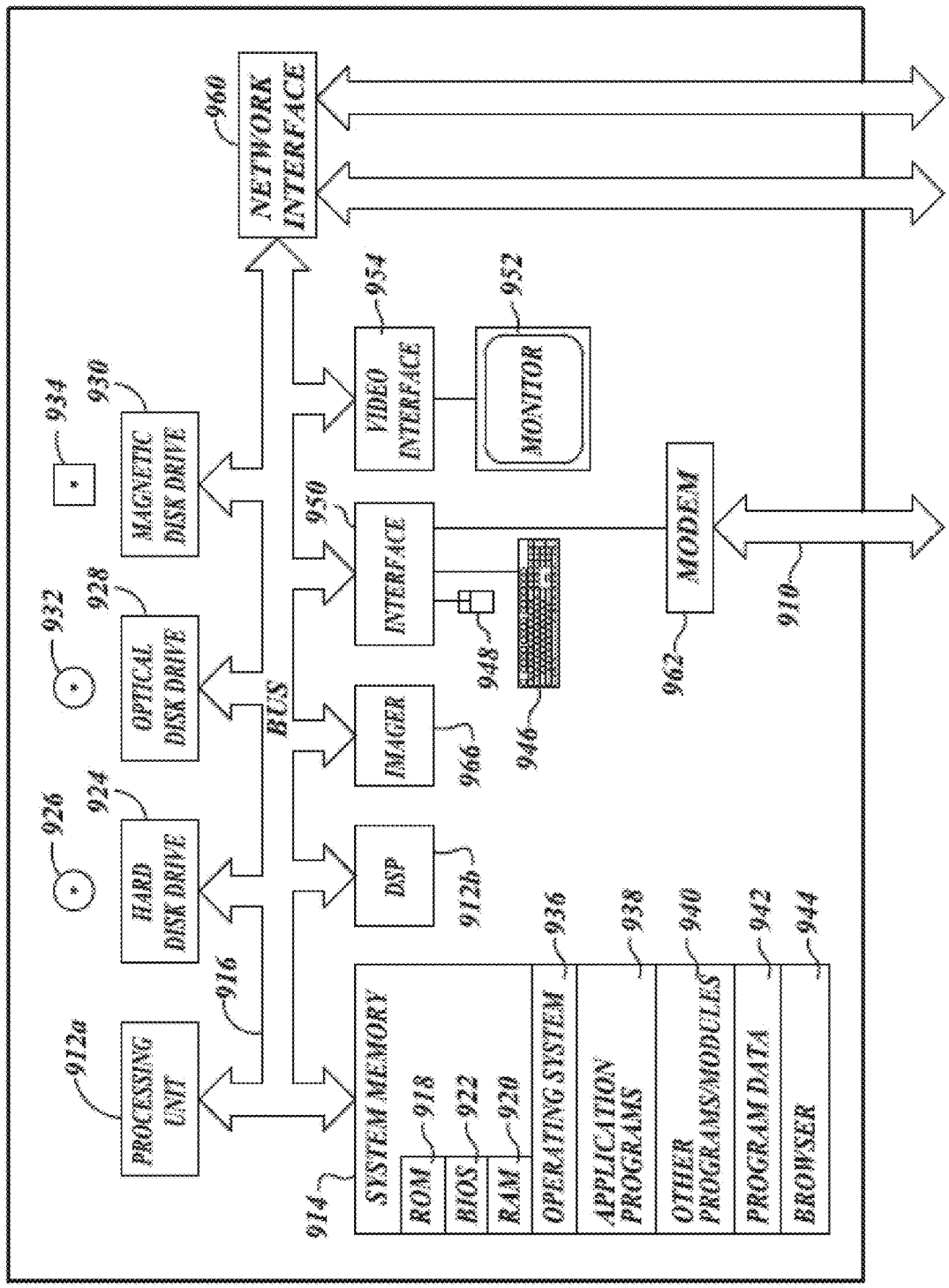
FIG. 9 is a schematic diagram of a computing environment in which systems and methods for estimation of building wall area may be implemented or of which they may be a part.

FIG. 9 is a schematic diagram of a computing environment in which systems and methods for estimation of building wall area may be implemented or of which they may be a part. For example, processes 100, 110 and 120 described above in conjunction with FIGS. 1A-1C may be performed or implemented by, for example, one or more software modules or components or any combination of suitable hardware, firmware or software components or devices including those that are a part of, stored in, or configure the computing environment of FIG. 9. Also, the graphical user interface functions and features of the wall area estimation system may be performed or implemented by, for example, one or more software modules or components or any combination of suitable hardware, firmware or software components or devices including those that are a part of, stored in, or configure the computing environment of FIG. 9.

The computing environment 900 will at times be referred to in the singular herein, but this is not intended to limit the embodiments to a single device since in typical embodiments there may be more than one computer system or device involved. Unless described otherwise, the construction and operation of the various blocks shown in FIG. 9 are of conventional design. As a result, such blocks need not be described in further detail herein, as they will be understood by those skilled in the relevant art.

The computing environment 900 may include one or more processing units 912a, 912b (collectively 912), a system memory 914 and a system bus 916 that couples various system components including the system memory 914 to the processing units 912. The processing units 912 may be any logic processing unit, such as one or more central processing units (CPUs) 912a, digital signal processors (DSPs) 912b, digital video or audio processing units such as coder-decoders (codecs) or compression-decompression units, application-specific integrated circuits (ASICs), field programmable gate arrays (FPGAs), etc. The system bus 916 can employ any known bus structures or architectures, including a memory bus with memory controller, a peripheral bus, and a local bus. The system memory 914 includes read-only memory ("ROM") 918 and random access memory ("RAM") 920. A basic input/output system ("BIOS") 922, which can form part of the ROM 918, contains basic routines that help transfer information between elements within the computing environment 900, such as during start-up.

The computing environment 900 may include a hard disk drive 924 for reading from and writing to a hard disk 926 (including a solid state memory device), an optical disk drive 928 for reading from and writing to removable optical disks 932, and/or a magnetic disk drive 930 for reading from and writing to magnetic disks 934. The optical disk 932 can be a CD-ROM, while the magnetic disk 934 can be a magnetic floppy disk or diskette.

The hard disk drive 924, optical disk drive 928 and magnetic disk drive 930 may communicate with the processing unit 912 via the system bus 916. The hard disk drive 924, optical disk drive 928 and magnetic disk drive 930 may include interfaces or controllers (not shown) coupled between such drives and the system bus 916, as is known by those skilled in the relevant art.

The drives 924, 928 and 930, and their associated computer-readable storage media 926, 932, 934, may provide nonvolatile and non-transitory storage of computer readable instructions, data structures, program modules and other data for the computing environment 900. Although the depicted computing environment 900 is illustrated employing a hard disk 924, optical disk 928 and magnetic disk 930, those skilled in the relevant art will appreciate that other types of computer-readable storage media that can store data accessible by a computer may be employed, such as magnetic cassettes, flash memory, solid state drives, digital video disks ("DVD"), Bernoulli cartridges, RAMs, ROMs, smart cards, etc. For example, computer-readable storage media may include, but is not limited to, random access memory (RAM), read-only memory (ROM), electrically erasable programmable read-only memory (EEPROM), flash memory, compact disc ROM (CD-ROM), digital versatile disks (DVD) or other optical disk storage, magnetic cassettes, magnetic tape, magnetic disk storage or other magnetic storage devices, solid state memory or any other medium which can be used to store the desired information and which may be accessed by processing unit 912a.

Program modules can be stored in the system memory 914, such as an operating system 936, one or more application programs 938, other programs or modules 940 and program data 942. Application programs 938 may include instructions that cause the processor(s) 912 to perform generating digital roof models, generating roof and wall area measurements, and store and display input images or images generated by creating digital roof models and generating roof and wall area measurements, including the processes described herein. Other program modules 940 may include instructions for handling security such as password or other access protection and communications encryption. The system memory 914 may also include communications programs, for example, a Web client or browser 944 for permitting the computing environment 900 to access and exchange data including digital images, roof measurements and other building data with sources such as Web sites of the Internet, corporate intranets, extranets, or other networks and devices, as well as other server applications on server computing systems. The browser 944 in the depicted embodiment is markup language based, such as Hypertext Markup Language (HTML), Extensible Markup Language (XML) or Wireless Markup Language (WML), and operates with markup languages that use syntactically delimited characters added to the data of a document to represent the structure of the document. A number of Web clients or browsers are commercially available such as those from Mozilla, Google, and Microsoft of Redmond, Wash.

While shown in FIG. 9 as being stored in the system memory 914, the operating system 936, application programs 938, other programs/modules 940, program data 942 and browser 944 can be stored on the hard disk 926 of the hard disk drive 924, the optical disk 932 of the optical disk drive 928 and/or the magnetic disk 934 of the magnetic disk drive 930.

An operator can enter commands and information into the computing environment 900 through input devices such as a touch screen or keyboard 946 and/or a pointing device such as a mouse 948, and/or via a graphical user interface in order to receive, process, store and send data on which wall area measurement estimation has been or will be performed as described herein. Other input devices can include a microphone, joystick, game pad, tablet, scanner, etc. These and other input devices are connected to one or more of the processing units 912 through an interface 950 such as a serial port interface that couples to the system bus 916, although other interfaces such as a parallel port, a game port or a wireless interface or a universal serial bus ("USB") can be used. A monitor 952 or other display device is coupled to the system bus 916 via a video interface 954, such as a video adapter which may be configured to display images used by or generated by wall area measurement estimation as described herein. The computing environment 900 can include other output devices, such as speakers, printers, etc.

The computing environment 900 can operate in a networked environment using logical connections to one or more remote computers and/or devices. For example, the computing environment 900 can operate in a networked environment using logical connections to one or more other computing systems, mobile devices and other service providers or information servers that provide the digital images in various format or by other electronic delivery methods. Communications may be via a wired and/or wireless network architecture, for instance wired and wireless enterprise-wide computer networks, intranets, extranets, telecommunications networks, cellular networks, paging networks, and other mobile networks.

FIGS. 10A-10P show a non-limiting example of a wall estimate report, according to one non-limiting illustrated embodiment. In particular, FIG. 10A is a first page of a non-limiting example of the wall estimate report. Shown in FIG. 10A is a top plan view of a 3D model of a roof of the building that is the subject of the wall estimate report in which facets appear as semi-transparent to reveal overhangs. Also shown is a property details section including roof measurements including total roof area, pitch of roof segments, total length measurements of ridges/hips, valleys, rakes, eaves, total wall area and total number of facets. A table of contents of the wall estimate report is listed in a Report Contents section in FIG. 10A including page designations for individual sections of the wall estimate report named: Images, Length Diagram, Pitch Diagram, Roof Area Diagram, Notes Diagram, 3D Wall Area Diagram, Alternative 3D Wall View, a Missing Wall Diagram, Elevation Diagrams and Report Summary.

Figure 10B:
FIG. 10B is a second page of a non-limiting example of a wall estimate report, according to one non-limiting illustrated embodiment.

FIG. 10B is a second page of a non-limiting example of a wall estimate report, according to one non-limiting illustrated embodiment. The Images section of the wall estimate report starts on FIG. 10B. Shown in FIG. 10B is an image of the building which is a photograph of the building showing a top substantially orthogonal view of the building and the roof of the building.

FIG. 10C is a third page of a non-limiting example of a wall estimate report, according to one non-limiting illustrated embodiment. Shown in FIG. 10C are two images of the building, which are each photographs of the building, one showing a top perspective (oblique) view of the north facing side of the building and the other one showing a top perspective (oblique) view of the south facing side of the building.

FIG. 10D is a fourth page of a non-limiting example of a wall estimate report, according to one non-limiting illustrated embodiment. Shown in FIG. 10D are two images of the building, which are each photographs of the building, one showing a top perspective (oblique) view of the east facing side of the building and the other one showing a top perspective (oblique) view of the west facing side of the building.

Figure 10E:
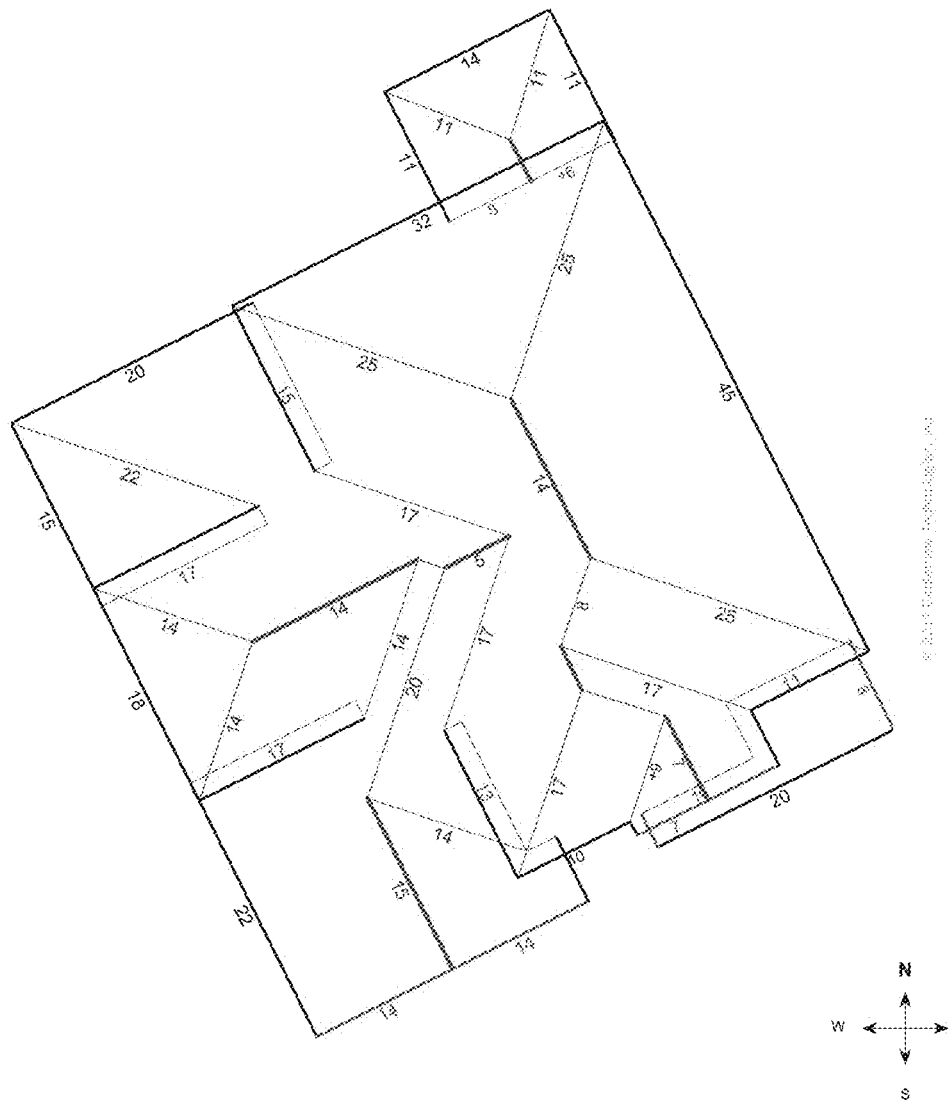
FIG. 10E is a fifth page of a non-limiting example of a wall estimate report, according to one non-limiting illustrated embodiment.

FIG. 10E is a fifth page of a non-limiting example of a wall estimate report, according to one non-limiting illustrated embodiment. Shown in FIG. 10E is a line drawing showing a top plan view of a 3D model of the roof of the building that is the subject of the wall estimate report which includes segment lengths shown on the report next to the applicable segment (rounded to the nearest whole number) over 5 feet. Plus signs preface some numbers to avoid confusion when rotated (e.g., +6 and +9). Roof ridges are shown drawn in red. Roof valleys are shown drawn in blue. Roof rakes are shown drawn in green. Roof eaves are shown drawn in black. Roof flashing is shown drawn in brown and any parapets would be shown drawn in grey. These color codes are shown in a top section of the page of FIG. 10E by coloring the text naming the roof feature and showing the total lengths of each roof feature in the corresponding color of the line segment(s) in the diagram of the corresponding different roof feature. There is a Detailed Length Diagram, in the Appendix at the end of the report shown on FIG. 10P.

Figure 10F:
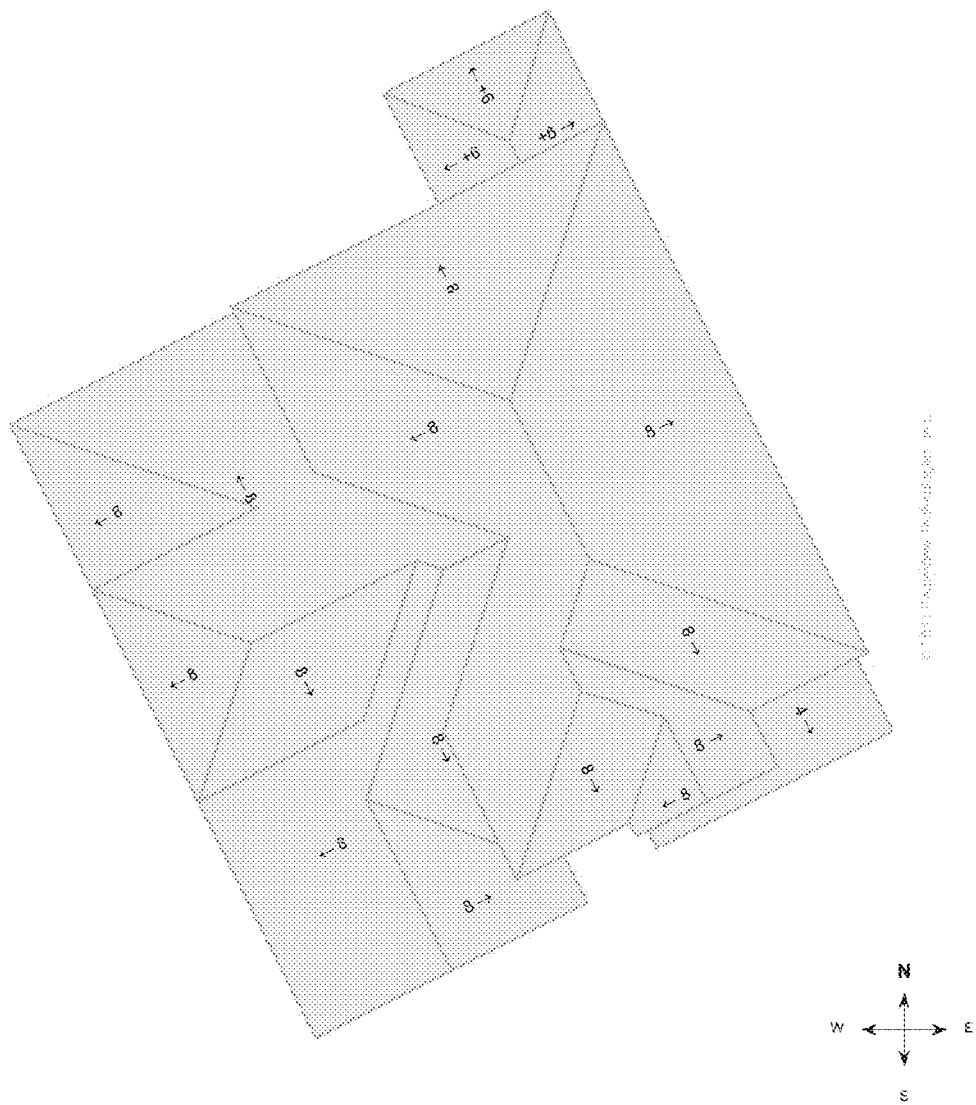
FIG. 10F is a sixth page of a non-limiting example of a wall estimate report, according to one non-limiting illustrated embodiment.

FIG. 10F is a sixth page of a non-limiting example of a wall estimate report, according to one non-limiting illustrated embodiment. Shown in FIG. 10F is a line drawing showing a top plan view of a 3D model of the roof of the building. The pitches and associated arrows indicative of the direction of pitches for different roof segments are shown on the line drawing within each different corresponding roof segment on the line drawing.

Figure 10G:
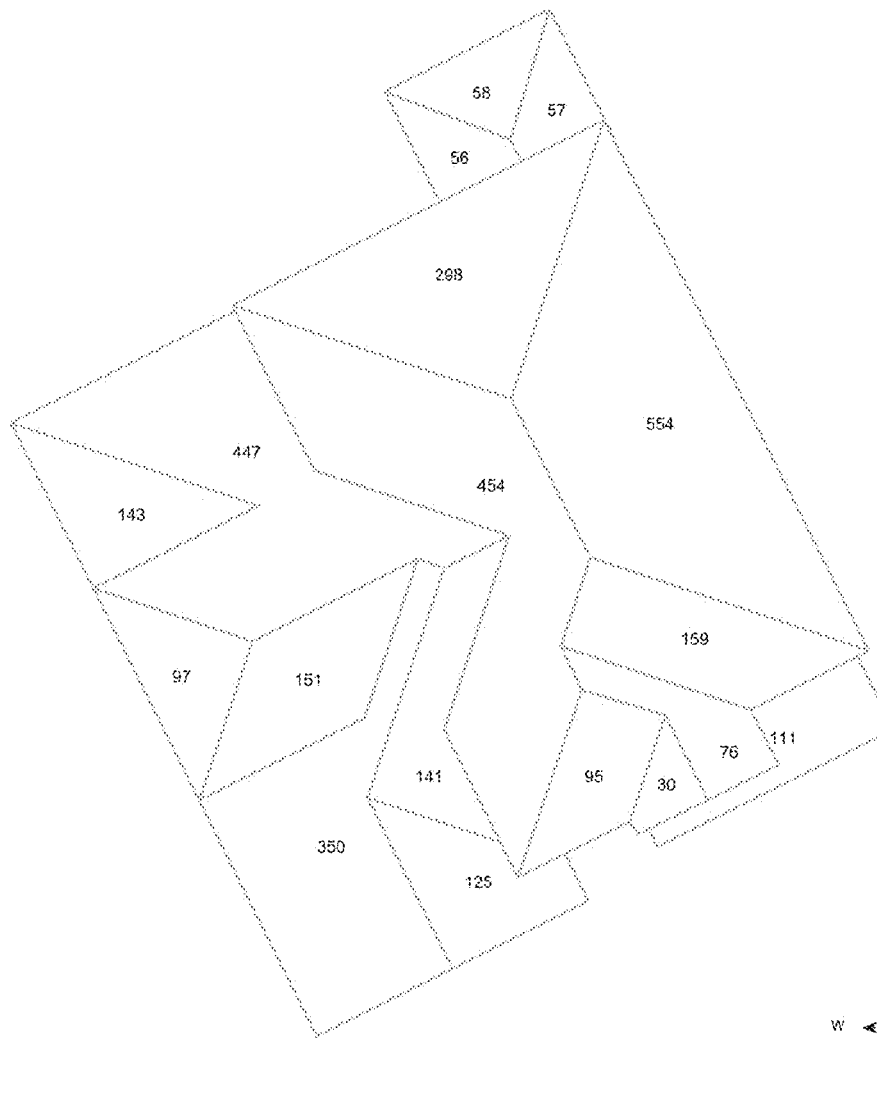
FIG. 10G is a seventh page of a non-limiting example of a wall estimate report, according to one non-limiting illustrated embodiment.

FIG. 10G is a seventh page of a non-limiting example of a wall estimate report, according to one non-limiting illustrated embodiment. Shown in FIG. 10G is a line drawing showing a top plan view of a 3D model of the roof of the building. The areas of different roof segments are shown on the line drawing within each different corresponding roof segment on the line drawing. Also shown is a total number of and area of all the roof segments (i.e., roof facets).

Figure 10H:
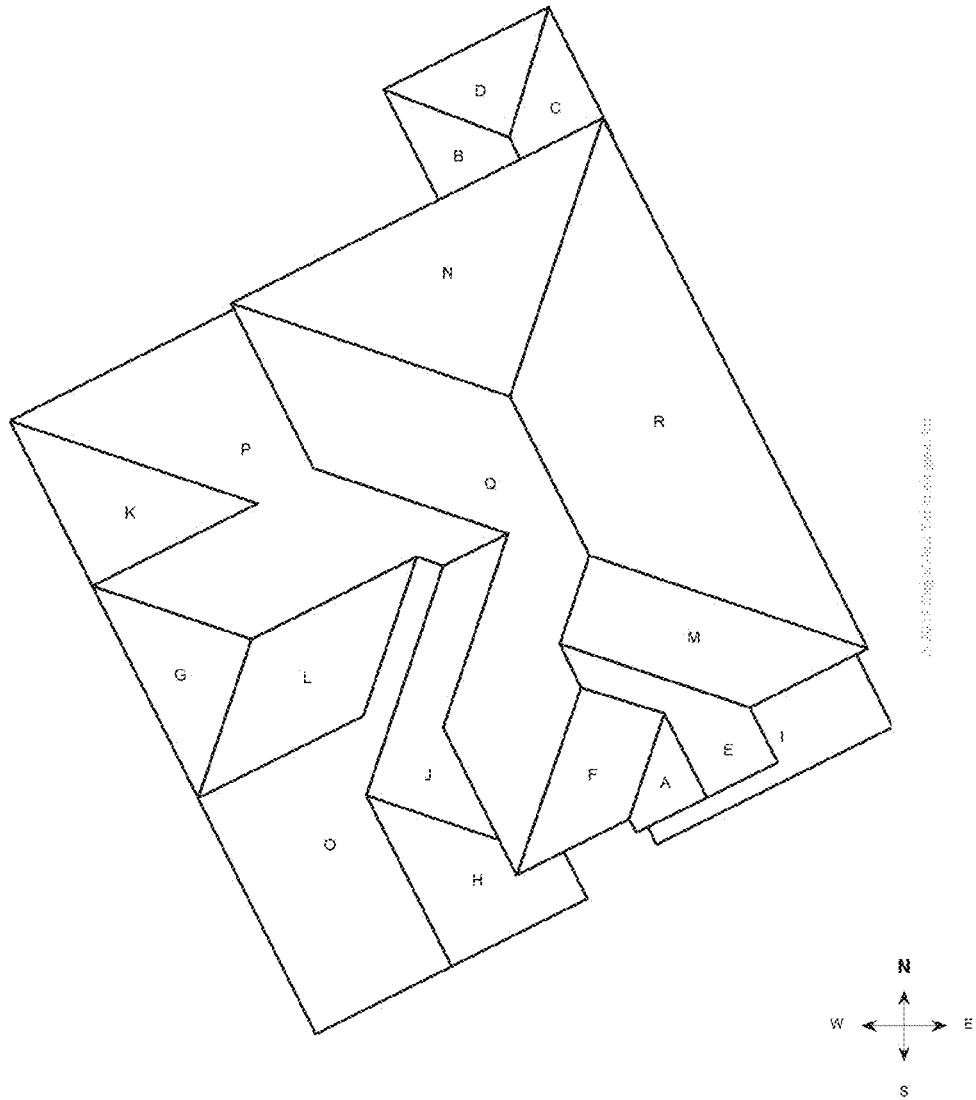
FIG. 10H is an eighth page of a non-limiting example of a wall estimate report, according to one non-limiting illustrated embodiment.

FIG. 10H is an eighth page of a non-limiting example of a wall estimate report, according to one non-limiting illustrated embodiment. Shown in FIG. 10H is a Notes Diagram of the building roof including a line drawing showing a top plan view of a 3D model of the roof of the building. Labels from smallest to largest (A to Z) of different roof segments (i.e., facets) are shown on the line drawing within each different corresponding roof segment on the line drawing. The labels may be used to cross reference notes in a different area of the report related to each corresponding roof segment.

Figure 10I:
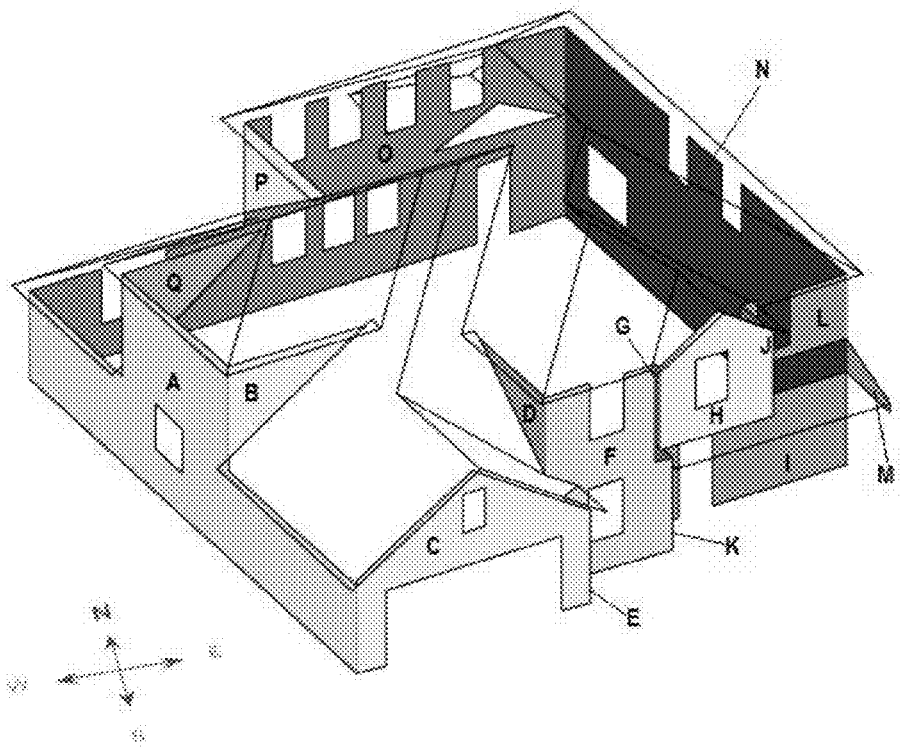
FIG. 10I is a ninth page of a non-limiting example of a wall estimate report, according to one non-limiting illustrated embodiment.

FIG. 10I is a ninth page of a non-limiting example of a wall estimate report, according to one non-limiting illustrated embodiment. Shown in FIG. 10I is a 3D Wall Area Diagram of the building including a line drawing showing a top perspective view of a 3D model of the walls of the south facing side of the building. Different planar walls surfaces of the building are shown being shaded differently from each other and the planar surfaces of the roof facets are shown as transparent.

Figure 10J:
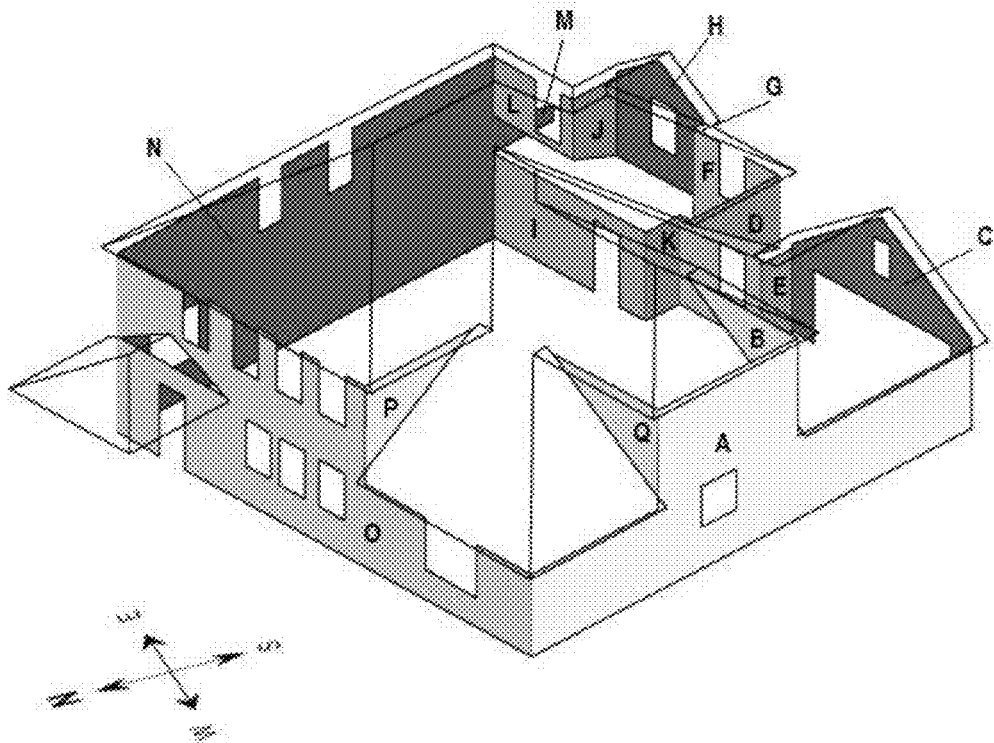
FIG. 10J is a tenth page of a non-limiting example of a wall estimate report, according to one non-limiting illustrated embodiment.

The wall area measurement estimate report may include multiple line drawings of the building. Each of the multiple line drawings is from a different angle of view of the building. In some embodiments, at least two of the multiple line drawings are perspective views from an angle of view above the building. A first of the perspective views is substantially centered on a first substantially vertical exterior corner of the house that is approximately opposite of, or in a view that is about 90 degrees rotationally different from, a view showing a second substantially vertical exterior corner of the house. A second one of the perspective views is substantially centered on this second substantially vertical exterior corner of the house. For example, FIG. 10I and FIG. 10J are perspective views of opposite corners of exterior walls of the building. Note that in FIG. 10I and FIG. 10J the line drawing of the roof is transparent, semi-transparent or translucent to show interior surfaces of the walls of the building in the first and second of the perspective views shown in FIG. 10I and FIG. 10J.

The angle of view above the building may be dependent on a height of the building. For example, the angle of view above the building may increase as the height of the building increases to provide a better angle of view of the interior surfaces of the walls of the building. The angle of view above the building may also be dependent on a height to depth to ratio of the building. This angle of view above the building may increase as the height of the building increases if the depth stays the same.

As seen in FIG. 10I and FIG. 10J, the system provides shading on interior surfaces of walls that are shown in the perspective views that is darker than shading provided on exterior surfaces of walls shown in the perspective views. Also, shading is provided of the surfaces of the walls such that no two connected walls are of a same shade. A number of different shades of the walls in each perspective view may be proportional to a total number of walls shown in the perspective view. This is because shading is provided such that no two connected walls are of a same shade and therefore, more different shades are required for more different connecting walls. Also, the gradations of shadings used alternate for walls between different views, to facilitate making sure that no two connected walls are of a same shade.

Also shown is a "Wall Area By Direction" chart showing estimated individual total areas of different walls surfaces, showing a categorization of the planar wall surfaces according to which direction the planar wall surfaces generally face, and showing a total estimated wall area of the planar wall surfaces for each category.

FIG. 10J is a tenth page of a non-limiting example of a wall estimate report, according to one non-limiting illustrated embodiment. Shown in FIG. 10J is a 3D Alternative Wall View Diagram of the building including a line drawing showing a top perspective view of a 3D model of the walls of the building showing the generally north facing and the generally west facing sides of the building. Different planar walls surfaces of the building are shown being shaded differently from each other and the planar surfaces of the roof facets are shown as transparent. Also shown is a "Wall Area By Direction" chart showing estimated individual total areas of different walls surfaces, showing a categorization of the planar wall surfaces according to which direction the planar wall surfaces generally face, and showing a total estimated wall area of the planar wall surfaces for each category.

Figure 10K:
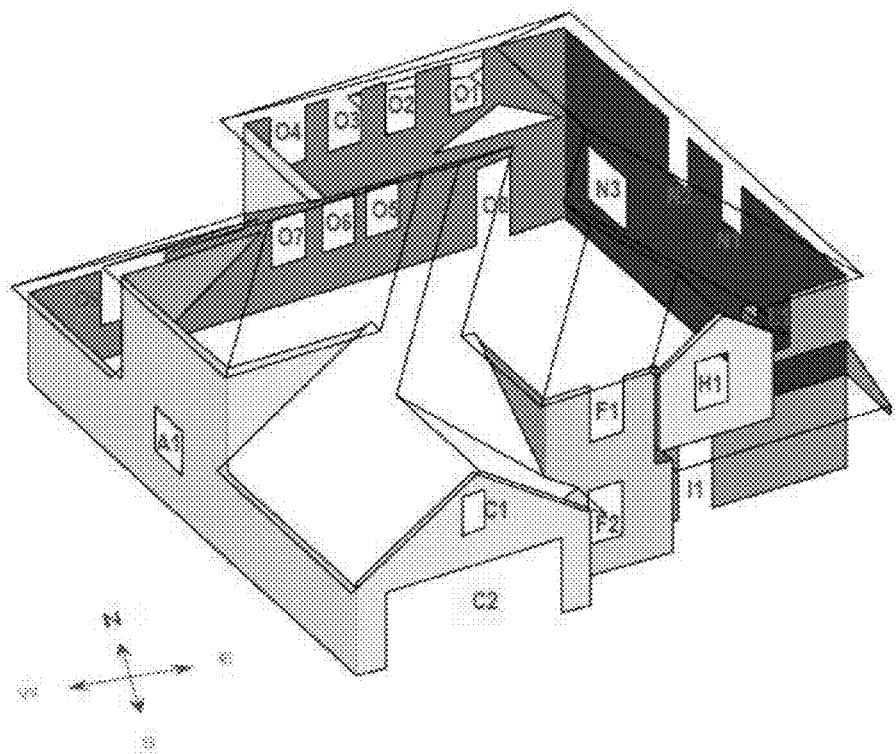
FIG. 10K is a eleventh page of a non-limiting example of a wall estimate report, according to one non-limiting illustrated embodiment.

FIG. 10K is an eleventh page of a non-limiting example of a wall estimate report, according to one non-limiting illustrated embodiment. Shown in FIG. 10K is a 3D Missing Wall Diagram of the building including a line drawing showing a top perspective view of a 3D model of the walls of the building showing the generally south facing side of the building. Different planar walls surfaces of the building are shown being shaded differently from each other and the planar surfaces of the roof facets are shown as transparent. Each section of a planar wall surface that is either (i) is a truly an unoccupied hole or void in the wall or (ii) a wall hole or void that is occupied by a penetrating object (such as a window or door), that will not be counted in calculation of area of the corresponding planar wall surface (i.e., a "missing" wall surface) is labeled on the line drawing within the corresponding void in the wall surface. Also shown is a "Missing Wall Measurements" chart showing estimated individual total areas of the different wall voids, showing a categorization of the area voids according to which direction the wall of the missing wall surface generally faces, and showing a total estimated missing wall area of the wall voids for each category.

As shown in FIG. 10K, labeling is provided for each corresponding wall in the line drawings with a designated corresponding character or combination of characters. Each hole in the corresponding wall is labeled with the corresponding character or combination of characters with which the corresponding wall is labeled followed by one or more additional character or combination of characters to designate that the hole is a hole of the corresponding wall. For example, the holes in the wall for wall C are labeled C1 and C2 to designate these are holes of wall C, which is shown labeled in FIG. 10I.

Figure 10L:
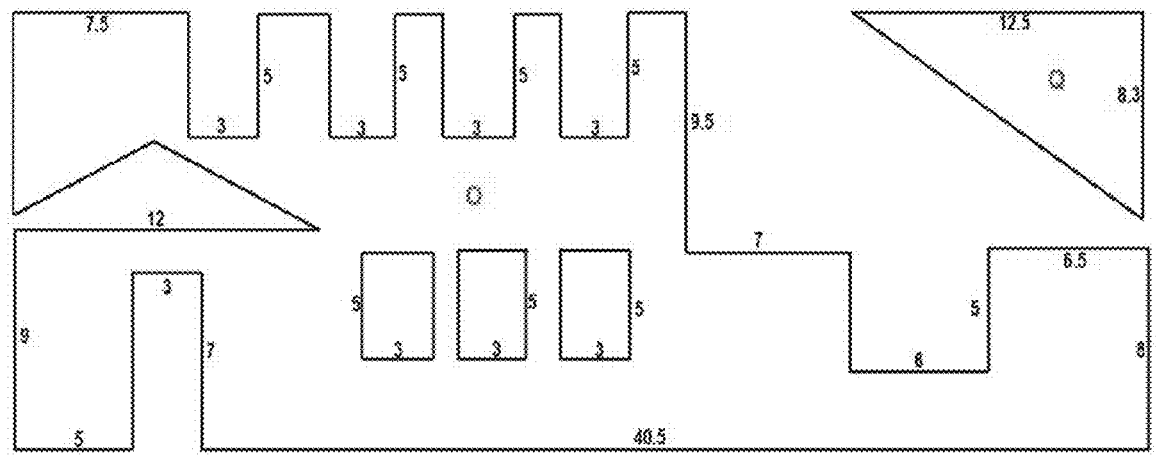
FIG. 10L is a twelfth page of a non-limiting example of a wall estimate report, according to one non-limiting illustrated embodiment.

FIG. 10L is a twelfth page of a non-limiting example of a wall estimate report, according to one non-limiting illustrated embodiment. Each of the multiple line drawings 10L to 10O are from a different corresponding angle of view of the building. These are elevation views of different sides of the building from a corresponding first, second, third and fourth angle of view of the building, respectively. The first and third angles of view, corresponding to FIGS. 10L and 10O, are of exterior walls of the building facing substantially opposite of each other, labeled as 'East' and 'West'. The compass direction labels, such as 'East' indicate an assignment of that elevation viewpoint to the nearest applicable compass direction, but does not necessarily indicate a elevation projected due East. The second and fourth angles of view are also of exterior walls of the building facing substantially opposite of each other, North and South. In some embodiments, included in one or more of the elevation views of the building, a shading of an edge of a wall to designate the edge of the wall is behind another wall in the corresponding view. For example, the shading of the edge of the wall to designate the edge of the wall is behind another wall in a corresponding view may be a lighter shade than that in the one or more of the elevation views of the building of wall edges which are not behind other walls in the corresponding view.

As shown in Figures drawings 10L to 10O, shown in each of the elevation views of the building are only walls which are designated as facing a viewer in the corresponding elevation view. In each of the elevation views of the building, in some embodiments, only walls which are designated as facing the viewer in the corresponding view of the elevation views are shown in the corresponding view. For example, this may include designating, for each of the views, which walls are facing the viewer for the particular angle of view based on a difference in the angle of the walls with respect to the angle of view. This may include designating a wall as facing the viewer for the corresponding angle of view if a difference in the angle of the wall with respect to the corresponding angle of view is below a defined threshold difference, which may be varied. For ease of readability, the line drawings of the elevation views may in some embodiments show labels of walls shown in one of the elevation views of the building, but not labels of holes in the walls of the elevation views on the drawing. The opposite also may hold true, and the system may generate a wall report showing labels of holes in walls shown in a second view of the building, but not labels of the walls shown in a second view of the building.

The system may determine the corresponding first, second, third and fourth angle of view of the building for the corresponding elevation view by determining orientation angles of substantially all vertical walls of the building relative to the orientation of a reference vertical plane. For presentation purposes, all substantially vertical exterior walls of the building may be grouped together with other walls which have similar orientation angles within a defined threshold difference in angle. The system may then determine the first predominate orientation angle of view based on the dominant orientation angle within the set of walls comprising first grouping of walls. In grouping together sets of walls with of similar orientation, each elevation view will have a better chance of being more meaningful to the end user due to while reducing visual clutter The differences between the different views may then be determined based on the first view orientation angle by virtually turning the house, or "rotating around" the exterior of the house by 90 degrees each time. In particular, the system determines the second view orientation angle to be approximately a difference of 90 degrees from the first angle of view. The system determines the third view orientation angle to be approximately 90 degrees opposite of the first angle of view. The system then determines the fourth view orientation to be approximately 90 degrees opposite of the second view orientation. The system may also detect if two walls are overlapping in any one of the corresponding first, second, third and fourth view orientation of the building for the corresponding elevation views. If two walls are overlapping in any one of the corresponding first, second, third and fourth view orientations of the building, the system may render the report to show only the overlapping wall that is in front in the corresponding view.

To avoid visual clutter in some embodiments, portions of walls and/or portions of holes/voids in walls may not be receive a label in a diagram if the physical metrics (such as length and/or area) associated with that portion of a wall has already been accounted for in a label appearing in the model within the viewpoint. For example, the system may label only one height and one width of the a rectangular wall section and only one height and one width on one of a repeated set of rectangular holes within the wall. This avoids cluttering the line drawing with redundant measurement labels. For example, in FIG. 10M, the hole in wall N has only one height "5" and one width "6" labeled on the hole.

Shown in FIG. 10L is a "North Elevation Diagram" of a wall of the building including a line drawing showing an elevation view of the walls of the generally north facing side of the building. Different line segments of the walls and the missing surfaces of the walls of the generally north facing side of the building are labeled with corresponding lengths next to the corresponding line segment. Also shown are labels for the corresponding walls on the corresponding wall surface of each wall in the line drawing. For each of the walls shown in the line drawing, shown in a "North Elevation Details" chart is the wall label of the wall shown in the line drawing, a number of missing wall surfaces for the wall, an estimated individual total area of the different missing wall surfaces (e.g. wall voids) for the wall, and an estimated total area of the wall. Also shown in the "North Elevation Details" is the estimated total wall area of the walls labeled in the line drawing, the total number of missing wall surfaces of the walls labeled in the line drawing, and a total estimated missing wall area of the missing wall surfaces of the walls labeled in the line drawing.

FIG. 10M is a thirteenth page of a non-limiting example of a wall estimate report, according to one non-limiting illustrated embodiment. Shown in FIG. 10M is an "East Elevation Diagram" of a wall of the building including a line drawing showing an elevation view of the walls of the generally east facing side of the building. Different line segments of the walls and the missing surfaces of the walls of the generally east facing side of the building are labeled with corresponding lengths next to the corresponding line segment. Also shown are labels for the corresponding walls on the corresponding wall surface of each wall in the line drawing. For each of the walls shown in the line drawing, shown in an "East Elevation Details" chart is the wall label of the wall shown in the line drawing, a number of missing wall surfaces for the wall, an estimated individual total area of the different missing wall surfaces for the wall, and an estimated total area of the wall. Also shown in the "East Elevation Details" is the estimated total wall area of the walls labeled in the line drawing, the total number of missing wall surfaces of the walls labeled in the line drawing, and a total estimated missing wall area of the missing wall surfaces of the walls labeled in the line drawing.

Figure 10N:
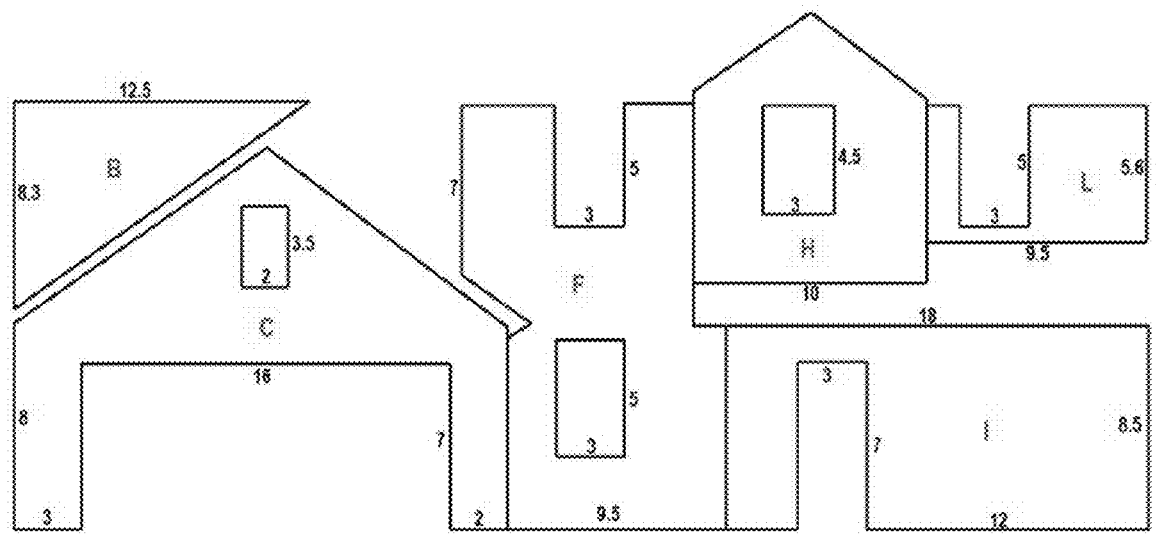
FIG. 10N is a fourteenth page of a non-limiting example of a wall estimate report, according to one non-limiting illustrated embodiment.
Figure 10O:
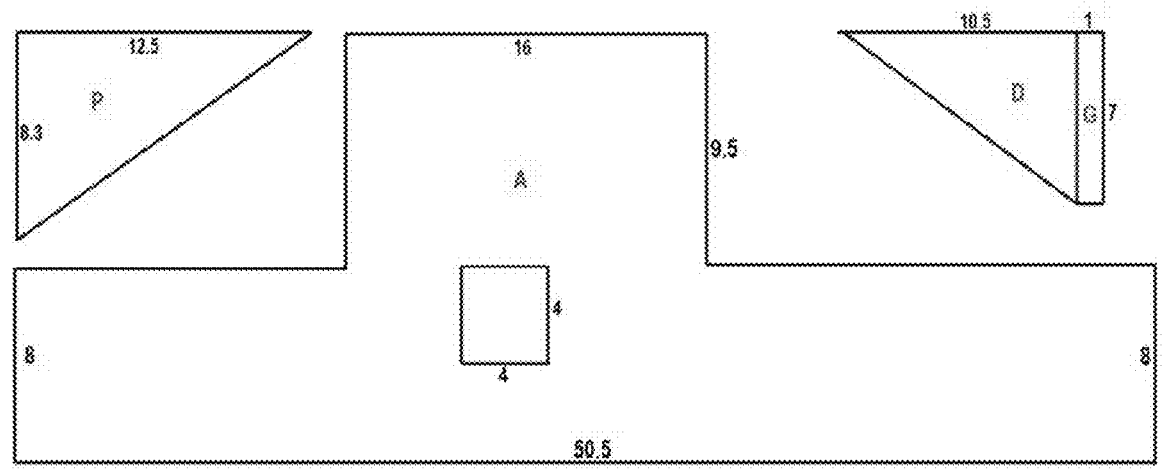
FIG. 10O is a fifteenth page of a non-limiting example of a wall estimate report, according to one non-limiting illustrated embodiment.

FIG. 10N is a fourteenth page of a non-limiting example of a wall estimate report, according to one non-limiting illustrated embodiment. Shown in FIG. 10N is a "South Elevation Diagram" of a wall of the building including a line drawing showing an elevation view of the walls of the generally south facing side of the building. Different line segments of the walls and the missing surfaces of the walls of the generally south facing side of the building are labeled with corresponding lengths next to the corresponding line segment. Also shown are labels for the corresponding walls on the corresponding wall surface of each wall in the line drawing. For each of the walls shown in the line drawing, shown in a "South Elevation Details" chart is the wall label of the wall shown in the line drawing, a number of missing wall surfaces for the wall, an estimated individual total area of the different missing wall surfaces for the wall, and an estimated total area of the wall. Also shown in the "South Elevation Details" is the estimated total wall area of the walls labeled in the line drawing, the total number of missing wall surfaces of the walls labeled in the line drawing, and a total estimated missing wall area of the missing wall surfaces of the walls labeled in the line drawing.

FIG. 10O is a fifteenth page of a non-limiting example of a wall estimate report, according to one non-limiting illustrated embodiment. Shown in FIG. 10O is a "West Elevation Diagram" of a wall of the building including a line drawing showing an elevation view of the walls of the generally west facing side of the building. Different line segments of the walls and the missing surfaces of the walls of the generally west facing side of the building are labeled with corresponding lengths next to the corresponding line segment. Also shown are labels for the corresponding walls on the corresponding wall surface of each wall in the line drawing. For each of the walls shown in the line drawing, shown in a "West Elevation Details" chart is the wall label of the wall shown in the line drawing, a number of missing wall surfaces for the wall, an estimated individual total area of the different missing wall surfaces for the wall, and an estimated total area of the wall. Also shown in the "West Elevation Details" is the estimated total wall area of the walls labeled in the line drawing, the total number of missing wall surfaces of the walls labeled in the line drawing, and a total estimated missing wall area of the missing wall surfaces of the walls labeled in the line drawing.

FIG. 10P is a sixteenth page of a non-limiting example of a wall estimate report, according to one non-limiting illustrated embodiment. Shown in FIG. 10P is a Report Summary including a top plan view of a 3D model of the roof of the building that is the subject of the wall estimate report along with the total number of estimated roof facets used in the report for the roof. Shown also is a list of total lengths, areas and pitches for the roof, including total length and number of ridges, total length and number of hips, total length and number of valleys, total length and number of rakes, total length and number of eaves/starter, total length and number of drip edge lengths (eaves+rakes), an indication there are no parapet walls labeled, total length and number of flashing lengths, total length and number of step flashing lengths, total estimated roof area, predominant roof pitch measurement, total wall area, and total estimated number of wall facets used in the report for the roof. Also shown is the property location (e.g., location of the building) in terms of longitude and latitude coordinates above a notes section of the report.

Figure 11B:
FIG. 11B is a second page of a second non-limiting example of a wall estimate report, according to one non-limiting illustrated embodiment.
Figure 11F:
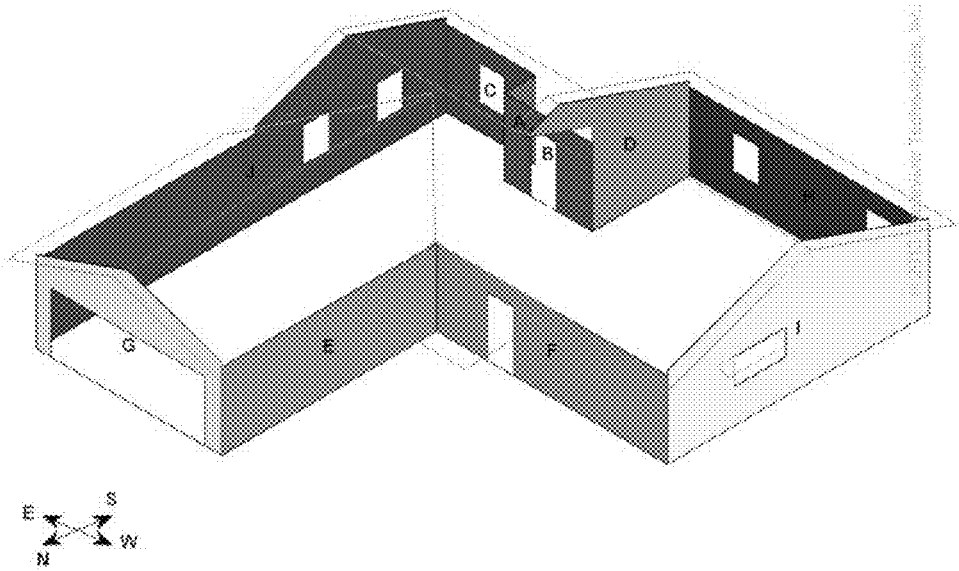
FIG. 11F is a sixth page of a second non-limiting example of a wall estimate report, according to one non-limiting illustrated embodiment.
Figure 11G:
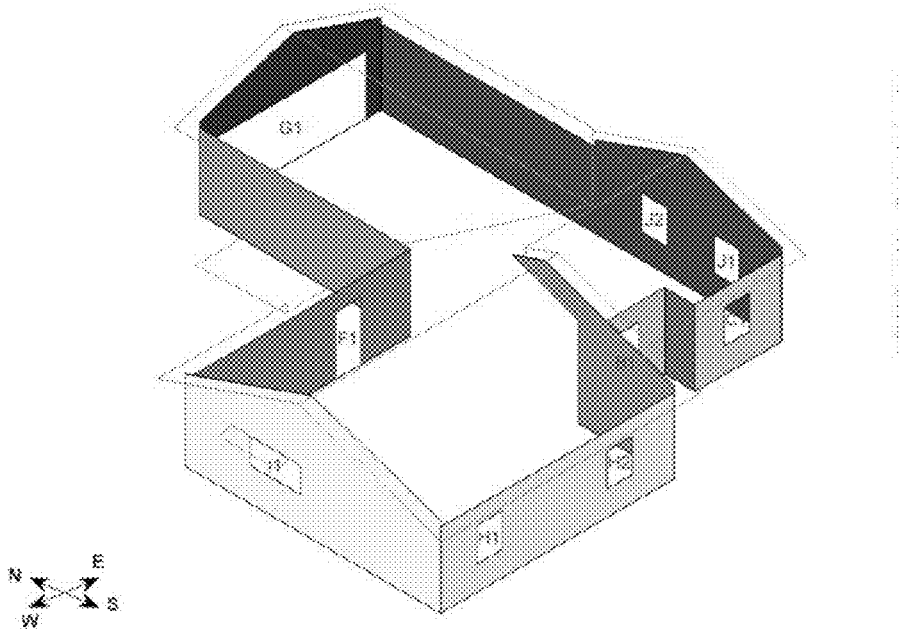
FIG. 11G is a seventh page of a second non-limiting example of a wall estimate report, according to one non-limiting illustrated embodiment.

FIGS. 11A-11M show a second non-limiting example of a wall estimate report, according to one non-limiting illustrated embodiment. In particular, FIG. 11A is a first page of a second non-limiting example of the wall estimate report. Shown in FIG. 11A is a top plan view of a 3D model of a roof of the building that is the subject of the second example wall estimate report in which facets appear as semi-transparent to reveal overhangs. A table of contents of the wall estimate report is listed in a Report Contents section in FIG. 11A including page designations for individual sections of the wall estimate report shown in corresponding FIGS. 11B-11M. These sections are named: Images, 3D Wall Area Diagram, Alternative 3D Wall View, Window and Door Diagrams, Report Summary and Additional Property Information.

Figure 12:
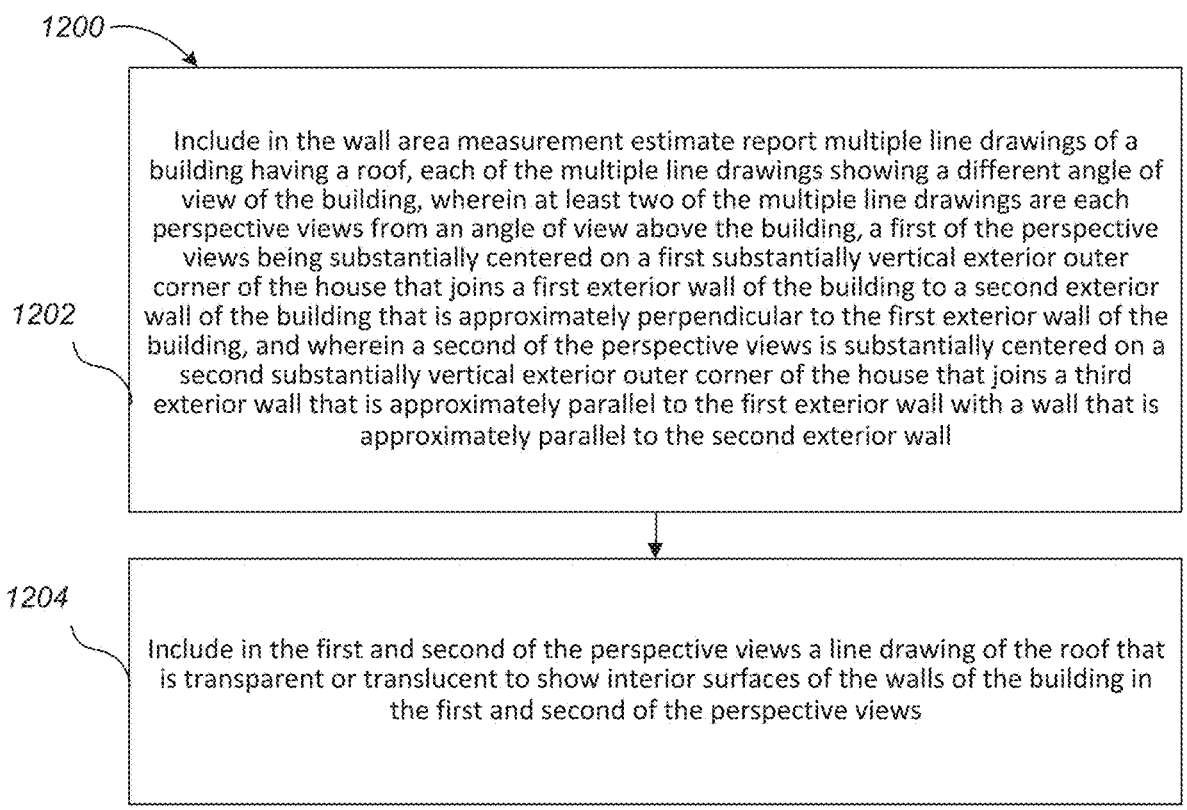
FIG. 12 is a flow diagram showing an example method of including multiple line drawings of a building in a wall area measurement report, according to one non-limiting illustrated embodiment.

FIG. 12 is a flow diagram showing an example method 1200 of including multiple line drawings of a building in a wall area measurement report, according to one non-limiting illustrated embodiment.

At 1202, the wall area report generation system includes in the wall area measurement estimate report, multiple line drawings of a building having a roof, each of the multiple line drawings from a different angle of view of the building. At least two of the multiple line drawings are perspective views from an angle of view above the building. A first of the perspective views is substantially centered on a first substantially vertical exterior outer corner of the house that joins a first exterior wall of the building to a second exterior wall of the building that is substantially perpendicular to the first exterior wall of the building.

A second of the perspective views is substantially centered on a second substantially vertical exterior outer corner of the house that joins a third exterior wall that is substantially parallel to the first exterior wall with a wall that is substantially parallel to the second exterior wall. For example, FIG. 10I shows a view of the corner at the intersection of wall C and wall A and FIG. 10J shows a view of the corner at the intersection of wall A and wall O. Wall C is substantially perpendicular to wall A and wall O is substantially parallel to wall C. Wall A is of course parallel to itself, i.e., extending in the same direction, equidistant at all points (with the distance equal to zero in this case), and never converging or diverging. Thus, this process results in the first and second outer exterior corners centered in the first and second of the perspective views being any two of the four outer exterior corners of the house shown in FIGS. 10I and 10J.

However, in some embodiments, the first and second of the perspective views are only centered on two exterior corners that are not on opposite sides of the house, but that are seen by the system "rotating" the view of the building just about 90 degrees from the first view. In particular, in some embodiments, this may be accomplished by the system rotating the three-dimensional model of the building to an elevational view of the first substantially vertical exterior outer corner and then rotating the three-dimensional model of the building about an axis substantially perpendicular to the planar surface of the building foundation approximately ninety degrees in the elevational view. Then, to obtain the perspective view, the system rotates the three-dimensional model of the building to approximately the same angle of view above the building it was at before, but now the second corner is centered in the perspective view. Also, the angle of view above the building may be dependent on a height of the building such that the angle of view above the building increases as the height of the building increases to keep the interior surfaces of the walls visible when the roof is transparent or semi-transparent in the line drawing.

For example, at 1204, the wall area report generation system includes in the first and second of the perspective views, a line drawing of the roof that is transparent or translucent to show interior surfaces of the walls of the building in the first and second of the perspective views.

FIG. 13 is a flow diagram showing an example method 1300 of including multiple line drawings of a building in a wall area measurement report wherein at least four of the multiple line drawings are elevation views of different sides of the building, according to one non-limiting illustrated embodiment.

At 1302, the wall area report generation system includes in the wall area measurement estimate report, multiple line drawings of a building having a roof, each of the multiple line drawings from a different corresponding angle of view of the building. At least four of the multiple line drawings are elevation views of different sides of the building from a corresponding first, second, third and fourth angle of view of the building, respectively. The first and third angles of view are of exterior walls of the building facing substantially opposite of each other. The second and fourth angles of view are of exterior walls of the building facing substantially opposite of each other.

At 1304, the wall area report generation system includes in one or more of the elevation views of the building, a shading of an edge of a wall to designate the edge of the wall is behind another wall in a corresponding view of the one or more of the elevation views of the building.

Figure 14:
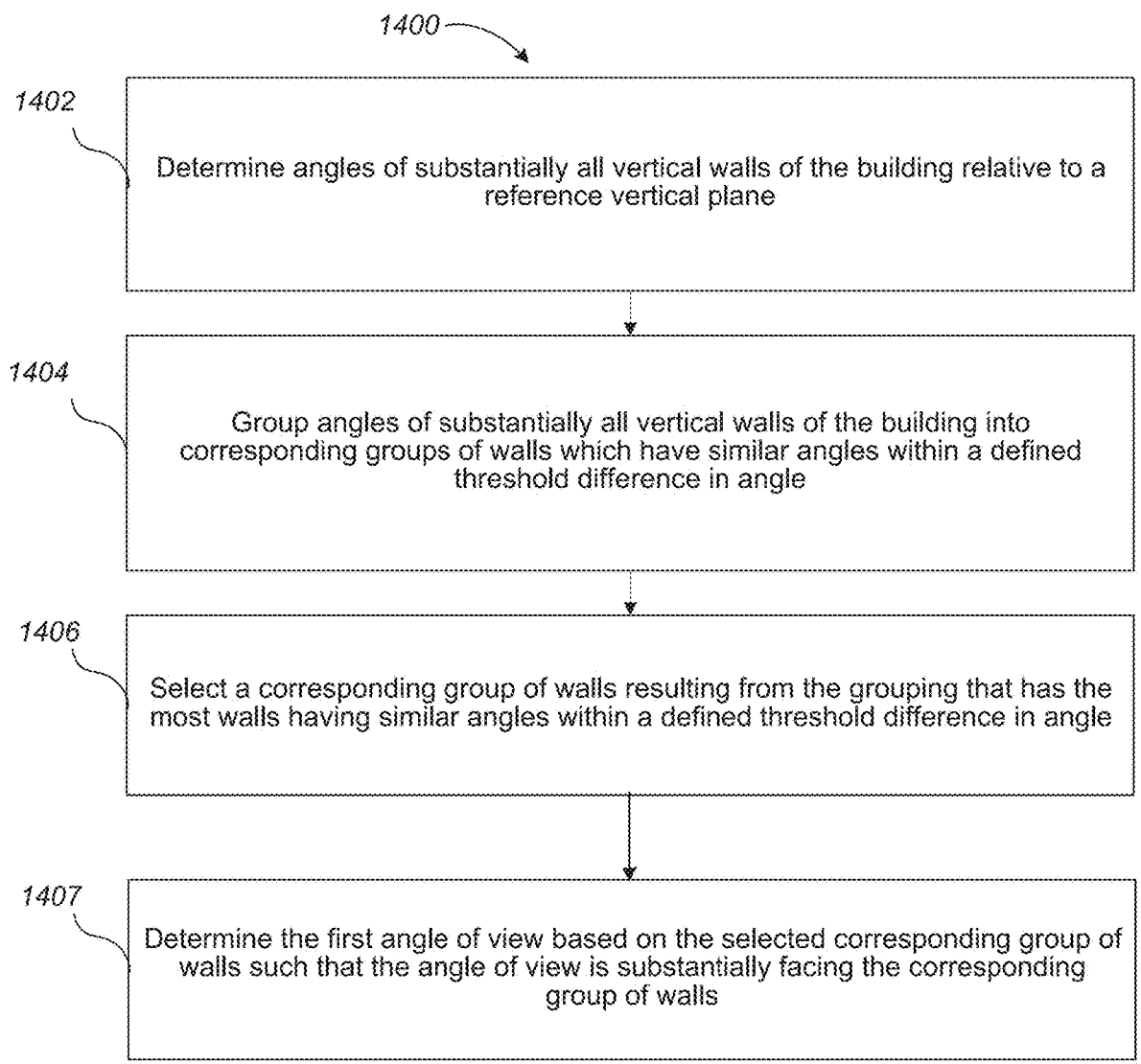
FIG. 14 is a flow diagram showing an example method of determining the corresponding first, second, third and fourth angle of view of corresponding elevation views in a wall area measurement report, according to one non-limiting illustrated embodiment.

FIG. 14 is a flow diagram showing an example method 1400 of determining the corresponding first, second, third and fourth angle of view of corresponding elevation views in a wall area measurement report, according to one non-limiting illustrated embodiment.

At 1402, the wall area report generation system determines angles of substantially all vertical walls of the building relative to a reference vertical plane.

At 1404, the wall area report generation system groups angles of substantially all vertical walls of the building into corresponding groups of walls which have similar angles within a defined threshold difference in orientation angles between each other relative to an orientation of a reference vertical plane This threshold difference may be based on a variety of factors, including the total number of exterior walls of the building, the size of the various exterior walls, etc.

At 1406, the wall area report generation system selects a corresponding group of walls resulting from the grouping that has the most walls having similar angles within a defined threshold difference in the orientation angle. Other factors which may affect this decision include, but are not limited to, the total number of exterior walls of the building, the size of the various exterior walls, etc.

At 1408, the wall area report generation system determines the first angle of view based on the selected corresponding group of walls such that the angle of view is substantially facing the corresponding group of walls. Examples of such elevational views provided in a roof estimation report are provided in FIGS. 10L-10O, 11H-11K, 17 and 18.

Figure 15:
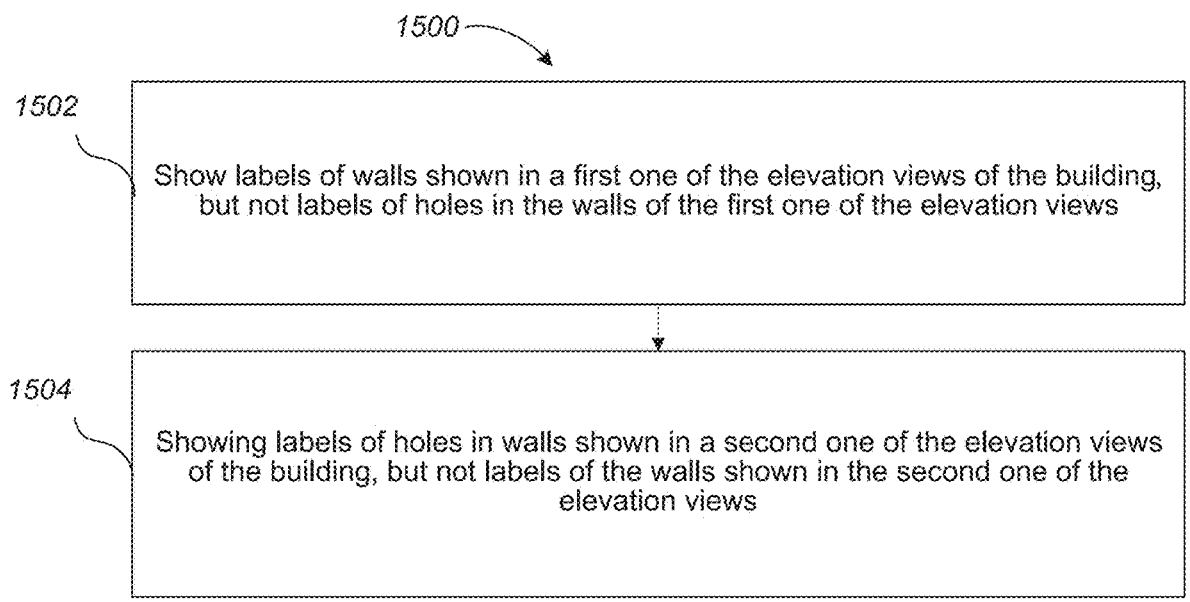
FIG. 15 is a flow diagram showing an example method of showing labels in a wall area measurement report, according to one non-limiting illustrated embodiment.

FIG. 15 is a flow diagram 1500 showing an example method of showing labels in a wall area measurement report, according to one non-limiting illustrated embodiment.

At 1502, the wall area report generation system shows labels of walls in a first one of the perspective views of the building, but not the labels of the holes in the walls that are shown in a second one of the perspective views of the building. For example, see FIG. 10J. Walls labels such as A and O are shown, but not the labels for the windows, doors, or other holes in the wall.

At 1504, the wall area report generation system shows labels of the holes in walls in a second one of the perspective views of the building, but not the labels of the walls shown in the first one of the elevation views. For example, see FIG. 10JK. Walls hole labels such as C1 and C2 are shown, but not the labels for walls such as A and C. In some embodiments, the same labeling procedure may be applied to the elevational views of the building.

Figure 16:
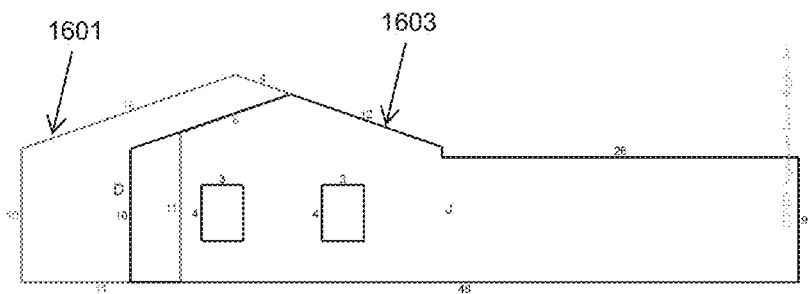
FIG. 16 is a page from an example wall estimation report showing an elevation view of one side of the building with a line drawing of a wall indicated as being partially blocked in the view by another wall.

FIG. 16 is a page from an example wall estimation report showing an elevation view of another side of the building of FIG. 16, with a line drawing of a wall indicated as being partially blocked by an object in an image of the building or otherwise having an issue affecting the accuracy of the wall area estimation of the wall. The example wall estimation report page shown in FIG. 16 is a closer view of the same page of the example wall estimation report shown in FIG. 11J. In particular wall "D" 1601 is partially blocked by wall "J" 1603 in the particular view of the building shown in FIG. 16. This is indicated by the line drawing of wall "D" 1601 being shaded or colored differently than the other walls shown in the elevation view of FIG. 16. The designation may also or instead be made as a result of, or in response to, input and/or detection of the wall and/or obstruction by an operator of the wall estimation system. In the example shown, the outline of wall "D" 1601 is shown in light gray, while the outline of the other unobstructed wall shown in the particular view of FIG. 16, in this case, wall "J" 1603, is black. However, different designations and/or annotations may be used, including, but not limited to, different line or surface colors, different line or surface shadings, different line or surface patterns, different labels, etc. In this manner, one who views the wall estimation report will be alerted that the entire area of the wall corresponding to the wall area measurement of that wall is not able to be seen in the particular view.

Figure 17:
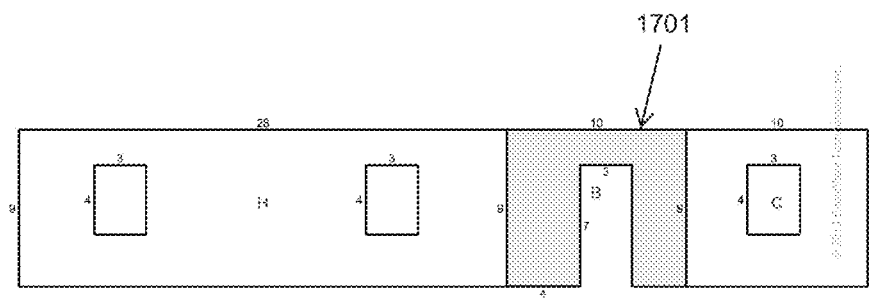
FIG. 17 is a page from an example wall estimation report showing an elevation view of another side of the building with a line drawing of a wall indicated as being at least partially blocked by an object in an image of the building or otherwise having an issue affecting the accuracy of the wall area estimation of the wall.

FIG. 17 is a page from an example wall estimation report showing an elevation view of another side of the building with a line drawing of a wall indicated as being partially blocked by an object in an image of the building or otherwise having an issue affecting the accuracy of the wall area estimation of the wall. The example wall estimation report page shown in FIG. 17 is a closer view of the same page of the example wall estimation report shown in FIG. 11J. In particular, wall "B" 1701 of the house is partially blocked by the overhang of the roof of the house as shown in the "South Side" photograph of the house shown in FIG. 11C and by a tree in the "West Side" photograph of the house in FIG. 11D. These obstructions may affect the accuracy of the area estimation of the wall based on those photographs. Therefore, wall "B" 1701 is designated as such by the wall estimation system, differentiating the wall from other walls in the wall estimation report.

The wall estimation system may perform detection of the wall and/or the obstruction by various image analysis techniques known to those of skill in the art. The designation may also or instead be made as a result of, or in response to, input and/or detection of the wall and/or obstruction by an operator of the wall estimation system. In the present example, the surface of wall "B" 1701 is colored yellow to differentiate the wall from other walls in the wall estimation report. However, different designations and/or annotations may be used, including, but not limited to, different line or surface colors, different line or surface shadings, different line or surface patterns, different labels, etc. In this manner, one who views the wall estimation report will be alerted that there may be an issue affecting the accuracy of the wall area estimation of the wall designated as such.

FIG. 18 is a page from an example wall estimation report showing an elevation view of yet another side of the building with a line drawing of a different wall indicated as being partially blocked by an object in an image of the building or otherwise having an issue affecting the accuracy of the wall area estimation of the wall. The example wall estimation report page shown in FIG. 18 is a closer view of the same page of the example wall estimation report shown in FIG. 11K. In particular, wall "E" 1801 of the house is partially blocked by a tree in the "North Side" photograph of the house as shown in FIG. 11C and in the "West Side" photograph of the house as shown in FIG. 11D. These obstructions may affect the accuracy of the area estimation of the wall based on those images. Therefore, wall "E" 1801 is designated as such by the wall estimation system, differentiating the wall from other walls in the wall estimation report.

The wall estimation system may perform detection of the wall and/or the obstruction by various image analysis techniques known to those of skill in the art. The designation may also or instead be made as a result of, or in response to, input and/or detection of the wall and/or obstruction by an operator of the wall estimation system. In the present example, the surface of wall "E" 1801 is colored yellow to differentiate the wall from other walls in the wall estimation report. However, different designations and/or annotations may be used, including, but not limited to, different line or surface colors, different line or surface shadings, different line or surface patterns, different labels, etc. In this manner, one who views the wall estimation report will be alerted that there may be an issue affecting the accuracy of the wall area estimation of the wall designated as such.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
generating, with a computer processor coupled to a non-transitory computer memory, a 3D model of walls of a structure based on a 3D model of a roof of the structure;
storing the 3D model of the walls of the structure in the non-transitory computer memory;
generating, with the computer processor using the 3D model of the walls of the structure, a wall area measurement estimate report displaying multiple line drawings of a building having a roof, each of the multiple line drawings showing a different angle of view of the building, wherein at least two of the multiple line drawings are perspective views from an angle of view above the building, a first of the perspective views being substantially centered on a first substantially vertical exterior outer corner of the building that joins a first exterior wall of the building to a second exterior wall of the building that is approximately perpendicular to the first exterior wall of the building, and a second of the perspective views being substantially centered on a second substantially vertical exterior outer corner of the building that joins a third exterior wall that is approximately parallel to the first exterior wall with a wall that is approximately parallel to the second exterior wall;
wherein the first and second of the perspective views include a line drawing of the roof that is transparent or translucent to show interior surfaces of the walls of the building in the first and second of the perspective views; and
providing the wall area measurement estimate report for repair and/or construction of a structure of the building.

2. The method of claim 1 wherein the second of the perspective views is obtained by:
rotating a three-dimensional model of the building to an elevation view of the first substantially vertical exterior outer corner;
rotating the three-dimensional model of the building approximately ninety degrees in the elevational view; and
rotating the three-dimensional model of the building to approximately the same angle of view above the building.

3. The method of claim 2 wherein the angle of view above the building is dependent on a height of the building, the angle of view above the building increasing as the height of the building increases.

4. The method of claim 3 wherein the angle of view above the building is dependent on a height to depth ratio of the building, the angle of view above the building increasing as the height of the building increases.

5. The method of claim 4, further comprising:
generating shading on interior surfaces of walls that are shown in the perspective views that is darker than shading provided on exterior surfaces of walls shown in the perspective views.

6. The method of claim 5, further comprising:
generating shading of the surfaces of the walls such that no two connected walls are of a same shade.

7. The method of claim 6, further comprising:
generating shading of outlines of the walls such that no two connected outlines of walls are of a same shade.

8. The method of claim 7, further comprising:
generating a number of different shades of for the walls in each perspective view proportional to a total number of walls shown in the perspective view.

9. The method of claim 8 further comprising:
labeling each corresponding wall in at least one of the line drawings with a designated corresponding character or combination of characters; and
labeling each hole in the corresponding wall with the corresponding character or combination of characters with which the corresponding wall is labeled followed by one or more additional character or combination of characters to designate the hole is a hole of the corresponding wall.

10. A method, comprising:
generating, with a computer processor coupled to a non-transitory computer memory, a 3D model of walls of a structure based on a 3D model of a roof of the structure;
storing the 3D model of the walls of the structure in the non-transitory computer memory;
generating, with the computer processor using the 3D model of the walls of the structure, a wall area measurement estimate report displaying multiple line drawings of a building having a roof, each of the multiple line drawings from a different corresponding angle of view of the building, wherein at least four of the multiple line drawings are elevation views of different sides of the building from a corresponding first, second, third and fourth angle of view of the building, respectively, and wherein the first and third angles of view are of exterior walls of the building facing substantially opposite each other and wherein the second and fourth angles of view are of exterior walls of the building facing substantially opposite each other;
generating, in one or more of the elevation views of the building, a shading of an edge of a wall to designate that the edge of the wall is behind another wall in a corresponding view of the one or more of the elevation views of the building; and
providing the wall area measurement estimate report for repair and/or construction of a structure of the building.

11. A method, comprising:
generating, with a computer processor coupled to a non-transitory computer memory, a 3D model of walls of a structure based on a 3D model of a roof of the structure;
storing the 3D model of the walls of the structure in the non-transitory computer memory;
generating, with the computer processor using the 3D model of the walls of the structure, a wall area measurement estimate report displaying multiple line drawings of a building having a roof, each of the multiple line drawings from a different corresponding angle of view of the building, wherein at least four of the multiple line drawings are elevation views of different sides of the building from a corresponding first, second, third and fourth angle of view of the building, respectively, and wherein the first and third angles of view are of exterior walls of the building facing substantially opposite each other and wherein the second and fourth angles of view are of exterior walls of the building facing substantially opposite each other;
generating, in one or more of the elevation views of the building, a shading of an edge of a wall to designate that the edge of the wall is behind another wall in a corresponding view of the one or more of the elevation views of the building, wherein the shading of the edge of a wall to designate the edge of the wall is behind another wall in a corresponding view of the one or more of the elevation views of the building is a lighter shade than that in the one or more of the elevation views of the building of wall edges which are not behind other walls in the corresponding view; and
providing the wall area measurement estimate report for repair and/or construction of a structure of the building.

12. The method of claim 11, further comprising:
generating, in each of the elevation views of the building, only walls which are designated as facing a viewer in the corresponding a first, second and fourth angle of view of the elevation views.

13. A method, comprising:
generating, with a computer processor coupled to a non-transitory computer memory, a 3D model of walls of a structure based on a 3D model of a roof of the structure;
storing the 3D model of the walls of the structure in the non-transitory computer memory;
generating, with the computer processor using the 3D model of the walls of the structure, a wall area measurement estimate report displaying multiple line drawings of a building having a roof, each of the multiple line drawings from a different corresponding angle of view of the building, wherein at least four of the multiple line drawings are elevation views of different sides of the building from a corresponding first, second, third and fourth angle of view of the building, respectively, and wherein the first and third angles of view are of exterior walls of the building facing substantially opposite each other and wherein the second and fourth angles of view are of exterior walls of the building facing substantially opposite each other;
generating, in one or more of the elevation views of the building, a shading of an edge of a wall to designate that the edge of the wall is behind another wall in a corresponding view of the one or more of the elevation views of the building, wherein the shading of the edge of a wall to designate the edge of the wall is behind another wall in a corresponding view of the one or more of the elevation views of the building is a lighter shade than that in the one or more of the elevation views of the building of wall edges which are not behind other walls in the corresponding view;
showing in each of the elevation views of the building, only walls which are designated as facing a viewer in the corresponding a first, second and fourth angle of view of the elevation views, wherein the showing in each of the elevation views of the building, only walls which are designated as facing the viewer in the corresponding first, second and fourth angle of view of the elevation views includes:
designating, for each of first, second and fourth angle of view, which walls are facing the viewer for the angle of view based on a difference in the angle of the walls with respect to the angle of view; and
providing the wall area measurement estimate report for repair and/or construction of a structure of the building.

14. The method of claim 12 wherein the designating includes designating a wall as facing the viewer for the angle of view if a difference in the angle of the wall with respect to the angle of view is below a defined threshold difference.

15. The method of claim 10 further comprising:
showing labels of walls shown in a first one of the elevation views of the building, but not labels of holes in the walls of the first one of the elevation views; and
showing labels of holes in walls shown in a second one of the elevation views of the building, but not labels of the walls shown in the second one of the elevation views.

16. A method, comprising:
generating, with a computer processor coupled to a non-transitory computer memory, a 3D model of walls of a structure based on a 3D model of a roof of the structure;
storing the 3D model of the walls of the structure in the non-transitory computer memory;
generating, with the computer processor using the 3D model of the walls of the structure, a wall area measurement estimate report displaying multiple line drawings of a building having a roof, each of the multiple line drawings from a different corresponding angle of view of the building, wherein at least four of the multiple line drawings are elevation views of different sides of the building from a corresponding first, second, third and fourth angle of view of the building, respectively, and wherein the first and third angles of view are of exterior walls of the building facing substantially opposite each other and wherein the second and fourth angles of view are of exterior walls of the building facing substantially opposite each other;
generating, in one or more of the elevation views of the building, a shading of an edge of a wall to designate that the edge of the wall is behind another wall in a corresponding view of the one or more of the elevation views of the building; and
determining the corresponding first, second, third and fourth angle of view of the building for the corresponding elevation view by:
determining angles of substantially all vertical walls of the building relative to a reference vertical plane;
grouping angles of substantially all vertical walls of the building into corresponding groups of walls which have similar orientation angles relative to an orientation of a reference vertical plane within a defined threshold difference between each other in the orientation angles;
selecting a corresponding group of walls resulting from the grouping that has the most walls having similar orientation angles within a defined threshold difference between each other in the orientation angles; and
determining the first angle of view based on the selected corresponding group of walls such that the first angle of view is substantially facing the corresponding group of walls; and providing the wall area measurement estimate report for repair and/or construction of a structure of the building.

17. The method of claim 16 further comprising:
determining the second angle of view to be approximately a difference of 90 degrees from the first angle of view;
determining the third angle of view to be approximately 90 degrees opposite of the first angle of view; and
determining the fourth angle of view to be approximately 90 degrees opposite of the second angle of view.

18. The method of claim 17 further comprising:
detecting if two walls are overlapping in any one of the corresponding first, second, third and fourth angles of view of the building for the corresponding elevation views; and
if two walls are overlapping in any one of the corresponding first, second, third and fourth angles of view of the building, showing in the corresponding first, second, third or fourth angles of view only a wall of the overlapping walls that is in front of another wall of the overlapping walls.

19. The method of claim 17 further comprising:
for any rectangular walls and any rectangular holes in walls on the corresponding first, second, third and fourth angles of view of the building, labeling on the corresponding first, second, third and fourth angles of view of the building, only one height and one width of the rectangular walls and one height and one width of the rectangular holes in the walls.

20. The method of claim 1, wherein generating, with the computer processor coupled to the non-transitory computer memory, the 3D model of walls of the structure based on the 3D model of the roof of the structure further comprises extending at least one wall a distance between an edge of the roof of the 3D model of the roof and a ground surface.

21. The method of claim 1, wherein generating, with the computer processor coupled to the non-transitory computer memory, the 3D model of walls of the structure based on the 3D model of the roof of the structure further comprises extending at least one wall a distance from an edge of the roof of the 3D model of the roof, the distance corresponding to a default value of a typical wall height of a single story building.

22. The method of claim 1, wherein generating, with the computer processor coupled to the non-transitory computer memory, the 3D model of walls of the structure based on the 3D model of the roof of the structure further comprises extending at least one wall a distance between an edge of the roof of the 3D model of the roof and another surface of the roof of the 3D model of the roof.

\* \* \* \* \*

UNITED STATES PATENT AND TRADEMARK OFFICE
CERTIFICATE OF CORRECTION

Page 1 of 1

PATENT NO. : 10,663,294 B2
APPLICATION NO. : 13/844684
DATED : May 26, 2020
INVENTOR(S) : Chris Pershing et al.

It is certified that error appears in the above-identified patent and that said Letters Patent is hereby corrected as shown below:

On the Title Page

Under References Cited, Other Publications item (56), page 4:
Column 1, second Reference from the bottom:
Delete "Gaillard et al.," and replace with -- Baillard et al., --

Signed and Sealed this
Seventh Day of July, 2020

Andrei Iancu
*Director of the United States Patent and Trademark Office*